(12) United States Patent
Nii et al.

(10) Patent No.: US 6,633,069 B2
(45) Date of Patent: *Oct. 14, 2003

(54) SEMICONDUCTOR DEVICE

(75) Inventors: Hideaki Nii, Kawasaki (JP); Chihiro Yoshino, Yokohama (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/081,613

(22) Filed: May 20, 1998

(65) Prior Publication Data

US 2002/0149062 A1 Oct. 17, 2002

(30) Foreign Application Priority Data

| May 20, 1997 | (JP) | ............................................. 9-129726 |
| Dec. 10, 1997 | (JP) | ............................................. 9-340355 |
| Apr. 21, 1998 | (JP) | ............................................. 10-110528 |

(51) Int. Cl.⁷ ............................................. H01L 29/76
(52) U.S. Cl. ..................... 257/370; 257/197; 257/378; 257/565; 438/202; 438/234
(58) Field of Search ................................. 257/370, 378, 257/197, 565; 438/202, 234

(56) References Cited

U.S. PATENT DOCUMENTS

| 4,980,744 A | * | 12/1990 | Watanabe et al. ............. 357/42 |
| 4,983,531 A | * | 1/1991 | Cosentino ..................... 437/31 |
| 5,523,606 A | * | 6/1996 | Yamazaki ..................... 257/370 |
| 5,665,615 A | * | 9/1997 | Anmo ........................... 438/202 |
| 5,763,920 A | * | 6/1998 | Komuro ........................ 257/370 |

FOREIGN PATENT DOCUMENTS

| JP | 60-63962 A | * | 4/1985 | ................. 438/747 |
| JP | 3-142935 A | * | 6/1991 | ................. 438/365 |
| JP | 4-88666 | * | 3/1992 | ................. 257/370 |
| WO | WO 94/16461 | * | 7/1994 | ................. 257/370 |

* cited by examiner

*Primary Examiner*—Eddie Lee
*Assistant Examiner*—Matthew E. Warren
(74) *Attorney, Agent, or Firm*—Foley & Lardner

(57) ABSTRACT

A bipolar transistor has metal silicide as a base lead-out electrode instead of conventional polysilicon, and the metal silicide film extends to an edge of an etching stopper layer, to reduce an emitter resistance and restrain an occurrence of an emitter plug effect. Such bipolar transistor can be utilized in a CMOS semiconductor device. In this case, (1) commonly using a process of providing an active base region, a base lead-out electrode and a collector lead-out electrode of the bipolar transistor and a process of providing gate electrodes a MOS field effect transistor, (2) commonly using a process of adding a p-type impurity into the active base region and the base lead-out electrode and a process of executing an ion-implantation for providing high-concentration impurity diffused layers of pMOS transistors, (3) commonly using a process of providing an etching stopper layer and a process of providing side wall insulating films of gate electrodes, and (4) commonly using a silicidation process of the base lead-out electrode and the collector lead-out electrode and a silicidation process of electrodes of MOS transistors. In other embodiment of the bipolar transistor, a single insulating film exist between the base layer and the emitter electrode in the peripheral of the emitter opening. By this construction, the etching stopper film is not necessary resulting in reducing the base resistance.

21 Claims, 51 Drawing Sheets

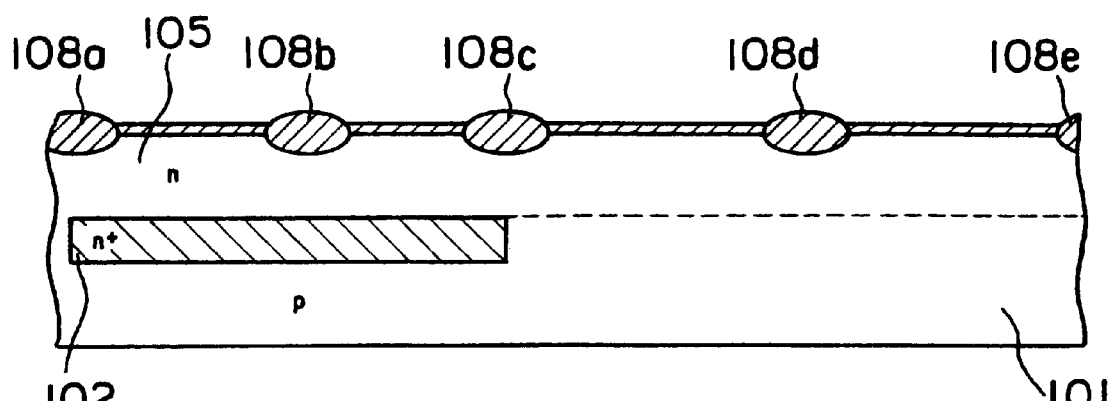
F I G. 30
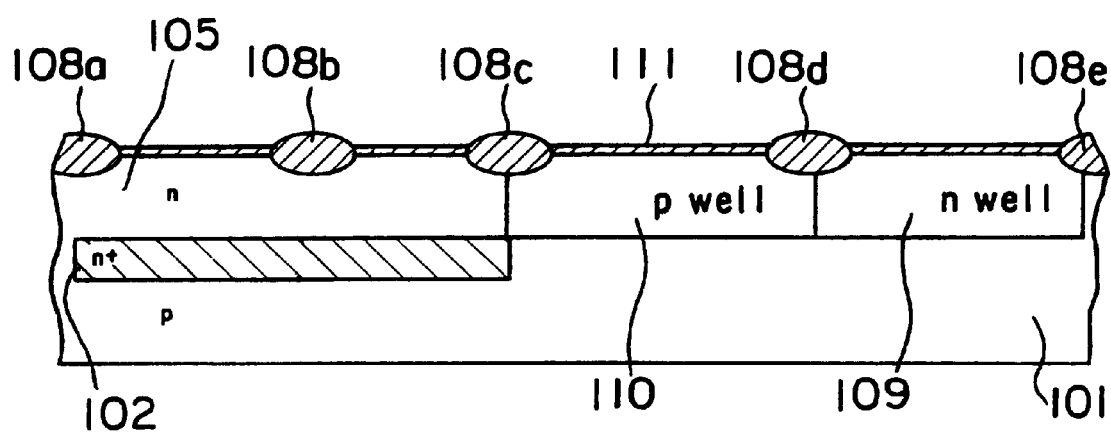
F I G. 31
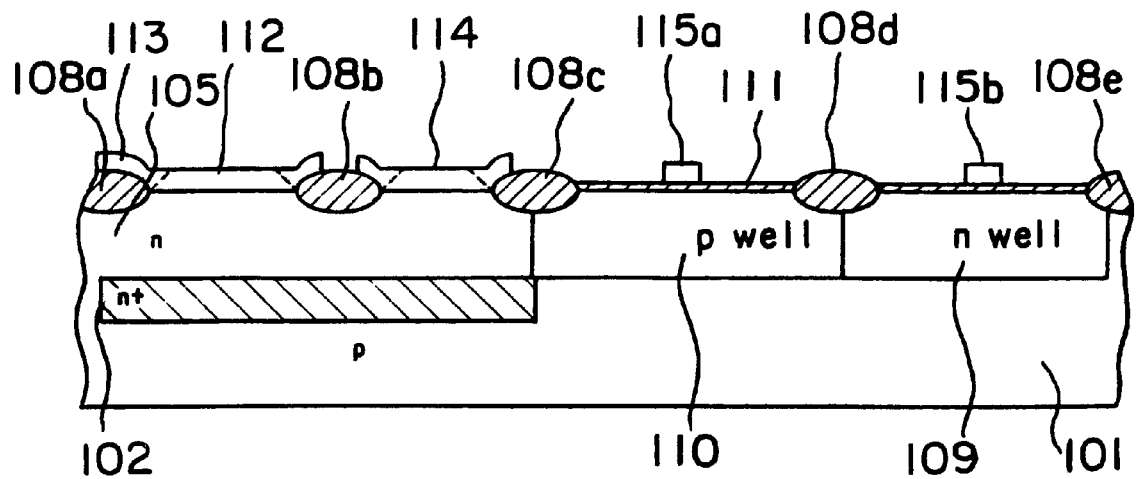
F I G. 32

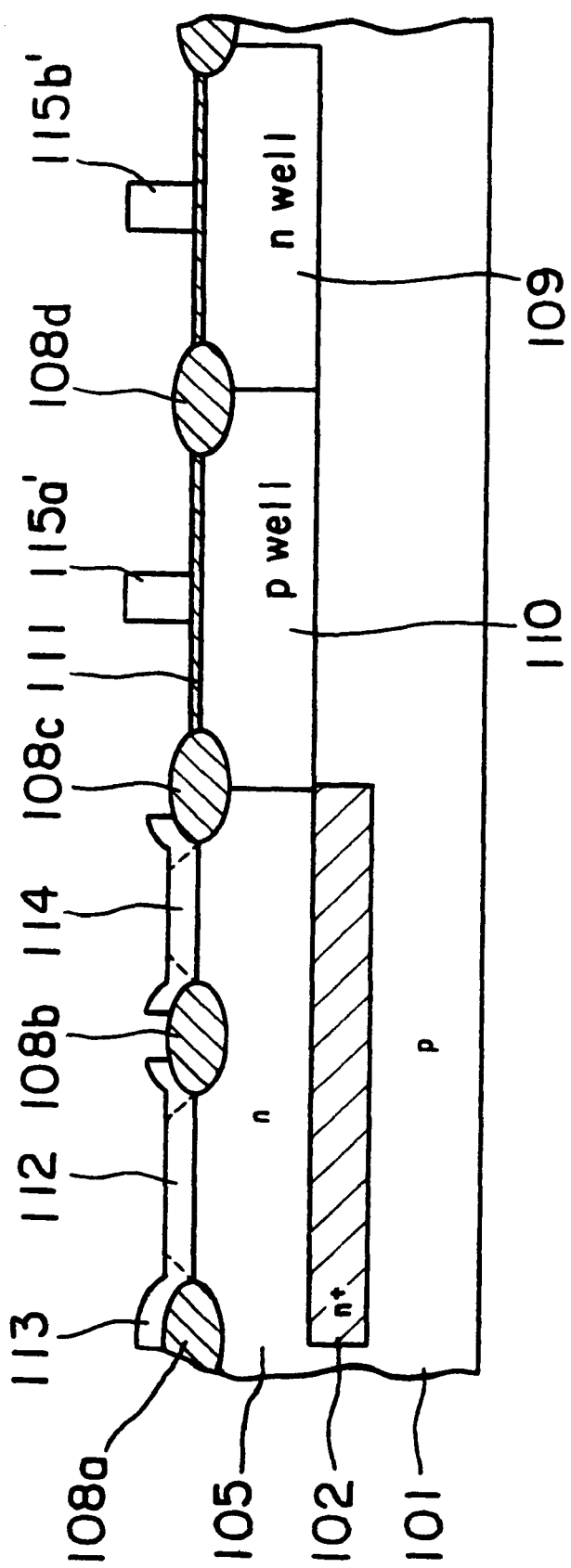
F I G. 42

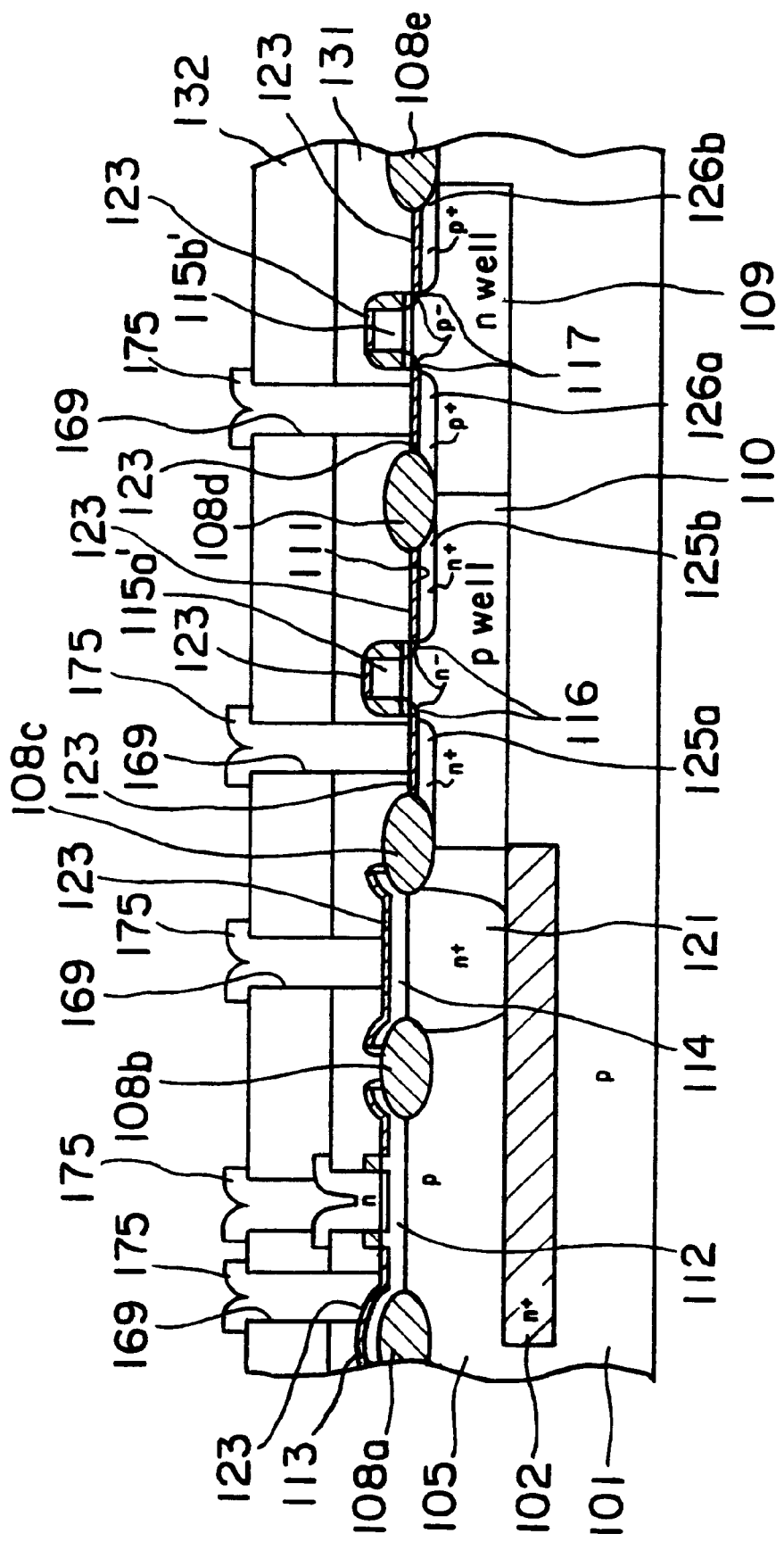
F I G. 43

SECTION X - X

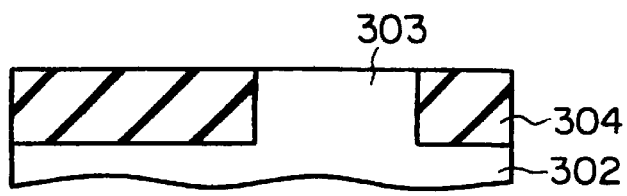
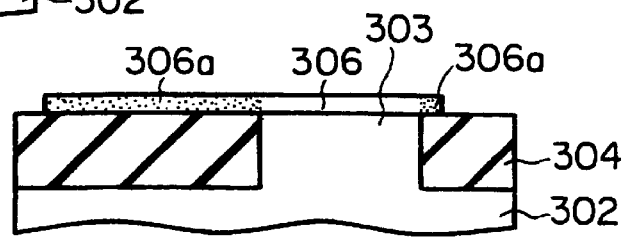
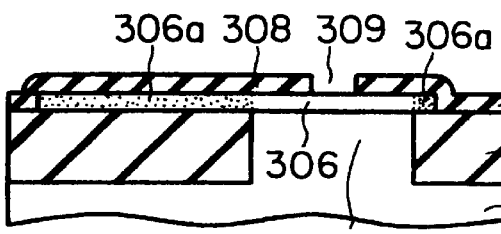
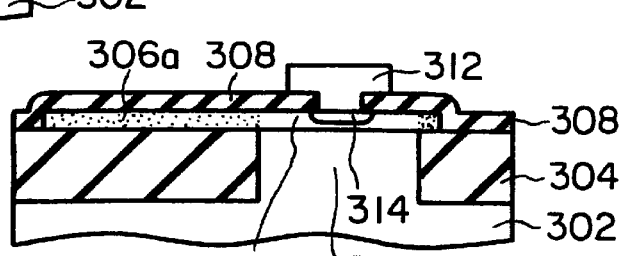
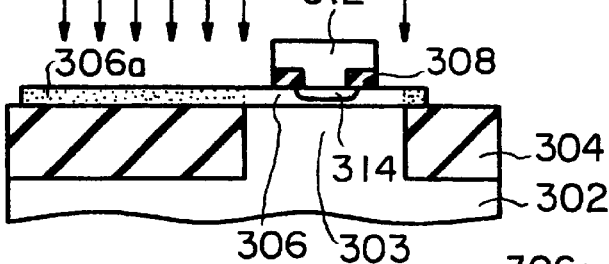
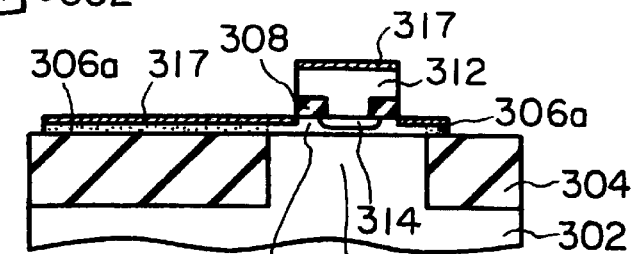
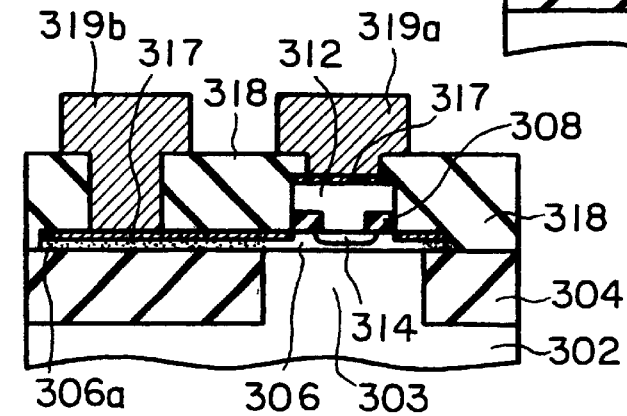

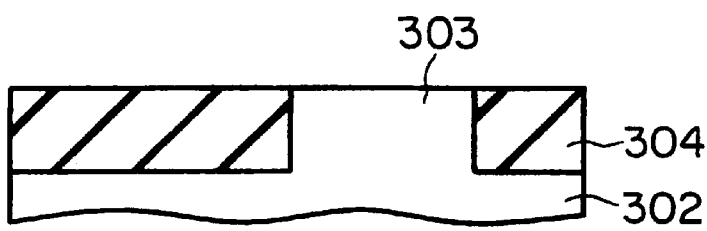
F I G. 52A
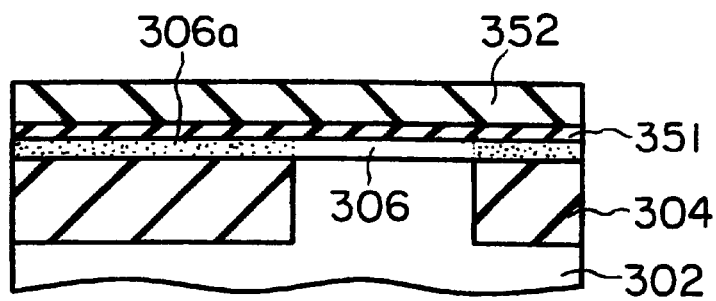
F I G. 52B
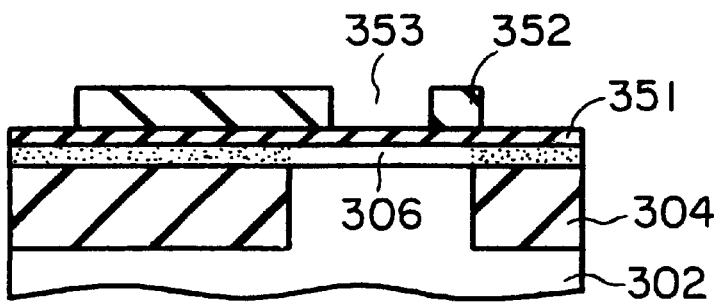
F I G. 52C
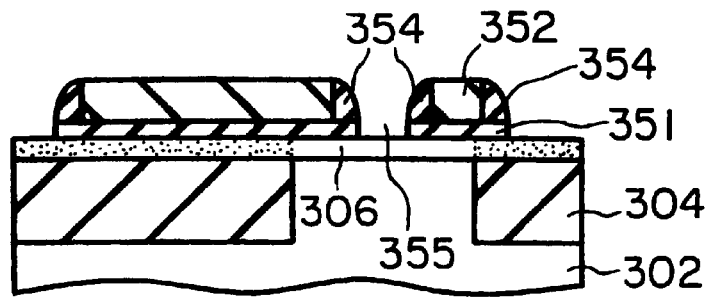
F I G. 52D

SEMICONDUCTOR DEVICE

BACKGROUND OF THE INVENTION

The present invention relates to a semiconductor device and, more particularly, to a semiconductor device including a bipolar transistor and a Bi-CMOS LSI in which the bipolar transistor and a CMOS transistor are mounted on the same chip.

In recent years, a high-performance silicon bipolar transistor technology has increasingly been developed in order to actualize a high-speed and low power consumption LSI, and there has been proposed a technology of constructing a transistor exhibiting high-speed/high frequency characteristics using, a non-selective epitaxial technique.

Furthermore, in recent years, there has been seen a progress of a development of a Bi-CMOS LSI (Bipolar-Complementary Metal Oxide Semiconductor Large Scale Integrated Circuit) which aims at mobile communications technology, etc. Especially, a portable communication terminal is required to be high performance, low power consumption and, in addition, low price, and hence it is a vital question to ensure a product competing strength by thoroughly reducing the costs.

A structure and a method of manufacturing a high-speed silicon bipolar transistor according to the prior art will be explained with reference to FIG. 1.

N-type layers 61 and 64 serving as collectors isolated by element isolation regions 62 and 63 on a p-type silicon substrate 60 containing a high-concentration n-type buried layer (not illustrated), and a silicon single crystal layer 65 which acts as a base region is formed on the collector region 61 and a collector lead-out region 64, and a polycrystalline silicon layer 66 which acts as a base lead-out region is formed on the silicon oxide layers 62 and 63. On the base region 65, an etching stopper film 67 having an opening 83 in the center thereof, and corresponding to the opening, an emitter region 85 is formed in the base region 65. In the peripheral of the etching stopper 67, a base lead-out polysilicon electrode 68 is formed on the base lead-out region 66, and a collector lead-out polysilicon electrode 69 is formed above the external collector lead-out region 64. On the etching stopper film 67, a side wall 82 is formed and the inner surface thereof defines the opening 83. On the polysilicon film 68, a silicon oxide film 70 and a silicon nitride film 80 are formed such that their ends reach the side wall 82, and a polycrystalline film 80 fills the opening 83 from the upper surface of nitride film 80. An insulating inter-layer film 86 is formed on the whole surface, contact holes 88, 89 and 87 are formed respectively corresponding, to the base lead-out region 68, external collector lead-out region 69 and a polysilicon film 84 as an external emitter lead-out region.

Next, a manufacturing method of the above-mentioned conventional high-speed bipolar transistor will be explained with reference to FIG. 1.

First of all, the n-type layers 61, 64 serving as the collector are epitaxially grown on the p-type silicon substrate 60 containing a high-concentration p-type buried layer (not illustrated). Then, through patterning, process of an elementisolation region, an oxide layer depositing process and an etch-back process, an elementisolation of the transistor is effected by the oxide layer 63, and the oxide layer 62 isolates and separates the collector region 61 from the external collector lead-out region 64.

Subsequently, a silicon crystalline layer is grown over the silicon single crystal 65 serving as a base region is grown on the collector region 61, and the polysilicon 60 serving as the base lead-out region is grown the oxide layer 62.

Next, a composite layer consisting of a nitride layer and an oxide layer is deposited over the whole surface, and predetermined patterning is executed on the base region 65, thereby providing the etching stopper layer 67.

Subsequently, there are deposited the polycrystalline silicon 68 and the polycrystalline silicon 69 which respectively serve as a base lead-out region and a collector lead regions. Then, a p-type impurity is ion-implanted into a base electrode, while an n-type impurity is ion-implanted into the collector lead-out region. Further, the oxide layer 70 and the nitride layer 80 are sequentially deposited by a CVD (Chemical Vapor Deposition) method. Thereafter a first opening 71 for forming an emitter region is opened by an RIE (Reactive Ion Etching) method, and simultaneously the base lead-out polysilicon electrode 68 is separated from the collector lead-out polysilicon electrode 69. Thereafter, the oxide layer is deposited by the CVD method, and the side wall spacer 82 is formed by the RIE method. Subsequently, the etching stopper layer 67 is wet-etched so as not to damage the base region 65, thereby forming a second opening 83.

Next, polycrystalline silicon 84 is deposited, an n-type impurity is ion-implanted, and the impurity is diffused in a solid phase within the base region 65 contiguous to the polycrystalline silicon layer 84 by effecting a thermal treatment, thereby providing an emitter region 85. Subsequently, the polycrystalline silicon 84 containing the n-type impurity is subjected to patterning in a predetermined configuration.

Next, an inter-layer insulating film 86 is deposited by the CVD method and, with this serving as an etching mask, after a photo resist has been subjected to the patterning in a predetermined shape by photolithography, the base contact hole 88, the emitter contact hole 87 and collector contact hole 89 are formed by the RIE method. Thereafter, metal wirings are formed by the conventional technique, thus completing the transistor.

In the transistor manufactured by the method described above, an extremely thin base layer can be formed, and hence it is feasible to obtain a higher cut-off frequency than in the transistor having the base layer formed by the conventional ion implanting and diffusion techniques.

There arise, however, the following problems inherent in the bipolar transistor manufactured by the method described above.

To be specific, an electric current flows from an opening 88 to the base lead-out electrode via the polycrystalline silicon 68, the polycrystalline silicon 66 and the single crystal silicon 65 to just under a emitter diffused layer 85 performing a bipolar operation, and therefore a base resistance value increases. Further, a depth of the opening with respect to an emitter opening width, i.e., an aspect ratio, is large, and consequently a base/collector capacity value with respect to an emitter resistance value and an emitter areal size increases. Then high frequency characteristics such as fmax and Ga etc. and noise characteristics such as Nf etc. decline, and besides an emitter plug effect occurs with the result that an emitter base junction can not be obtained well and a yield of the bipolar transistor decreases.

Moreover, the emitter diffused layer width is defined by the side wall spacer formed by the RIE after the emitter opening has been formed, and hence a controllability declines, resulting in such a problem that device characteristics become ununiform.

Further, Bi-CMOS LSI is structured such that a high-performance bipolar transistor and a MOS type field effect transistor are constructed on the same silicon substrate.

A prior art method of manufacturing a semiconductor integrated circuit device components of which are the bipolar transistor as an active element and the MOS type field effect transistor, will be explained with reference to the drawings by way of one example of the LSI discussed above.

To start with, as illustrated in FIG. 2, a thermal oxide layer 203 is provided by thermal oxidation on a silicon substrate 201, and subsequently the oxide layer 203 existing exactly on a region to be formed with an n⁻ buried layer, is removed by resist patterning based on the photolithography and by an HF series solution. Thereafter, an oxide layer 204 containing antimony (Sb) is deposited on a wafer surface, and the antimony is diffused into the silicon substrate 201 by executing a thermal treatment, thereby providing an n⁻ buried layer 202.

Next, as shown in FIG. 2, after removing all the oxide layers 203, 204 on the surface by the HF series solution, a single crystal silicon layer 205 containing phosphorus (P) on the order of $3.0 \times 10^{16}/cm^{-3}$ is grown up to a thickness of approximately 1.0 $\mu$m by an epitaxial growth method.

Next, as shown in FIG. 4, after the surface has been oxidated on the order of 500 Å, there are deposited a polysilicon (polycrystalline silicon) 206 having a thickness of approximately 1000 Å and a silicon nitride layer 207 having a thickness of about 1500 Å, and the resist is subjected to the patterning. Thereafter, the polysilicon and the nitride layer on region which is to be an elementisolation region are removed by the reactive ion etching (RIE).

Next, as shown in FIG. 5, thick oxide layers 208a–208e are formed by thermal oxidation on a region not covered with the nitride layer and used as element isolation oxide layers. Subsequently, the polysilicon 206 and the nitride layer 207 on the wafer surface are removed by CDE (Chemical Dry Etching).

Subsequently, as illustrated in FIG. 6, after the photo resist has been subjected to the patterning, the n-type and p-type impurities are implanted into the MOS transistor forming region, thereby providing an n-well 209 and a p-well 210, respectively.

Thereafter, the oxide layer on the surface of the device region is removed by the HP series solution, and a gate oxide film 211 is formed by the thermal oxidation. Then, polysilicon is deposited on the order of 3000 Å, and gate electrodes 241a, 241b are formed by the resist patterning based on the lithography and by the RIE. Provided further are impurity diffused layers 242a, 242b serving as an nMOS source and an nMOS drain, and impurity diffused layers 243a, 243b serving as a pMOS source and a pMOS drain by the resist patterning based on the lithography and the ion implantation subsequent thereto, thus finishing the CMOS manufacturing process.

Next, as shown in FIG. 7 an oxide layer 271 is deposited on the order of 3000 Å by an LPCVD (Low Pressure Chemical Vapor Deposition) method, and thereafter the single crystal silicon layer 205 on the region where the bipolar transistor should be manufactured is exposed by the resist patterning based on the lithography and by the etching using the HF series solution.

Next, as illustrated in FIG. 8, a silicon single crystal 245 containing boron (B) on the order of $1.0 \times 10^{18}$ cm-3 is grown on the region where the single crystal silicon layer 5 is exposed by use of the selective epitaxial technique.

Further, the oxide layer is deposited over the entire surface, and the predetermined resist patterning is effected upon the region that should become a base of the bipolar transistor, thus forming an etching stopper layer 248.

Subsequently, as shown in FIG. 9, polysilicon 250 which serve as a base lead-out region and a collector lead-out region is deposited, and, after resist pattern has been carried out, the p-type impurity is ion implanted into the base lead-out region, while the n-type impurity is ion implanted into the collector lead-out region. Furthermore, a nitride layer 261 is deposited by the CVD method. Thereafter, an opening, 255 for providing an emitter region is formed by the RIE.

Subsequently, as illustrated in FIG. 10, the nitride layer is deposited by the CVD method, and the etch-back is effected using the RIE technique, thus providing a side wall spacer 237. Thereafter, the etching, stopper layer 248 is etched by the wet-series etching without causing any damage to the base region, by forming an opening 265 extending to the base region. Furthermore, polysilicon 258 is deposited over the whole surface, and, after arsenic (As) has been ion-implanted, the arsenic is diffused within the base region 252 by executing the thermal treatment, thus providing, an emitter region 256. Thereafter, the photo resist is subjected to the patterning, and the polysilicon 258 containing the n-type impurity is subjected to the patterning by the etching as shown in FIG. 10.

Subsequently, as shown in FIG. 11, an insulating layer 261 on the region, where is to be silicidated, on the collector polysilicon 250 as well as on the base polysilicon, is selectively removed through the resist patterning based on the lithography and the RIE. Thereafter, a refractory metal such as Ti, Co, Ni etc. is deposited thereon, and the thermal treatment is performed, whereby metal silicide 263 is formed on the surfaces of the base polysilicon electrode 250a, the collector polysilicon electrode 250b and the emitter polysilicon electrode 258. The refractory metal which does not yet react is removed by the etching using a sulphuric acid/hydrogen peroxide solution.

Next, the oxide layer is deposited on the order of 8000 Å by an LPCVD method, thus providing an inter-layer insulating film 272 under a first layer Al wiring layer. Further, as shown in FIG. 12, the inter-layer insulating film 272 is subjected to the patterning by isotropic etching using the photo resist, thereby forming a contact hole 269 to each of electrodes of the MOS type field effect transistors and of the bipolar transistors. Subsequently, a native oxide layer formed on the bottom surface of each contact is removed by an Ar reverse sputtering method, and thereafter a barrier metal such as Ti/TiN etc is deposited by the sputtering method. Moreover, a wiring metal such as Al—Si—Cu etc is deposited by the sputtering method. Thereafter, the resist is subjected to the patterning in a predetermined shape, and the wiring metal is selectively removed by the RIE, thereby providing a wire 275. A desired integrated circuit is thus completed.

The circuit manufactured by the method described above can be used as high-performance Bi-CMOS LSI but presents problems which follow.

Specifically, after the CMOS has been completely formed on the silicon substrate, there is adopted a process of independently constructing the bipolar transistor. Hence, there increases a turn around time (TAT) till a trial product is manufactured since the specifications were determined, and, besides, the manufacturing process becomes complicated, resulting in a rise in the manufacturing costs.

Further, when trying to silicidate each of the electrodes of the source, drain and gate in order to enhance CMOS characteristics, it is required that the inter-layer insulating film on the CMOS transistor region be removed. On this occasion, there might be problems, wherein the element isolation oxide layer is reduced and recessed back, and further an etching removal of the insulating layers constituting the bipolar transistor is caused. This leads to a decline of the yield.

Another example of the prior art bipolar transistor is explained with reference to FIG. 13.

In this prior art bipolar transistor, a silicon substrate 381 is provided with device regions 382, 382a which are device isolated by a deep trench element isolation insulating layer 383a. These device regions 382, 382a are separated into a base formation predetermined region 382 and a collector formation predetermined region 382a by a shallow trench element isolation insulating layer 383.

A base epitaxial layer 384 is provided on the base formation predetermined region 382. A polysilicon layer 384a flush with this base epitaxial layer 384 is provided on the insulating layer 383 surrounding the base formation predetermined region 382. Further an epitaxial layer 384b is provided on the collector formation predetermined region 382a.

An emitter region 392 is provided in a surface region of the base epitaxial layer 384. Further, an insulating layer (known also as an etching stopper layer) having an opening above this emitter region 392, is provided on the base epitaxial layer 384. Then, a base lead-out electrode 386 composed of polysilicon is provided on the base epitaxial layer 384 as well as on the insulating layer 385. The base lead-out electrode 386 has an opening formed above the emitter region 392, and this opening is larger than the opening of the insulating layer 385.

A spacer layer 393 composed of an insulating substance is provided along the side portion of the opening formed in the base lead-out electrode 386.

Further, an emitter electrode 390 formed of the polysilicon, which is, electrically connected to the emitter region 392, is so provided as to fill the opening.

This emitter electrode 390 is electrically insulated from the base lead-out electrode 386 through the spacer layer 393.

On the other hand, a collector electrode 386a composed of the polysilicon is provided on the collector epitaxial layer 384b.

A refractory metal silicide layer 384 is provided on the surfaces of the base lead-out electrode 386, the collector electrode 386a and the emitter electrode 390, thus reducing a resistance. An inter-layer insulating layer 396 is provided on the base lead-out electrode 386, the collector electrode 386a and the emitter electrode 390. Then, this inter-layer insulating layer 396 is formed with openings as contact holes for coming in contact with the electrodes 386, 386a, 390. Metal electrodes 398a, 398b, 398c each composed of a metal are so provided as to fill these contact holes.

Next, a conventional method of manufacturing the bipolar transistor is described with reference to FIGS. 14A–14I.

To start with, as shown in FIG. 14A, a trench is formed in a silicon substrate 381 and is so embedded with the insulating layer 383 as to effect an elementisolation, and a device region 382 is provided. Next, a singe crystal silicon layer (also called a base epitaxial layer) serving as a base layer is provided on the device region 382 by conducting an epitaxial growth while implanting an impurity of a first conductivity type (of e.g., a p-type), and a polysilicon layer 384a is provided on the element isolation insulating layer 383 (see FIG. 14B). Subsequently, an oxide layer composed of, e.g., $SiO_2$ is deposited on the substrate surface and an etching stopper layer 385 is provided by executing a patterning process (See FIG. 12B).

Next, a polysilicon layer is deposited over the entire surface of the substrate, and subsequently, after a first conductivity type impurity has been implanted into this polysilicon layer, some portions of the polysilicon layer and the polysilicon layer 384a are removed by anisotropic etching (e.g., RIE) (Reactive Ion-Etching)), and the base lead-out electrode 386 formed of the polysilicon is provided (See FIG. 14C).

Next, the oxide layer 387 is deposited over the entire surface of the substrate, and the oxide layer 387 and the base lead-out electrode 386 that are disposed on the region where an emitter is to be provided, are removed by anisotropic etching. Thus, the bottom surface is formed with an opening 388 through which the etching stopper layer 385 is exposed (see FIG. 14D).

Next, a nitride layer is deposited over the entire surface of the substrate, and a side wall layer 389 composed of a nitride is provided along the side portion of the opening 388 by performing the anisotropic etching such as the RIE etc (see FIG. 14E). Subsequently, the etching stopper layer 385 exposed to the bottom surface of the opening 388 is removed by performing the anisotropic etching, thus making the epitaxial layer 384 exposed (see FIG. 14E).

Next, a polysilicon layer 390 is deposited so as to fill the thus formed emitter opening and the opening 388 as ell, and a second conductivity type impurity (of e.g., n-type) is implanted into the polysilicon layer. Thereafter, with a thermal treatment carried out, the second conductivity type impurity is diffused in the surface region of the epitaxial layer 384, thus providing an emitter region 392 (see FIG. 14E). Subsequently, the polysilicon layer 390 is subjected to patterning, thereby providing an emitter electrode 390 (see FIG. 14F).

Next, with the emitter electrode 390 serving as a mask, the anisotropic etching is conducted, and the oxide layer 387 is thus removed (see FIG. 14G). At this time, the oxide layer 387 under the emitter electrode 390 is not removed. This oxide layer 387 not removed and a side all layer 389 form a spacer layer 393 (see FIG. 14G).

A refractory metal (e.g., Ti) is deposited over the whole surface of the substrate by use of a sputtering method, and, with the thermal treatment effected, a silicide layer 394 is provided on the emitter electrode 390 as well as on the base lead-out electrode 386 (see FIG. 14E). With this processing, the base lead-out electrode 386 and the emitter electrode 390 are reduced in terms of their resistances.

Next, as shown in FIG. 14I, an inter-layer insulating layer 396 is deposited over the entire surface of the substrate, and this inter-layer insulating layer 396 is formed with openings serving as contact holes for coming into contact with the base lead-out electrode 386 and the emitter electrode 390, respectively. Then, a metal layer is deposited over the entire surface of the substrate so as to fill these contact holes, and metal electrodes 398a, 398c are provided by executing the patterning on this metal layer, thereby completing the bipolar transistor (see FIG. 14I).

In recent years, a speed-up and a reduction in consumption of the electric power of the bipolar transistor have been demanded and hence there has increasingly been an advancement of scaling in regions of an intrinsic base and an emitter. When reduced in size, however, a rate of an unnecessary parasitic region increased not in the essential part of the bipolar aspect but in the operation of the bipolar transistor. Therefore, a parasitic resistance such as a base resistance and an emitter resistance etc, and a parasitic capacity such as an inter base-collector capacity etc becomes larger than a resistance and capacity of the intrinsic region, which is an obstacle against the speed-up and the reduction in the consumption of the electric power.

In the prior art bipolar transistor described above, it is required that a width of the etching stopper layer 385 be wider extra by an allowance of a side wall 389 thickness plus the opening 388. Therefore, as shown in FIG. 15, the base resistance extremely increases as a portion 399 of the epitaxial layer 384 under the etching stopper layer 385 is widened, resulting in such a problem of causing the obstacle against the speed-up and the reduction in the consumption of the electric power.

Further, if the width dimension of the emitter region 392 is decreased by increasingly making the region hyperfine, an aspect ratio (a ratio of a depth to a width of the opening) of the opening 388 increases, and hence it happens that an impurity concentration of the portion of the emitter electrode 390 which is in contact with the base epitaxial layer 384, is smaller than in other portions. There consequently arises a problem in which a current gain changes depending on the emitter width.

SUMMARY OF THE INVENTION

It is a first object of the present invention to provide a semiconductor device capable of restraining a scatter of device characteristics by enhancing high frequency characteristics and noise characteristics of a device and a controllability of an emitter diffused layer width, and of restraining an occurrence of en emitter plug effect It is a second object of the present invention to provide a high-performance Bi-CMOS LSI at a low cost.

It is a third object of the present invention to provide a semiconductor device which prevent current gain variation in response to the emitter width when scaling is effected.

According to a first aspect of the present invention, there is provided a semiconductor device comprising:
- a collector region provided on a surface area of a semiconductor substrate and defined by an elementisolation film,
- a base layer provided on said collector region;
- an insulating layer having an opening and selectively providing on a first region on a surface of said base layer; and
- an emitter layer provided on a surface area of said base layer, corresponding to said opening.

According, to a second aspect of the present invention, there is provided a semiconductor device comprising:
- a fist semiconductor region of a second conductivity type provided on a first conductivity type semiconductor substrate, and serving as a collector region, the periphery thereof being defined by a first insulating layer;
- a second semiconductor region of a first conductivity type comprising a base region provided on said first semiconductor region and a base lead-out region provided on said first insulating layer;
- a second insulating layer having an opening corresponding to an emitter formation predetermined region in said second semiconductor region, and serving as an etching stopper layer provided on said second semiconductor region so that at least a part of peripheral edge of said second semiconductor region is exposed;
- an en emitter region of the second conductivity type provided corresponding to said opening on the surface area of said second semiconductor region; and
- a metal silicide layer so provided as to be self-aligned with said second insulating layer on the peripheral edge of said second semiconductor region.

In these semiconductor devices, since base polysilicon electrodes are not used as the base lead-out electrode but the metal silicide film is used, the emitter opening can be made shallow resulting, in lowering emitter aspect ratio and further reducing emitter resistance. Moreover, since there exists no side wall spacer if the emitter opening, the emitter aspect ratio is further lowered resulting in further reducing the emitter resistance. Furthermore, base/collector capacitance value per emitter area can be reduced for the degree of no existence of side wall spacer. As a result, high frequency and noise characteristics of bipolar transistors are remarkably enhanced.

According to a third aspect of the present invention, there is provided the semiconductor device comprising:
- a bipolar transistor disposed on a first conductivity type epitaxial layer provided on a first region on a semiconductor substrate; and
- a CMOS type field effect transistor including a first MIS transistor disposed on a surface area of a second conductivity type first well region provided on a second region on said semiconductor substrate, and a second MIS transistor disposed on a surface area of a first conductivity type second well region provided on a third region on said semiconductor substrate,
- wherein said bipolar transistor includes a first conductivity type collector region provided on a surface area of said epitaxial layer, a second conductivity type base region provided on a part of said collector region and a first conductivity type emitter region provided on a part of a surface area of said base region, and
- wherein said second MIS transistor includes a source and a drain which are composed of substantially the same impurity and with substantially the same diffusion concentration as those of a part of said base region of said bipolar transistor.

In this semiconductor device, since the same material is commonly used for both of the bipolar transistor portion and the MOS transistor portion, manufacturing process can be simplified. Furthermore, in the bipolar transistor portion, since metal silicide film is formed on the base lead-out electrode, the emitter opening can be made shallow resulting in lowering the emitter aspect ratio and further reducing the emitter resistance and base resistance. As a result, high frequency and low noise characteristics of bipolar transistors are remarkably enhanced.

According to a fourth aspect of the present invention, there is provided a semiconductor device comprising:
- a collector region provided on a surface area of a semiconductor substrate and defined by an elementisolation film;
- a base layer provided on said collector region;
- an insulating layer having an opening on a surface area of said base layer, and provided on said base layer; and
- an emitter electrode so provided on said insulating layer as to fill said opening,
- wherein said insulating layer is interposed as a single layer between said base layer and said emitter electrode at the periphery of said opening.

In this semiconductor device, since the insulating film below the emitter electrode is made as a single layer, conventional etching stopper film and polysilicon base lead-out are not necessary, as a result high speed operation and low power consumption are achieved due to the reduced base resistance.

According to a fifth aspect of the present invention, there is provided a semiconductor device comprising:

a collector region provided on a surface area of a semiconductor substrate and defined by an elementisolation film;

a base layer provided through an epitaxial growth on the surface of said substrate surrounded by said element isolation film provided on said collector surface area;

an insulating layer having an opening above the surface area of said base layer and provided on said base layer; and an emitter electrode so provided on said insulating layer as to fill said opening, wherein said insulating layer is so subjected to patterning as to be self-aligned with said emitter electrode.

In this semiconductor device, since the insulating film of the base layer is patterned by self-aligning manner to the emitter electrode manufacturing process can be simplified.

BRIEF DESCRIPTION OF THE DRAWINGS

FIG. 30 is a partial sectional view showing a process step of the third process of the Bi-CMOS LSI according to the present invention;

FIG. 31 is a partial sectional view showing a process step of the third process of the Bi-CMOS LSI according to the present invention;

FIG. 32 is a partial sectional view showing a process step of the third process of the Bi-CMOS LSI according to the present invention;

FIG. 42 is a partial sectional view showing a process step of the fifth process of the Bi-CMOS LSI according to the present invention;

FIG. 43 is a partial sectional view showing a process step of the fifth process of the Bi-CMOS LSI according to the semiconductor device of the present invention;

FIGS. 49A–49G are sectional views showing the seventh process of the semiconductor device according to the present invention;

FIGS. 51A–51I are sectional views showing the ninth process of the semiconductor device according to the present invention;

FIGS. 52A–52H are sectional views showing the tenth process of the semiconductor device according to the present invention;

DESCRIPTION OF THE PREFERRED EMBODIMENTS

Some of embodiments of the present invention will hereinafter be discussed in detail with reference to the accompanying drawings.

Figure 16:
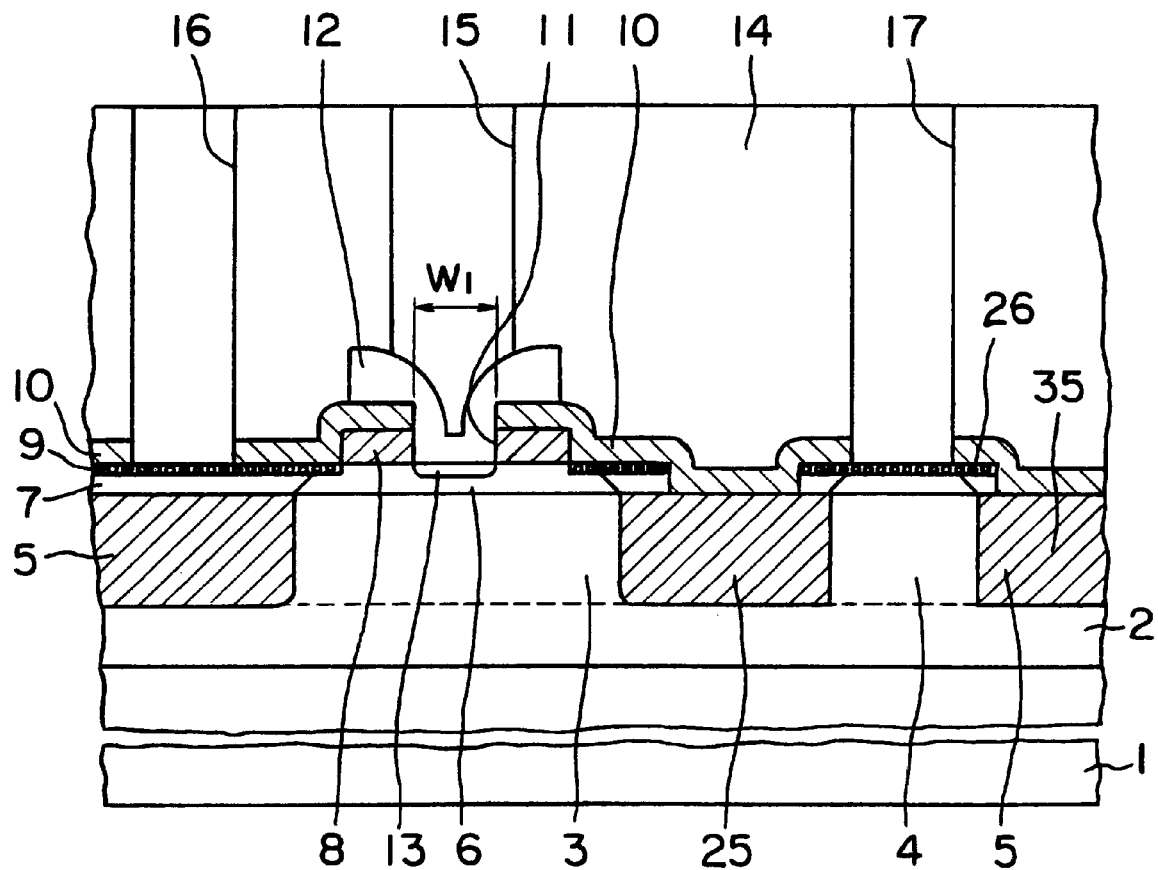
FIG. 16 is a sectional view of an npn-type bipolar transistor in a first embodiment of the semiconductor device according to the present invention.

FIG. 16 is a sectional view illustrating a device structure of an npn type bipolar transistor in a first embodiment of a semiconductor device according to the present invention.

An $n^+$ type buried layer 2 with a high concentration is provided on p type silicon substrate 1, and an n type collector region 3 and an external collector lead-out region 4 are provided thereon. Insulating layers 25, 5, 35 are provided between the collector region 3 and the external collector lead-out region 4 as well as along the peripheries thereof, whereby an elementisolation is made. An active base region 6 composed of p type single crystal silicon is provided on the collector region 3, and a base lead-out region 7 composed of polysilicon is provided on an oxide layer 5. Further, an etching stopper layer 8 is provided on a part of the active base region 6. A conductive layer 9 formed of metal silicide is provided on the base lead-out region 7 and on the active base region 6 but on an area not covered with the etching stopper layer 8 so that an edge of the conductive layer 9 extends into the active base region 6.

A nitride layer 10 is provided over the whole surfaces of the conductive layer 9, the etching stopper laser 8 and the embedded insulating, layer 5. An opening 11 is formed in an area stacked with the nitride layer 10, the etching stopper layer 8 and the active base region 6 so as to extend into the active base region 6. Furthermore, a polysilicon layer 12 doped with an n type impurity is deposited so as to fill the opening 11, and an emitter region 13 is provided within the active base region 6 contiguous to the polysilicon layer 12 with a solid phase diffusion from the polysilicon. A contact hole 15 to an emitter electrode is formed open in an upper portion of the polysilicon layer 12, and further a contact 16 to a base electrode and a contact hole 17 to a collector electrode are respectively formed on the base lead-out region 7 and on the external collector lead-out region 4 as well as on the metal silicide 9, thus providing an electrode of Al etc. An inter-layer insulating layer 14 serving as a protection layer is interposed between these electrodes.

As shown in FIG. 16, a characteristic point of the semiconductor device in the first embodiment of the present invention is compared with the prior art is that, first of all, the base lead-out electrode involves the use of not the base polysilicon electrode but the metal silicide 9. As a result, since the opening 11 can be shallowed, and an aspect ratio of the emitter declines, and an emitter resistance value can be reduced. Further, the metal silicide 9 enters the active base region 6 and extends up to the edge of the etching stopper layer 8, and hence a base resistance value can be remarkably decreased. As a consequence, a high frequency characteristic and a noise characteristic of the bipolar transistor are enhanced.

Next, a second characteristic point in the first embodiment is that a side wall spacer does not exist within the opening 11, and that a thickness of the etching stopper layer 8 becomes so much smaller for that. With this contrivance, the emitter openings 11 is more shallowed, and therefore the emitter aspect ratio further declines, thereby making it feasible to further reduce the emitter resistance value.

Moreover, because of no side wall spacer existing, a base/collector capacity value with respect to the emitter areal size can be decreased so much for that. As a result, the high frequency characteristic and the noise characteristic of the bipolar transistor are extremely enhanced.

Figure 22:
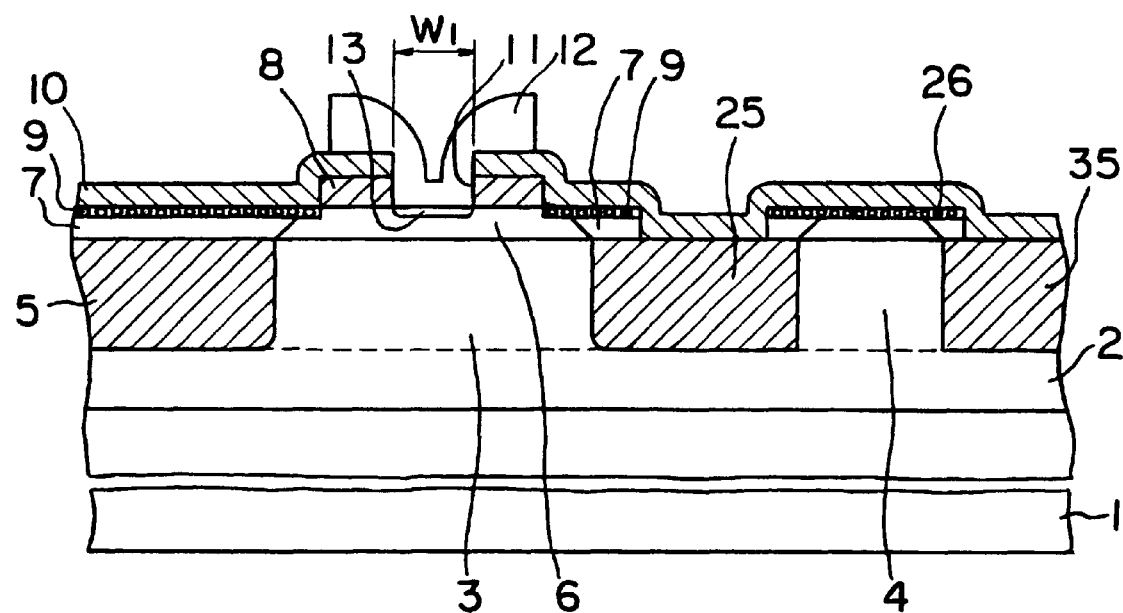
FIG. 22 is a partial sectional view showing a process step of manufacturing the npn-type bipolar transistor according to the first embodiment of the semiconductor device according to the present invention.

Next, a method of manufacturing the npn type bipolar transistor exhibiting the above effect is discussed by way of a first embodiment of the manufacturing method of the semiconductor device according to the present invention with reference to FIGS. 16 and 22.

Figure 17:
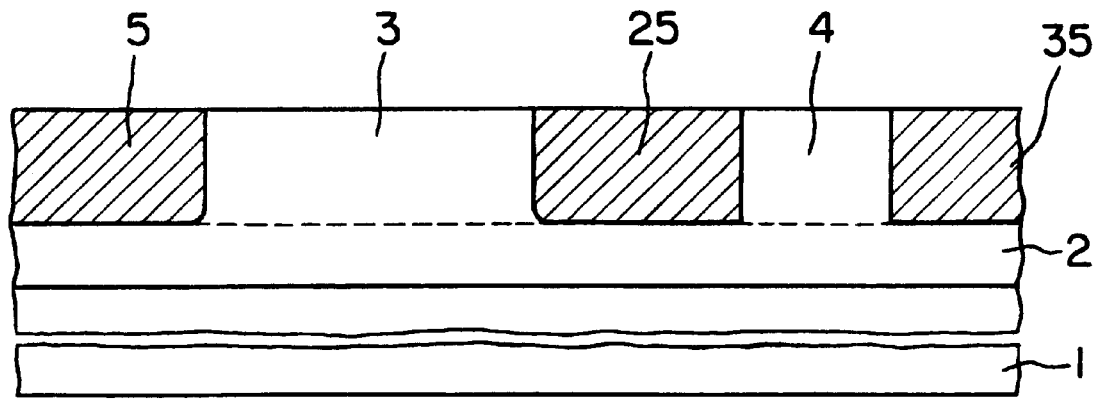
FIG. 17 is a partial sectional view showing a process step of manufacturing the npn-type bipolar transistor according to the first embodiment of the semiconductor device according to the present invention.

To start with, as illustrated in FIG. 17, a high-concentration n⁻ type buried layer 2 is formed on the p type silicon substrate 1 by use of the diffusion technique, and the n type collector region 3 and the external collector lead-out region 4 are formed thereon by an epitaxial growth method. Next, an area between the collector region 3 and the external collector lead-out region 4 and an area peripheral to the external collector lead-out region 4, are removed by etching, thus providing an elementisolation groove. Then, the embedded insulating layers 5, 25, 35 are so deposited as to fill this groove and flattened by etching, thus making the element isolation.

Figure 18:
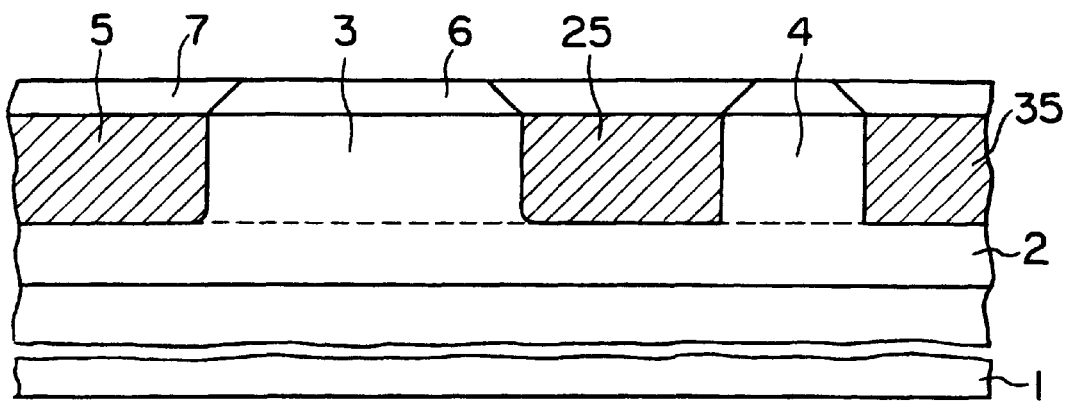
FIG. 18 is a partial sectional view showing a process step of manufacturing the npn-type bipolar transistor according to the first embodiment of the semiconductor device of the present invention.

Next, as shown in FIG. 18, a silicon crystal is grown by a non-selective epitaxial technique under a pressure of 10 torr–30 torr at a temperature of 650° C.–750° C. using diborane ($B_2H_6$) as a doping gas, and, while being doped in the p-type, the active base region 6 composed of the single crystal silicon and the base lead-out region 7 composed of the no polysilicon are provided on the collector region 3.

Figure 19:
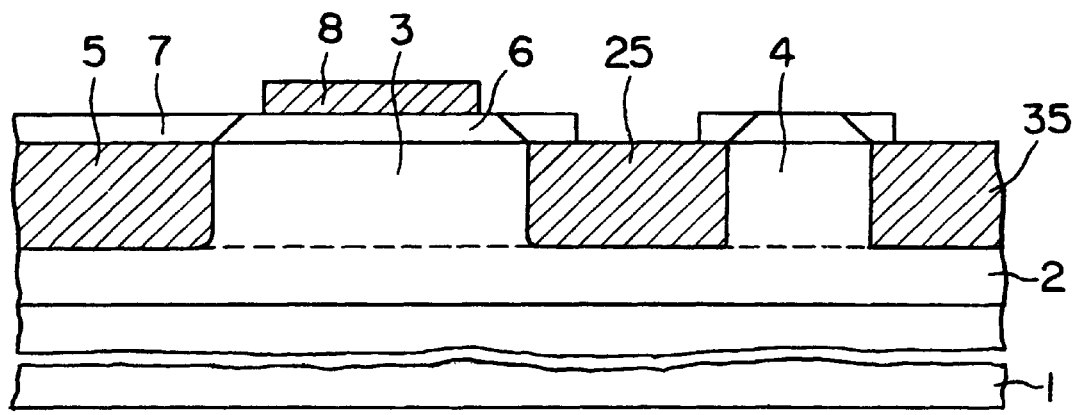
FIG. 19 is a partial sectional view showing a process step of manufacturing the npn-type bipolar transistor according to the first embodiment of the semiconductor device according to the present invention.

Next, as illustrated in FIG. 19, after polysilicon between the base region 6, the base lead-out region 7 and the external collector region has been removed by a RIE method, the insulating layer is deposited on the base region 6, an the etching stopper layer 8 is formed by patterning in such a configuration that a part of the base region 6 is exposed at the edge. A material of this etching stopper layer 8 is desirably the one removable by wet-series etching so as not to damage the base region 6 serving as a base layer when formed with the opening 11 for providing the emitter which will be mentioned later on. For example, it may imply an oxide layer or a nitride layer or a composite layer thereof.

Figure 20:
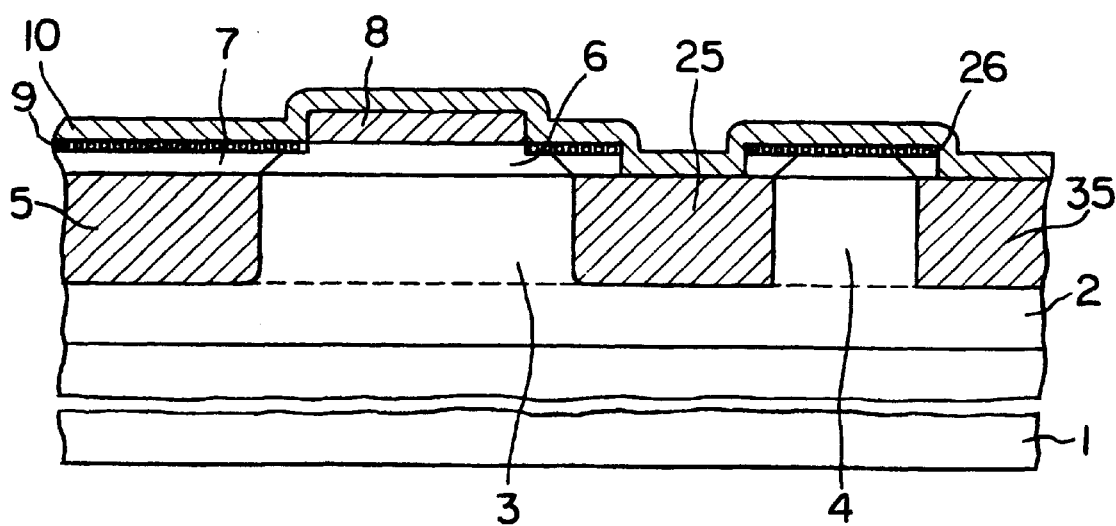
FIG. 20 is a partial sectional view showing a process step of manufacturing the npn-type bipolar transistor according to the first embodiment of the semiconductor device according to the present invention.

Next, as shown in FIG. 20, a p-type impurity is ion-implanted into the base region with a dose of $5.0 \times 10^{15}$ cm at an acceleration voltage on the order of 30 KeV, and an n-type impurity is ion-implanted into the external collector lead-out region with a dose of $10 \times 10^{16}$ cm$^{-2}$ at an acceleration voltage on the order of 60 KeV. Thereafter, a refractory metal such as, e.g., titan (Ti), cobalt (Co) and nickel (Ni) etc is deposited, and a thermal treatment is effected at a temperature of 700° C. for 30 sec, thereby forming metal silicide 9 and metal silicide 26. The refractory metal that is not yet reacted is removed by a mixed liquid of sulphuric acid/hydrogen peroxide, and thereafter the nitride layer 10 having a thickness on the order or 500 Å–2000 Å is deposited based on a CVD method. Note that the nitride layer 10 may be an oxide layer or a composite layer of the oxide layer and the nitride layer, and it is desirable to take a selection ratio of 30% when in the etching process with respects to the etching stopper layer 8.

Figure 21:
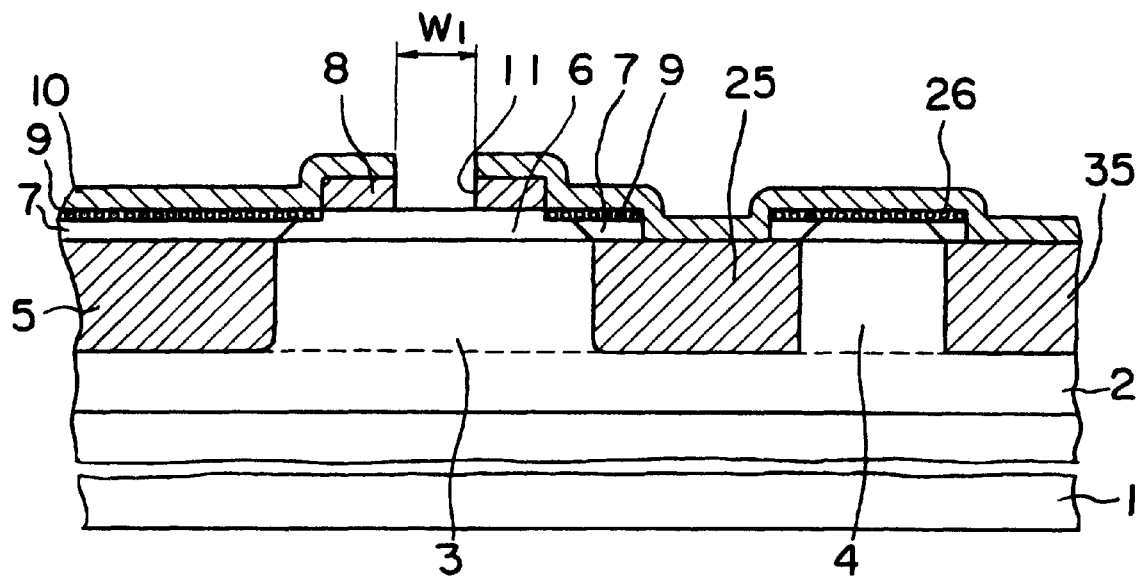
FIG. 21 is a partial sectional view showing a process step of manufacturing the npn-type bipolar transistor according to the first embodiment of the semiconductor device according to the present invention.

Next, as shown in FIG. 21, the opening 11 is formed in the area existing on the active base region of the etching stopper layer 8 and the nitride layer 10 by a predetermined lithography process.

Next, as illustrated in FIG. 22, the polysilicon 12 is deposited over the entire surface, and an n-type impurity, e.g., arsenic under such a condition that a dose is $1.0 \times 10^{16}$ cm$^{-2}$ and an acceleration voltage is on the order of 60 KeV. The, the thermal treatment is carried out in an atmosphere of 950° C.–1000° C. for 20 sec, and arsenic is diffused in the solid phase into the base region 6 contiguous to the polysilicon layer 12. Thereafter, the emitter region 13 is formed by patterning in a predetermined shape. Note that the polysilicon layer 12 can be herein formed into polysilicon already doped with arsenic instead of ion-implanting arsenic. Further, silicon crystal doped with arsenic may also be epitaxially grown instead of polysilicon. Moreover, other n-type impurity, e.g., phosphorus my be used in place of arsenic.

Thereafter, the inter-layer insulating layer 14 is deposited by the CVD method, and, through the predetermined lithography process, there are formed the contact hole 16 to the base electrode, the contact hole 15 to the emitter electrode and the contact hole 17 to the collector electrode. Then, necessary spring is arranged by use of a metal such as aluminum (Al) and tungsten (W) etc to obtain the structure shown in FIG. 16.

By the manufacturing method of this embodiment, it is feasible to provide a semiconductor device having the above-mentioned features, shown in FIG. 16.

Furthermore, a manufacturing yield is enhanced with an emitter plug, effect restrained because of the side wall spacer not being provided within the emitter opening 11 with the result that the solid phase diffusion into the active base region 6 is performed well. Further, there are not the processes of RIE and depositing the insulating layer when forming the side all spacer, and hence the manufacturing process is simplified, whereby the manufacturing costs can be reduced.

Figure 23:
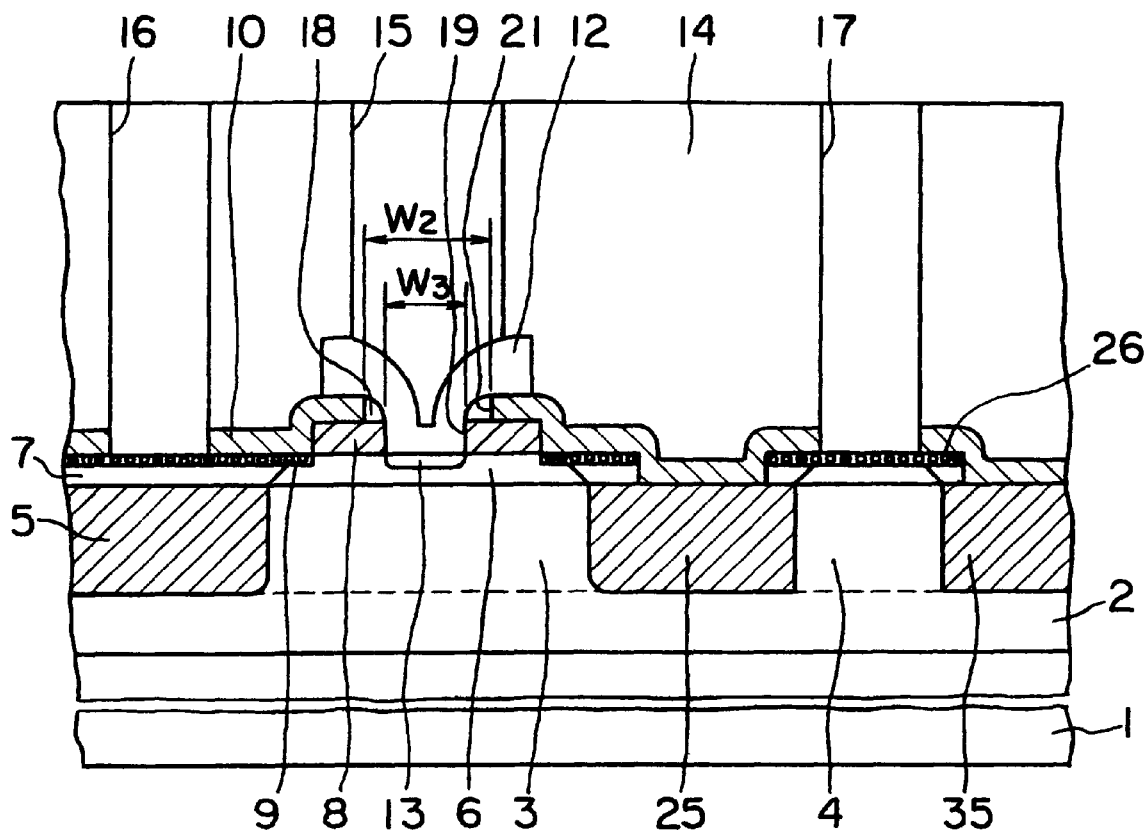
FIG. 23 is a partial sectional view of an npn-type bipolar transistor in a second embodiment of the semiconductor device according to the present invention.

FIG. 23 is a sectional view illustrating a device structure of the npn type bipolar transistor in a second embodiment of the semiconductor device according to the present invention.

The n⁻ type buried layer 2 with a high concentration is provided on the p-type silicon substrate 1, and the n-type collector region 3 and the external collector lead-out region 4 are provided thereon, the insulating layers 25, 5, 35 are provided between the collector region 3 and the external collector lead-out region 4 as well as along the peripheries thereof, whereby an elementisolation is made. The active base region 6 composed of p-type single crystal silicon is provided on the collector region 3, and the base lead-out region 7 composed of polysilicon is provided on the oxide layer 5. Further, the etching stopper layer 8 is provided on a part of the active base region 6. The conductive layer 9 formed of metal silicide is provided on the base lead-out region 7 and on the active base region 6 but on an area not covered with the etching stopper layer 8 so that the edge of the conductive layer 9 extends into the active base region 6.

The nitride layer 10 is provided over the whole surfaces of the conductive layer 9, the etching stopper layer 8 and the embedded insulating layer 5. A second opening 21 is formed above the etching stopper layer 8, and a side wall spacer 18 composed of an insulating layer is provided along the side wall of this opening 21. Further, a central area of the etching stopping layer 8 is removed, and a first opening 19 for forming an emitter is provided. Moreover, the polysilicon layer 12 doped with an n-type impurity is so provided as to fill the openings 21, 19, and the n-type emitter region 13 is provided in an area positioned within the active base region 6 inwardly of the opening 21 by the solid phase diffusion from the polysilicon layer 12.

The contact hole 15 to the emitter electrode is formed open in an upper portion of the polysilicon layer 12, and further the contact hole 16 to the base electrode and the contact hole 17 to the collector electrode are respectively formed on the base lead-out region 7 and on the external collector lead-out region 4 as well as on the metal silicide 9, thus providing an electrode of Al etc. The inter-layer insulating layer 14 serving as a protection layer is interposed between these electrodes.

In the npn-type bipolar transistor shown in FIG. 23, as in the first embodiment, not the base polysilicon electrode but the metal silicide 9 is sued as a base lead-out electrode, and the second opening 19 can be shallowed so much for that. With this contrivance the emitter aspect ratio decreases, and the emitter resistance value can be reduced. Further, the metal silicide 9 enters the active base region 6 and, besides, extends up to the edge of the etching stopper layer 8, and therefore the base resistance value is remarkably reduced. As a result, the high frequency characteristic and the noise characteristic of the bipolar transistor are enhanced. Note that, in this embodiment, the side wall space is provided within the second opening 21, and if the thickness of the etching stopper layer 8 becomes the same as that of the bipolar transistor shown in FIG. 16, it is not possible to reduce the aspect ratio. However, an emitter opening width W3 can be reduced under a limit determined by the lithography. As a consequence, the bipolar transistor operated by a much smaller electric power consumed can be manufactured.

Next, the method of manufacturing the bipolar transistor exhibiting the above effect is discussed by way of a second embodiment of the manufacturing method of the semiconductor device according to the present invention with reference to FIGS. 17–20 and 23–25.

To begin with, as illustrated in FIGS. 17 to 20, the components up to the nitride layer 10 of the bipolar transistor are formed by use of the manufacturing method discussed in the first embodiment.

Figure 1:
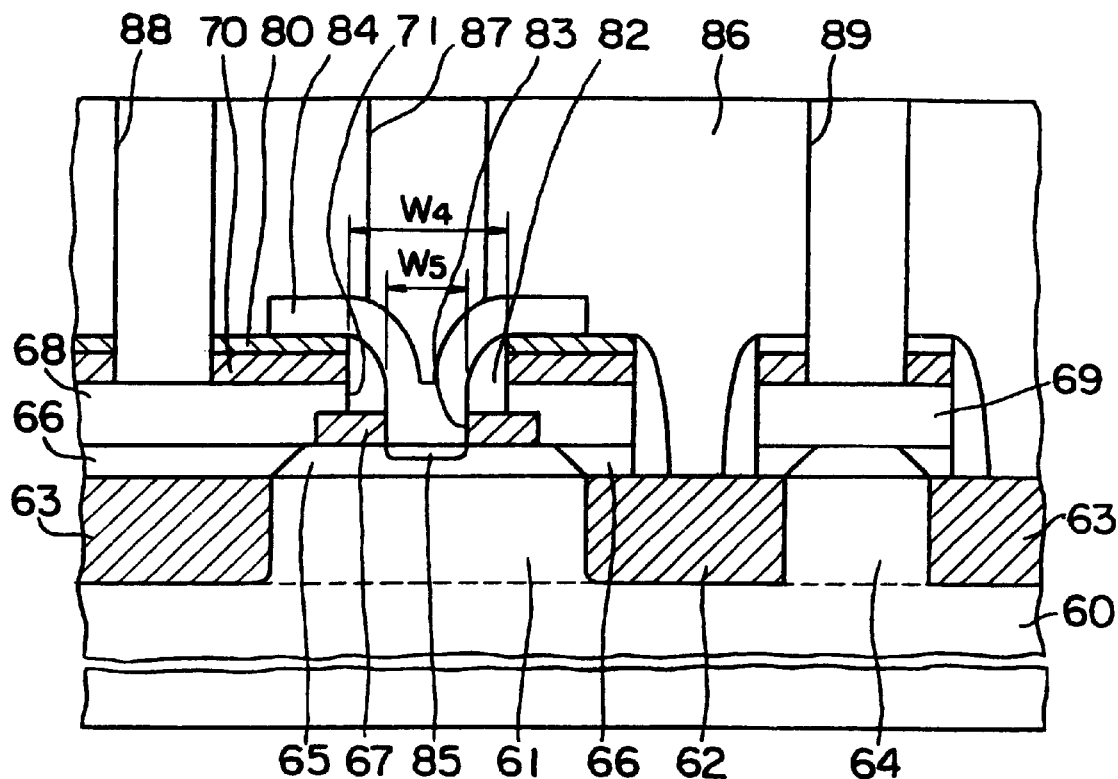
FIG. 1 is a sectional view illustrating a device structure of a prior art npn-type bipolar transistor.
Figure 25:
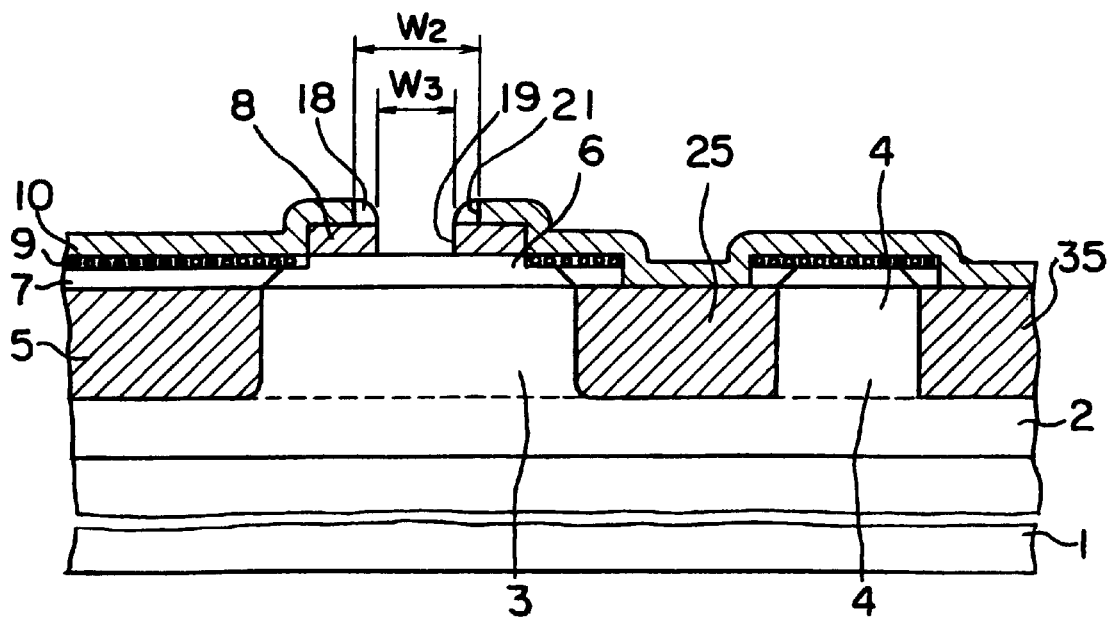
FIG. 25 is a partial sectional view showing a process step of manufacturing the npn-type bipolar transistor according to the second embodiment of the semiconductor device according to the present invention.
Figure 2:
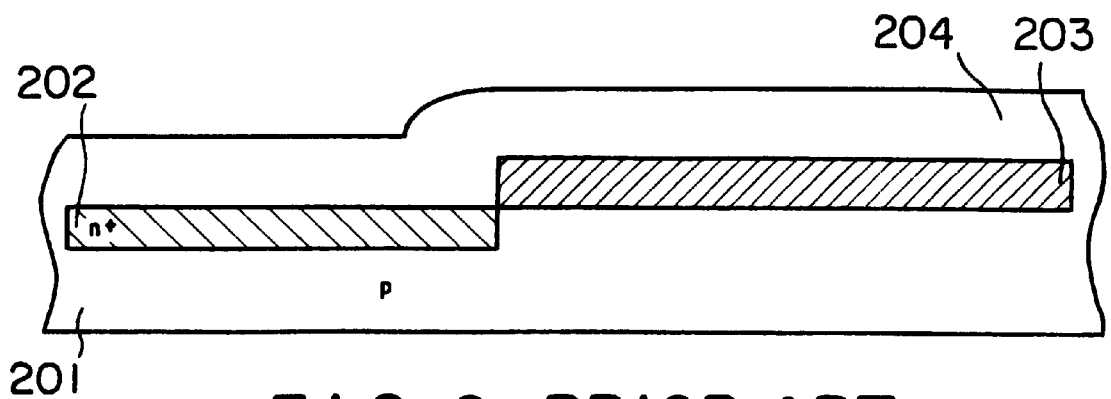
FIG. 2 is a partial sectional view showing a process step of manufacturing a Bi-CMOS LSI according, to the prior art.
Figure 3:
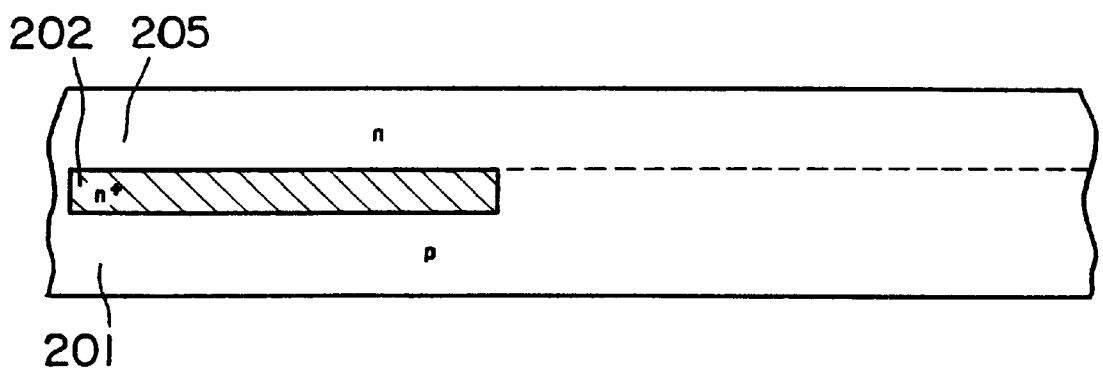
FIG. 3 is a partial sectional view showing a process step of manufacturing a Bi-CMOS LSI according to the prior art.
Figure 4:
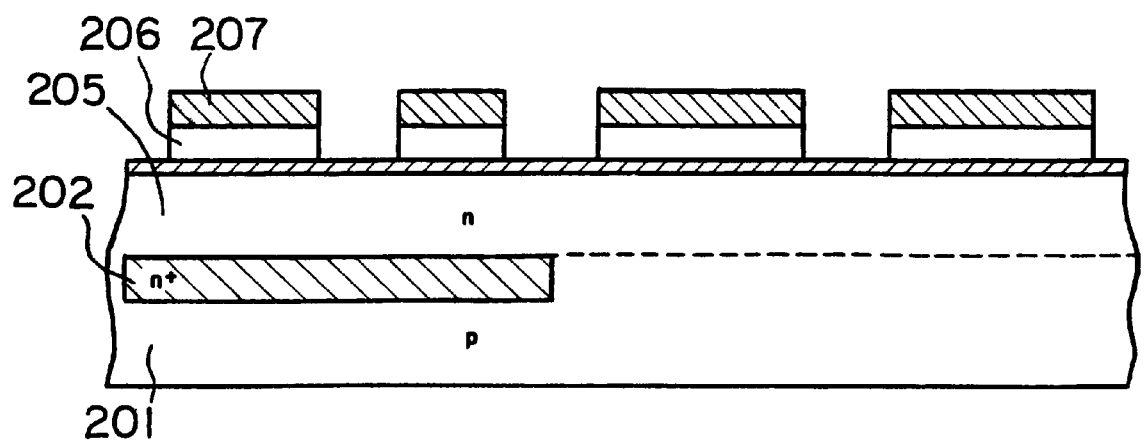
FIG. 4 is a partial sectional view showing a process step of manufacturing a Bi-CMOS LSI according to the prior art.
Figure 5:
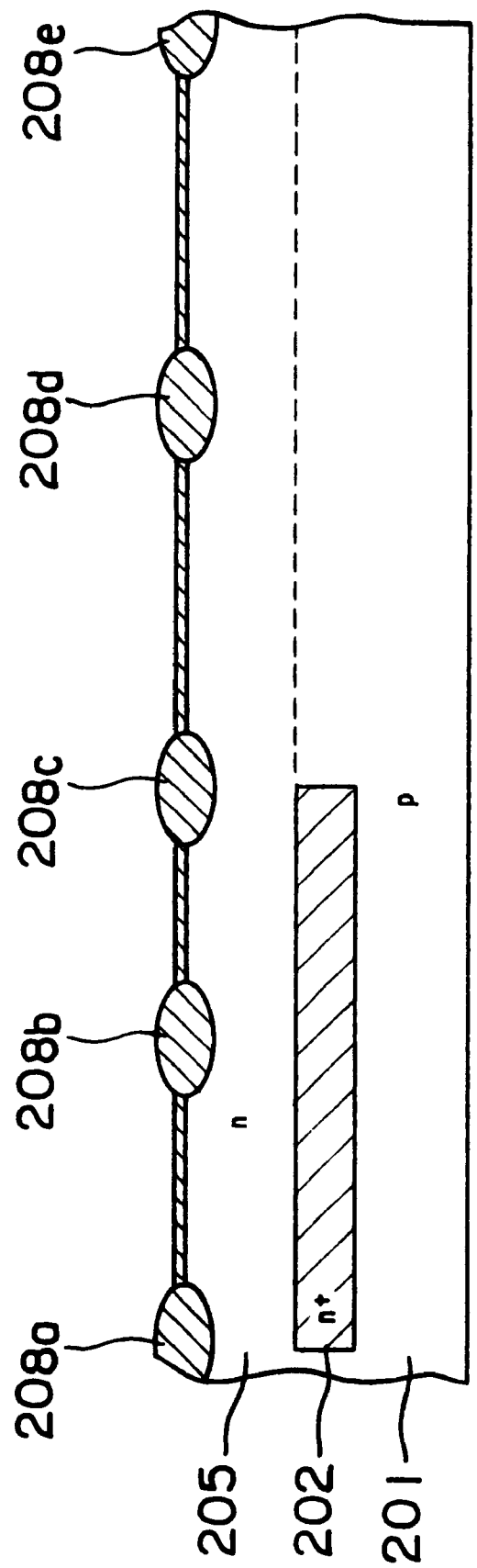
FIG. 5 is a partial sectional view showing a process step of manufacturing a Bi-CMOS LSI according to the prior art.
Figure 6:
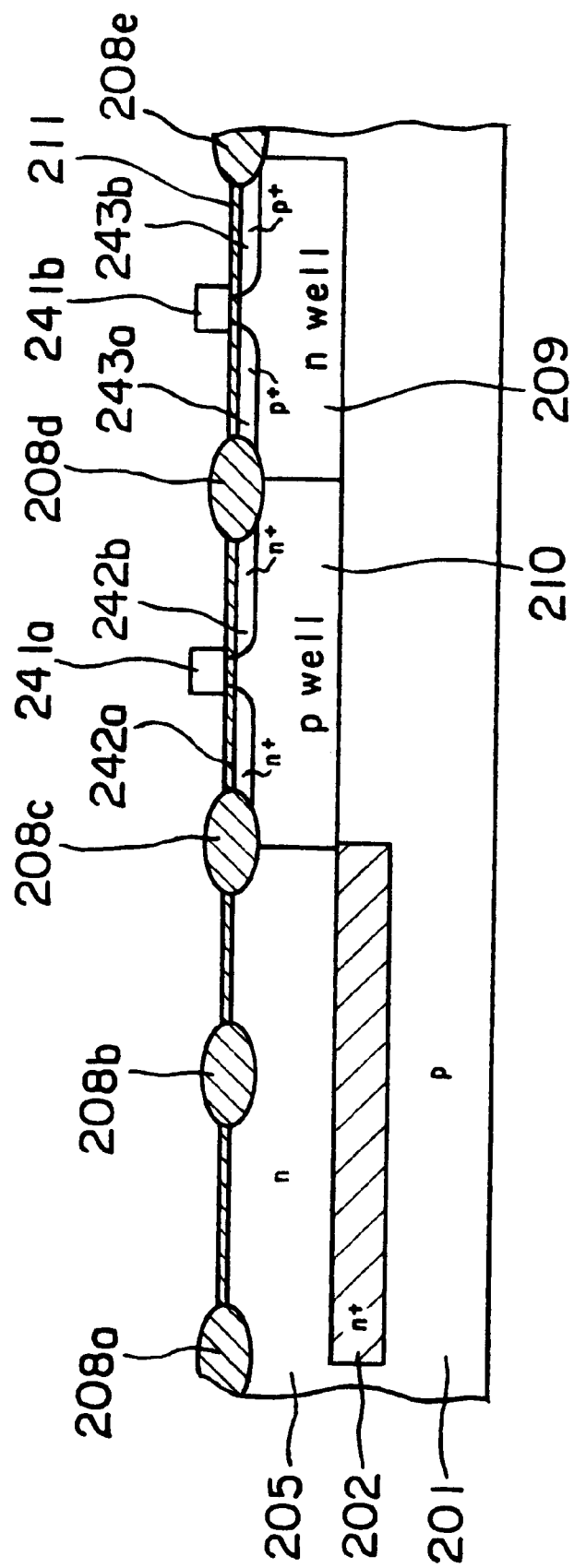
FIG. 6 is a partial sectional view showing a process step of manufacturing a Bi-CMOS LSI according to the prior art.
Figure 7:
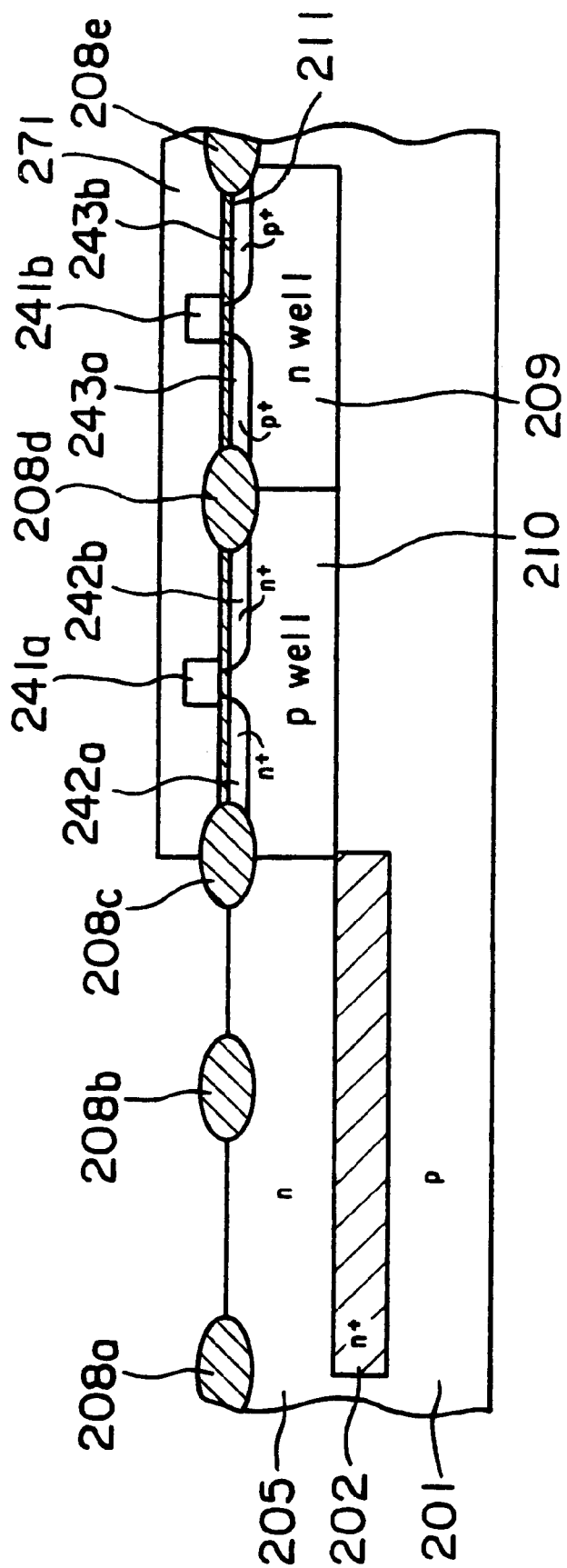
FIG. 7 is a partial sectional view showing a process step of manufacturing a Bi-CMOS LSI according to the prior art.
Figure 8:
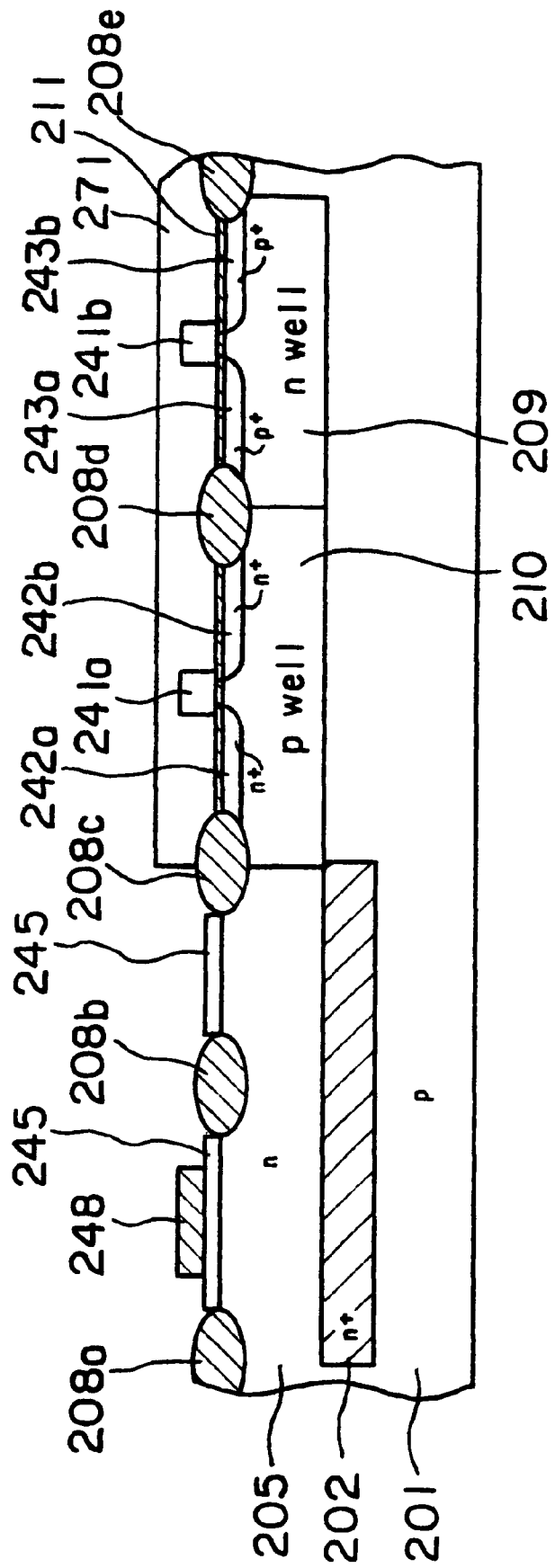
FIG. 8 is a partial sectional view showing a process step of manufacturing a Bi-CMOS LSI according to the prior art.
Figure 9:
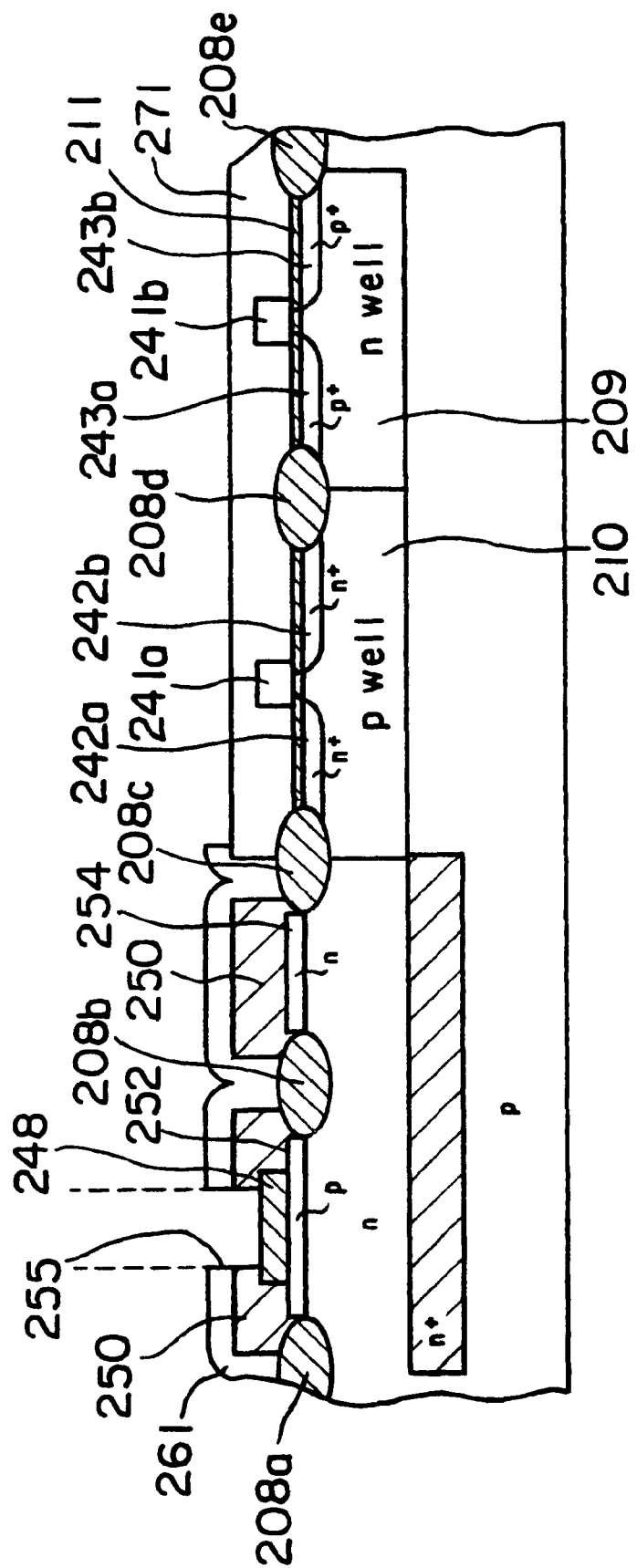
FIG. 9 is a partial sectional view showing a process step of manufacturing a Bi-CMOS LSI according to the prior art.
Figure 10:
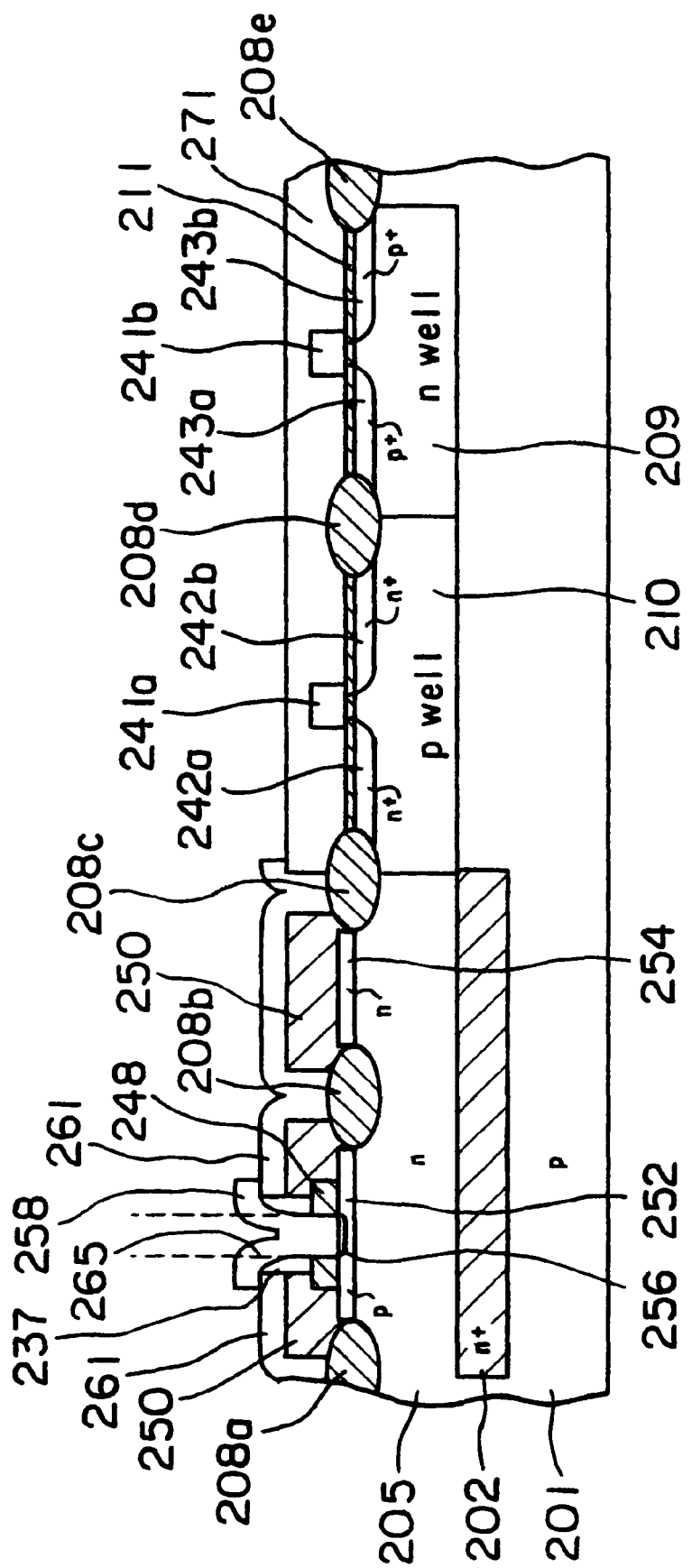
FIG. 10 is a partial sectional view showing a process step of manufacturing a Bi-CMOS LSI according to the prior art.
Figure 11:
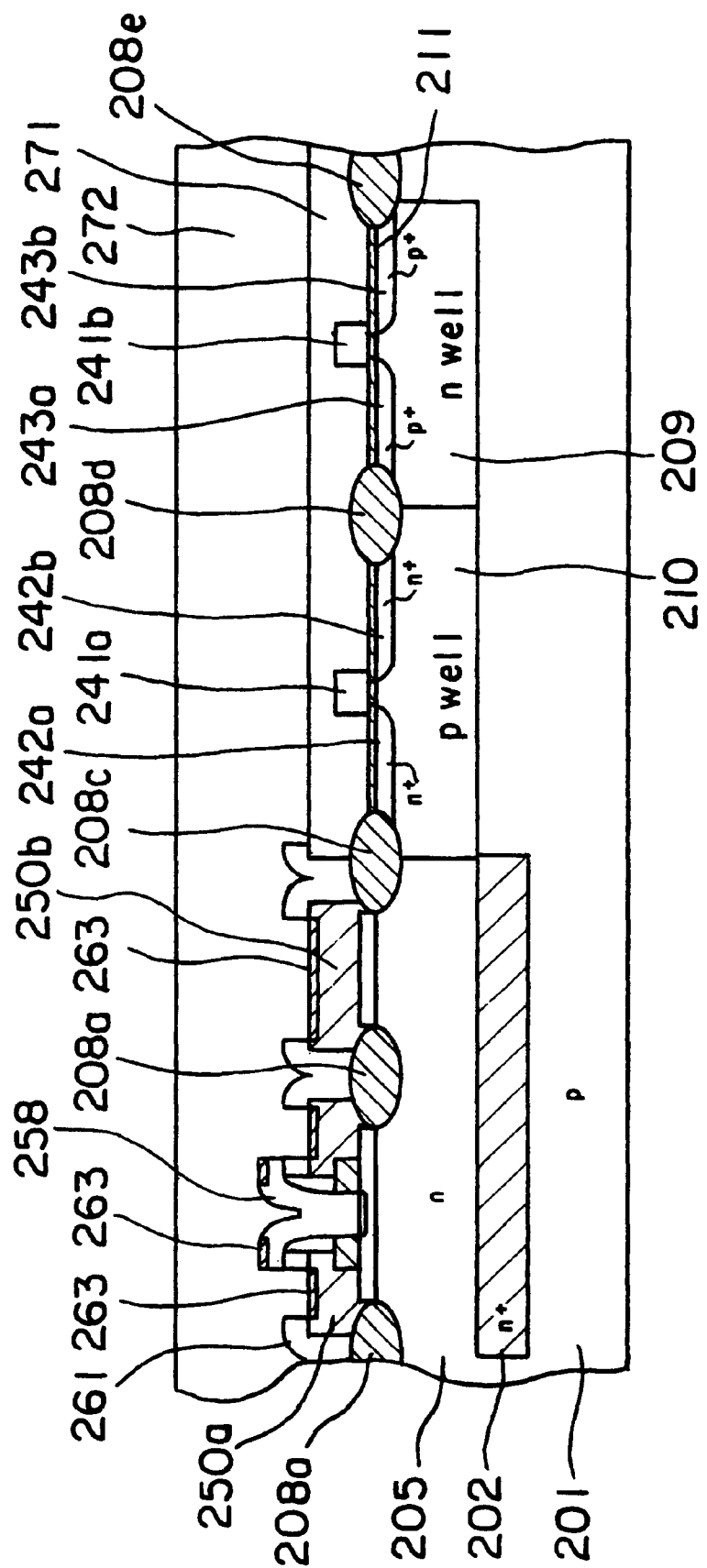
FIG. 11 is a partial sectional view showing a process step of manufacturing a Bi-CMOS LSI according to the prior art.
Figure 12:
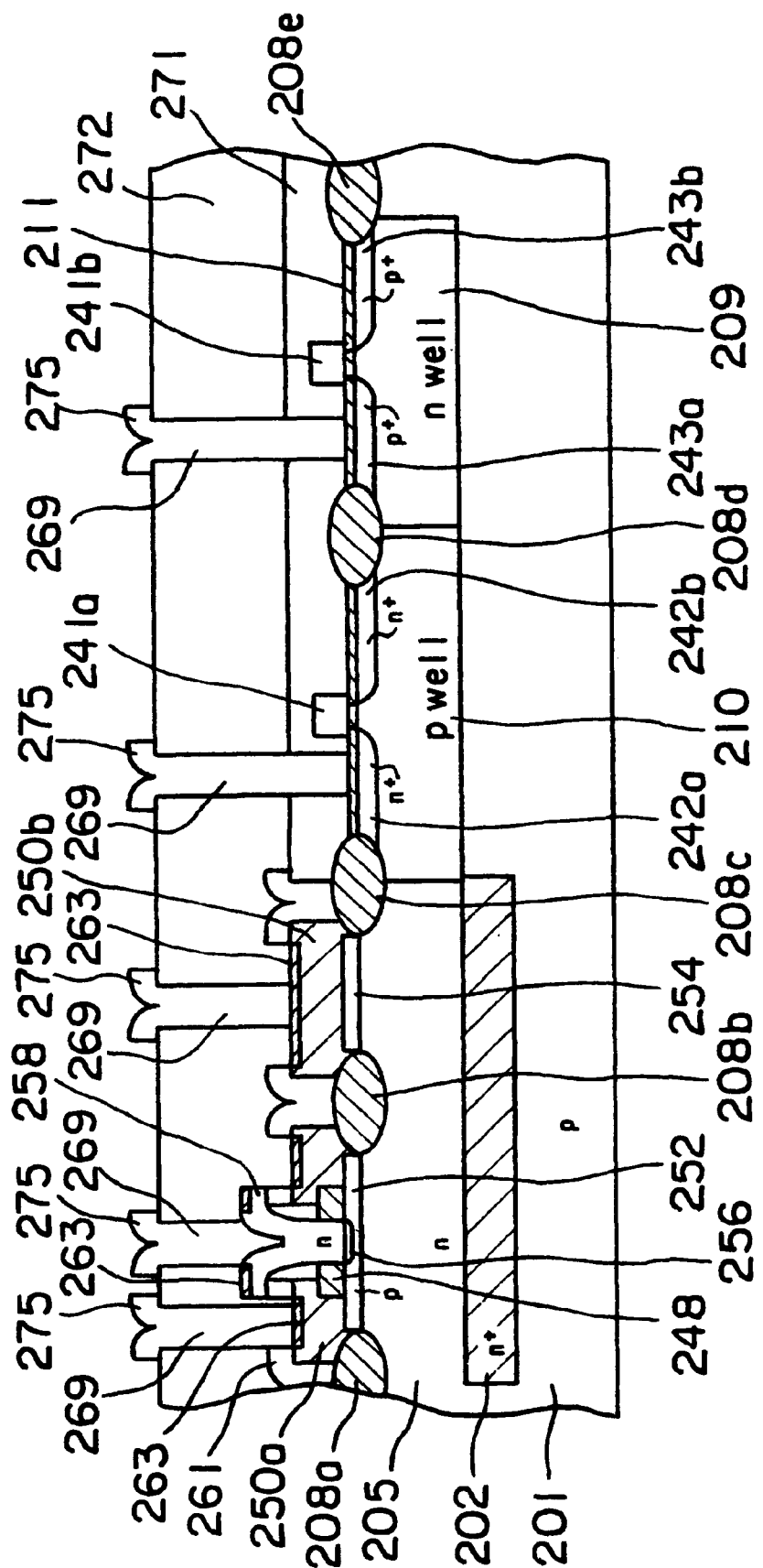
FIG. 12 is a partial sectional view showing a process step of manufacturing a Bi-CMOS LSI according to the prior art.
Figure 24:
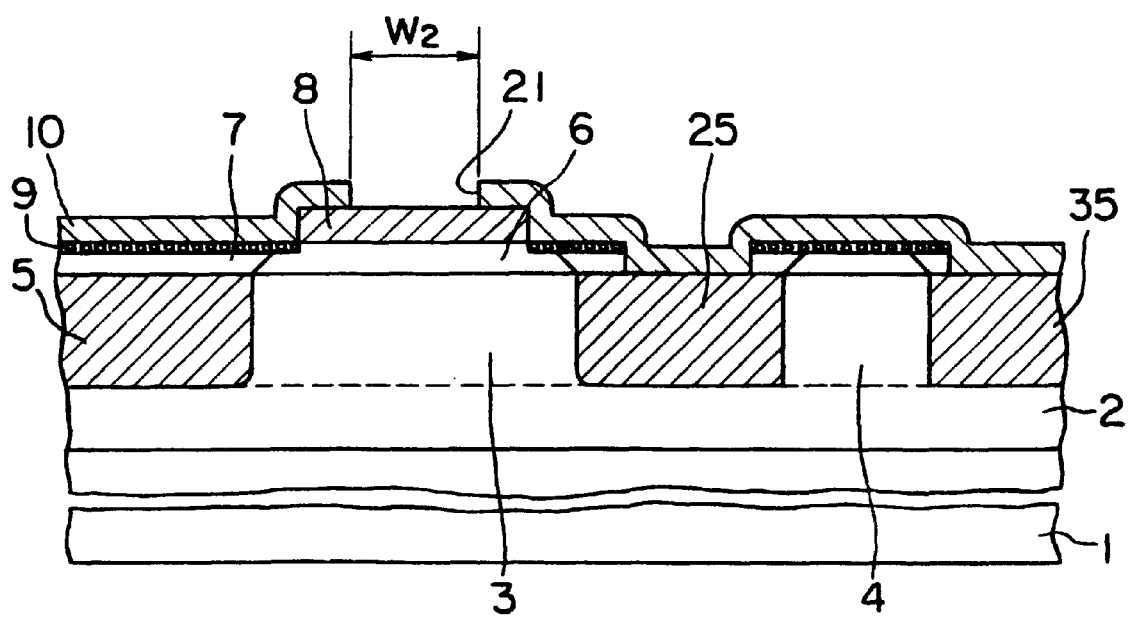
FIG. 24 is a partial sectional view showing a process step of manufacturing the npn-type bipolar transistor according to the second embodiment of the semiconductor device according to the present invention.

Next, as shown in FIG. 24, a second opening 21 is formed in an area positioned above the active base region by the predetermined process. Subsequently, as illustrated in FIG. 25, an insulating layer 18 is deposited up to a thickness on the order of 500 Å–1000 Å, and the side wall spacer 18 is provided by the RIE. Thereafter, the etching stopper layer 8 is selectively removed, thus forming a first opening 19 for providing the emitter.

Thereafter, deposition of the polycrystalline layer 12, ion implantation, forming of the emitter region 13 by heat treatment, forming of the inter-layer insulating layer 14 and forming of the electrodes, etc. are performed by the same method as that described in the first embodiment, thereby completing the device.

According to the semiconductor device of the present invention, the metal silicide is provided on the non-selectively epitaxially grown active base region and base lead-out region, and therefore the base resistant value and the emitter resistance value can be reduced to a greater degree than in the bipolar transistor having the base lead-out region formed by the conventional technique. Further, for the structure having no side wall spacer the thickness of the etching stopper layer 8 is decreased so much for that, and the emitter opening 11 is further shallowed. As a result, the emitter aspect ratio is further decreased, and the emitter resistance value can be reduced to much greater degree.

Moreover, the base/collector capacity value with respect to the emitter areal size can be decreased so much for not having the side wall spacer. As a consequence of the above-mentioned, there is provided the bipolar transistor in which the high frequency characteristics such as fmax, Ga etc and the noise characteristic such as Nf etc are enhanced.

Moreover, according to the semiconductor device of the present invention, since the metal silicide extends up to the edge of the etching stopper layer, there is provided a bipolar transistor in which the base resistance value, the emitter resistance value, the high frequency characteristic such as fmax, Ga etc and the noise characteristic such as Nf etc are much enhanced.

According to the manufacturing method of the semiconductor device of the present invention, the bipolar transistor exhibiting the above effect is obtained. Further, since there is not process of forming the side wall spacer, the controllability of the width of the diffused layer is enhanced, and the plug effect of the emitter can be restrained. Therefore, the manufacturing yield can he improved by obtaining the scatter in terms of the device characteristics. In addition, the manufacturing process is simplified, and consequently the manufacturing costs can be also reduced.

Moreover, according to the manufacturing method of the semiconductor device of the present invention, the bipolar transistor exhibiting the above effect is obtained.

Next, an embodiment of a Bi-CMOS LSI according to the present invention will be explained.

Figure 26:
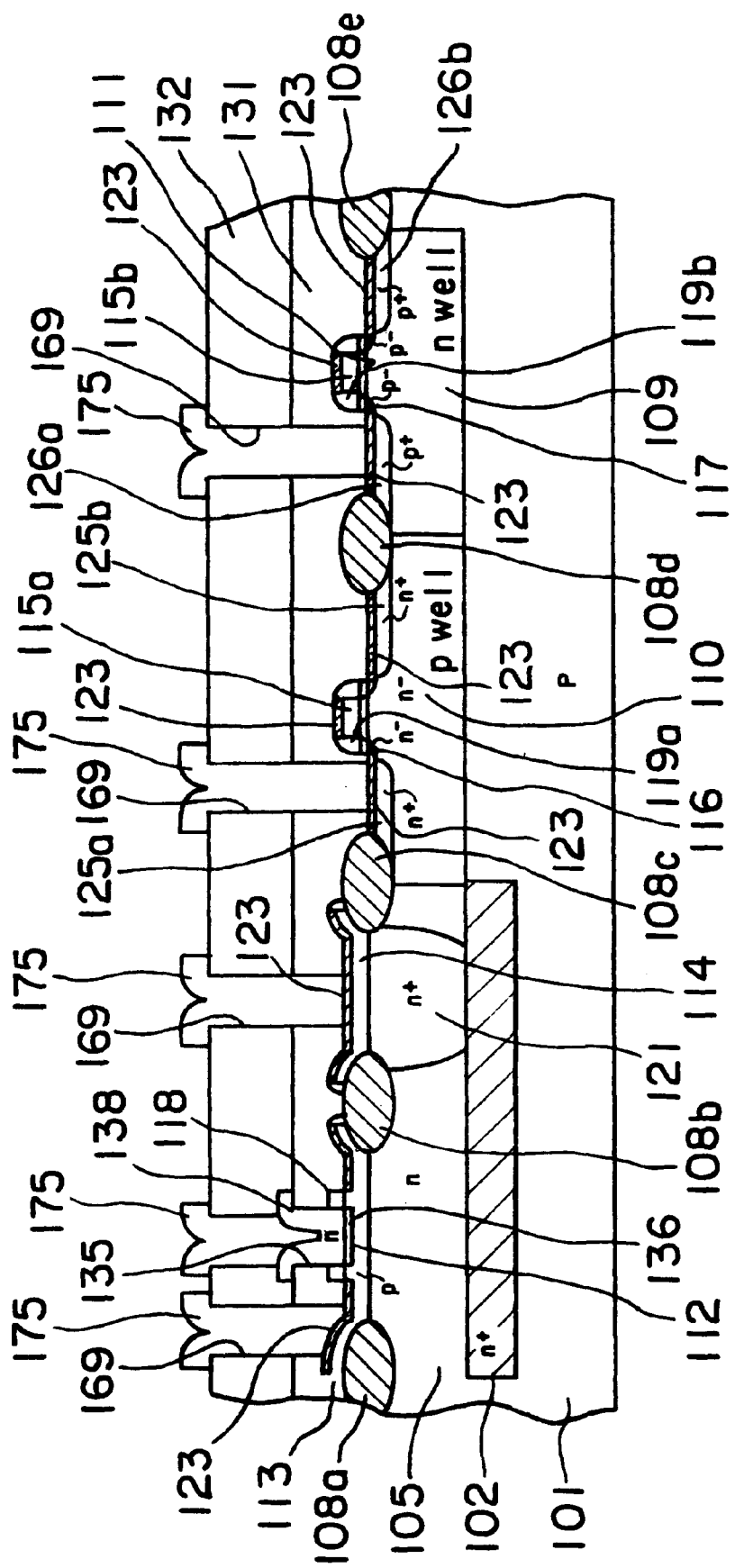
FIG. 26 is a partial sectional view showing a device structure of a Bi-CMOS LSI in a third embodiment of the semiconductor device according to the present invention.

FIG. 26 is a partial sectional view showing a device structure of the Bi-CMOS LSI in a third embodiment of the semiconductor device of the present invention.

Referring to FIG. 26, a high-concentration $n^+$ type buried layer 102 is provided on the p-type semiconductor substrate 101, and a bipolar transistor is provided on the first region thereon. Further, a CMOS type field effect transistor constructed of an n-channel MOS transistor provided on a second region and a p-channel MOS transistor provided on a third region, is provided on a region not formed with the $n^+$ type buried layer of the semiconductor substrate 101. Then, a collector lead-out electrode 123 composed of single crystal silicon is provided on the collector lead-out region 121.

At the first onset, giving an explanation of a construction of the bipolar transistor, an n-type collector region 105 and a collector lead-out region 121 are provided on the n+ type buried layer 102, and the collector lead-out electrode 123 composed of the single crystal silicon is provided on the collector lead-out region 121.

Insulating layers 108a–108c are provided between the collector region 105 and the collector lead-out region 121 as well as on the surface portions of areas peripheral thereto, whereby an elementisolation is made.

An active base region 112 composed of the single crystal silicon doped with a p-type impurity is provided on the collector region 105, and a base lead-out region 113 composed of polysilicon is provided on the insulating layer 108a. Further, an etching stopper layer 118 is provided on a part of the active base region 112.

Metal silicide 123 is provided on the surface portion of an area, not covered with the etching stopper layer 118, of the base lead-out electrode 113 and the active base region 112 as well as on the surface portion of the collector lead-out electrode 123.

An insulating layer 131 is provided over the entire surfaces of the metal silicide 123, the etching stopper layer 118 and of the elementisolation insulating layers 108a–108c, and an emitter opening 135 is so formed in an area positioned above the etching stopper layer 118 in this insulating layer 131 as to reach the active base region 112. Furthermore, the polysilicon layer doped with the n-type impurity is so deposited as to fill the emitter opening 135, and an emitter region 136 is provided within the active base region 112 contiguous to the polysilicon layer by the solid phase diffusion from the polysilicon layer, wherein the polysilicon layer above the emitter region 136 serves as an emitter lead-out electrode 138.

Next, a construction of the MOS type transistor will be explained. In the region not formed with the $n^+$ type buried layer 102 on the semiconductor substrate 101, a p-well 110 into which a p-type impurity is implanted is formed in the second region. Further, an n-well 109 implanted with an n-type impurity is formed in a third region.

An insulating, layer 108d is provided on the surface of an interface between the p-well 110 and the n-well 109, and insulating layers 108c, 108e are provided on the surfaces of areas peripheral to the p-well 110 and the n-well 109, whereby the element isolation is made.

An oxide layer 111 is provided on the surfaces of the p-well 110 and the n-well 109, and gate electrodes 115a, 115b each composed of polysilicon are provided on the oxide layer 111. Further, side wall spacers 119a, 119b serving as side wall protection layers are provided on side surfaces of the gate electrodes 115a, 115b.

Impurity diffused regions 116, 117 into which n-type and p-type impurities are implanted with a low concentration, are provided on the surface portions of the respective wells but on areas positioned under the side wall spacers 119a, 119b, thereby relieving the electric field in the lateral direction and restraining hot carriers from being generated.

N-type and p-type impurities are ion-implanted with a high concentration into the surface portions of the respective wells at spacings corresponding to widths of the gate electrodes 115a, 115b and the side wall spacers 119a, 119b, whereby an nMOS source and drain 125b, 125a, and pMOS source and drain 126b, 126a are respectively formed. An LDD structure is thus shaped together with the low-concentration impurity diffused regions 116, 117.

A refractory metal such as Ti, Co, Ni etc is deposited on the surfaces of the gate electrodes 115a, 115b as well as on the oxide layer on the source and drain, and thereafter, through the thermal treatment, the metal silicide 123 is formed.

The insulating layer 131 provided simultaneously with the bipolar transistor device is deposited on the device forming region of the CMOS transistor described above, and, on this insulating layer 131, an inter-layer insulating layer 132 is provided over the whole surface of the bipolar transistor region defined as a first region and the CMOS transistor regions defined as second and third regions.

In the regions of the insulating layer 31 and the inter-layer insulating layer 132, contact holes 169 are formed in an area existing on the base lead-out electrode 113, the emitter lead-out electrode 138 and the collector lead-out electrode 114 of the bipolar transistor and on a drain of each MOS transistor.

Ti/TiN as an unillustrated barrier metal is deposited on bottom surfaces and side surfaces of respective contact holes 169. Then, wiring metals such as Al etc are so deposited on these barrier metal as to fill the respective contact holes, and are connected to a wiring layer 175 provided on the inter-layer insulating layer 32.

The following is a description of a characteristic point, as compared with the prior art, of the semiconductor device in a third embodiment of the present, invention shown in FIG. 26.

To begin with the characteristic of the bipolar transistor is that the polysilicon electrode is not further stacked on the base lead-out electrode 113 and the collector lead-out electrode 114, but the metal silicide 123 is provided and the impurity diffused layers thereof are directly used as electrodes. As a result, the emitter opening 135 can be shallowed, and therefore the emitter aspect ratio is decreased, and the emitter resistance value can be reduced. Further, the metal silicide 123 on the active base region 112 extends up to the edge of the etching stopper layer 118a, and hence that base resistance value is remarkably reduced. As a consequence, the high frequency characteristic and the noise characteristic of the bipolar transistor are enhanced. Moreover, with the reduction in the aspect ration described above, the so-called emitter plug-effect can be restrained, and good and stable electric characteristics can be obtained.

Next, a second characteristic of this bipolar transistor is that the side wall spacer does not exist within the opening 135, and the thickness of the etching stopper layer 118 becomes much smaller for that with this contrivance, the emitter opening 135 is further shallowed and hence the emitter aspect ratio is further decreased with the result that the emitter resistance value cab be also reduced. Moreover, the base/collector capacity value with respect to the emitter areal size can be decreased. As a result, the high frequency characteristic and the noise characteristic of the bipolar transistor are remarkably enhanced.

The following are other characteristic points. The thicknesses of the active base region 112, the base lead-out electrode 113 and the collector lead-out electrode 114 are the same as the thicknesses of the gate electrodes 115a, 115b. The etching stopper layer 118 is composed of the same material as that of the side wall spacers 119a, 119b. The impurity concentration in the active base region 112 and the base lead-out electrode 113 is the same as the impurity concentration in the pMOS source and drain. Further, the thickness and the material of the metal silicide 123 are all the same as those of the bipolar transistor and the CMOS transistor. These characteristics are derived from the manufacturing method according to the present invention.

Hereinafter, the method of manufacturing the Bi-CMOS LSI shown in FIG. 26 will be explained by way of a third embodiment of the manufacturing method of the semiconductor device according to the present invention with reference to FIGS. 26–36.

Figure 27:
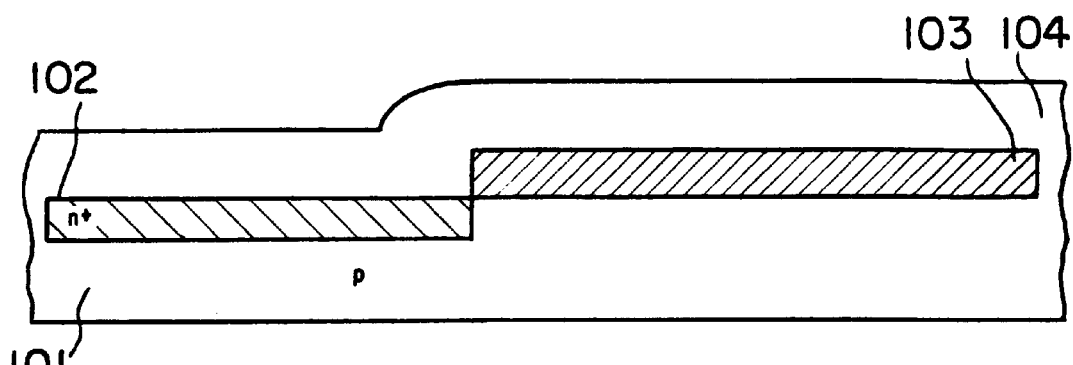
FIG. 27 is a partial sectional view showing a process step of third process of the Bi-CMOS LSI as the semiconductor device according to the present invention.

To begin with, as shown in FIG. 27, in the same way as in the prior art, an oxide layer 103 is formed by thermal oxidation on the p-type silicon substrate 101, and subsequently the oxide layer 103 on a region to be formed with a $n^+$ buried layer is removed by etching using an HF series solution and by patterning of a resist based on the photolithography. Thereafter, an oxide layer 4 containing antimony (Sb) is deposited on the surface of the silicon substrate 101, and Sb is diffused into the silicon substrate 101 by executing the thermal process, thereby forming an $n^+$ buried layer 102.

Figure 28:
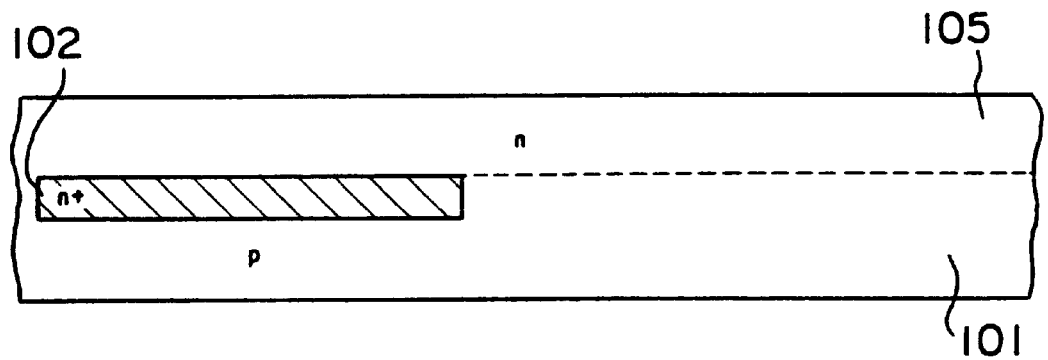
FIG. 28 is a partial sectional view showing a process step of the third process of the Bi-CMOS LSI as the semiconductor device according to the third embodiment of the semiconductor device of the present invention.

Next, as shown in FIG. 28, the oxide layers 103, 104 are removed by the HF series solution, and thereafter a single crystal silicon layer 105 containing phosphorus (P) on the order of $3.0 \times 10^{16}/cm^3$ is grown in thickness of approximately 1.0 μm by the epitaxial growth method.

Figure 29:
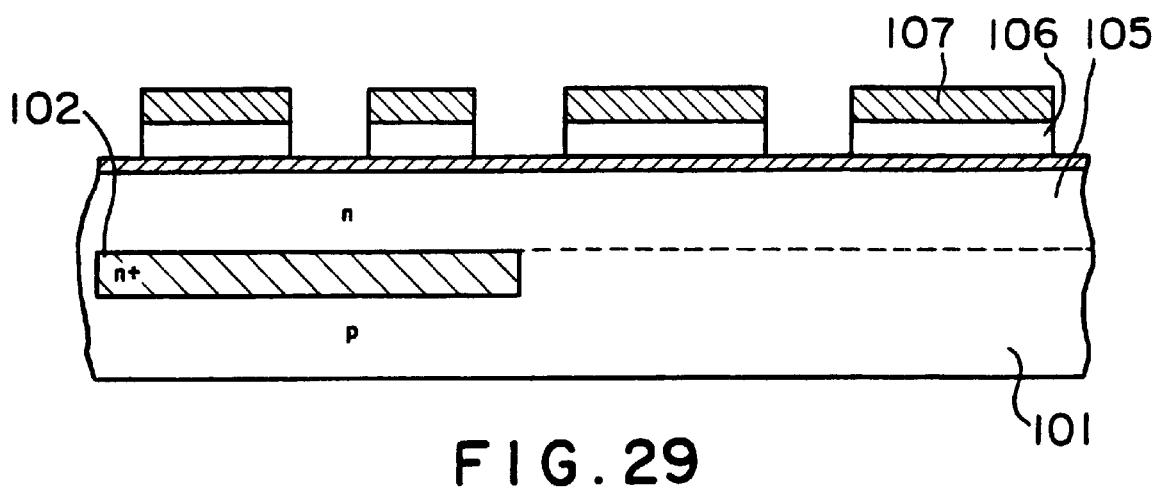
FIG. 29 is a partial sectional view showing a process step of the third process of the Bi-CMOS LSI according to the present invention.

Next, as illustrated in FIG. 29, after the surface has been oxidated in approximately 500 Å, there are deposited polysilicon 106 having a thickness of 1000 Å and a silicon nitride layer 107 having a thickness of 1000 Å. Then, after the patterning has been carried out the polysilicon and the nitride layer on the region for the element isolation are removed by the reactive ion etching (RIE).

Next, as shown in FIG. 30, oxide layers 108a–108e are formed by the thermal oxidation on the region not covered with the polysilicon 106 and the nitride layer 107, and are used for the element isolation.

Thereafter the polysilicon 106 and the nitride layer 107 on the surface of the silicon substrate 1 are removed by CDE.

Subsequently, as illustrated in FIG. 31, the resist is subjected to patterning in a predetermined configuration, and phosphorus defined as the n-type impurity is ion-implanted under with a dose of $2.5 \times 10^{13}$ cm$^{12}$ and an energy on the order of 680 KeV thereby forming, an n-well 109. Thereafter, boron as a p-type impurity is ion-implanted while changing, the condition in such a manner that the dose and the energy are $8.5 \times 10^{11}$ cm, 40 KeV;$^{-2}$ $10 \times 10^{12}$ cm$^{-2}$, 90 KeV; $1.0 \times 10$ cm$^{-2}$, 160 KeV, thereby forming a p-well 110.

Thereafter, the oxide layer on the device region surface is removed by the HF series solution, and then the whole surface is thermally oxidized, thereby providing a gate oxide layer 111 for manufacturing a MOS type field effect transistor.

Subsequently, as shown in FIG. 32, the oxide layer 111 on the region to be formed with the bipolar transistor is removed by the HF series solution. Thereafter, by using a non-selective epitaxial growth technique, the single crystal silicon which will become the active base region 112 and the collector lead-out electrode 114 is grown on the silicon substrate 101, polysilicon element isolation oxide layer 108a, and polysilicon which will become the gate electrodes 115a, 115b are grown on the gate oxide layer 111. Thereafter, the polysilicon is selectively removed by the RIE and the predetermined patterning of the photo resist. Then, the active base region 112, the base lead-out electrode 113 and the collector lead-out electrode 114 are provided, and simultaneously the gate electrodes 115a, 115b are provided.

Figure 33:
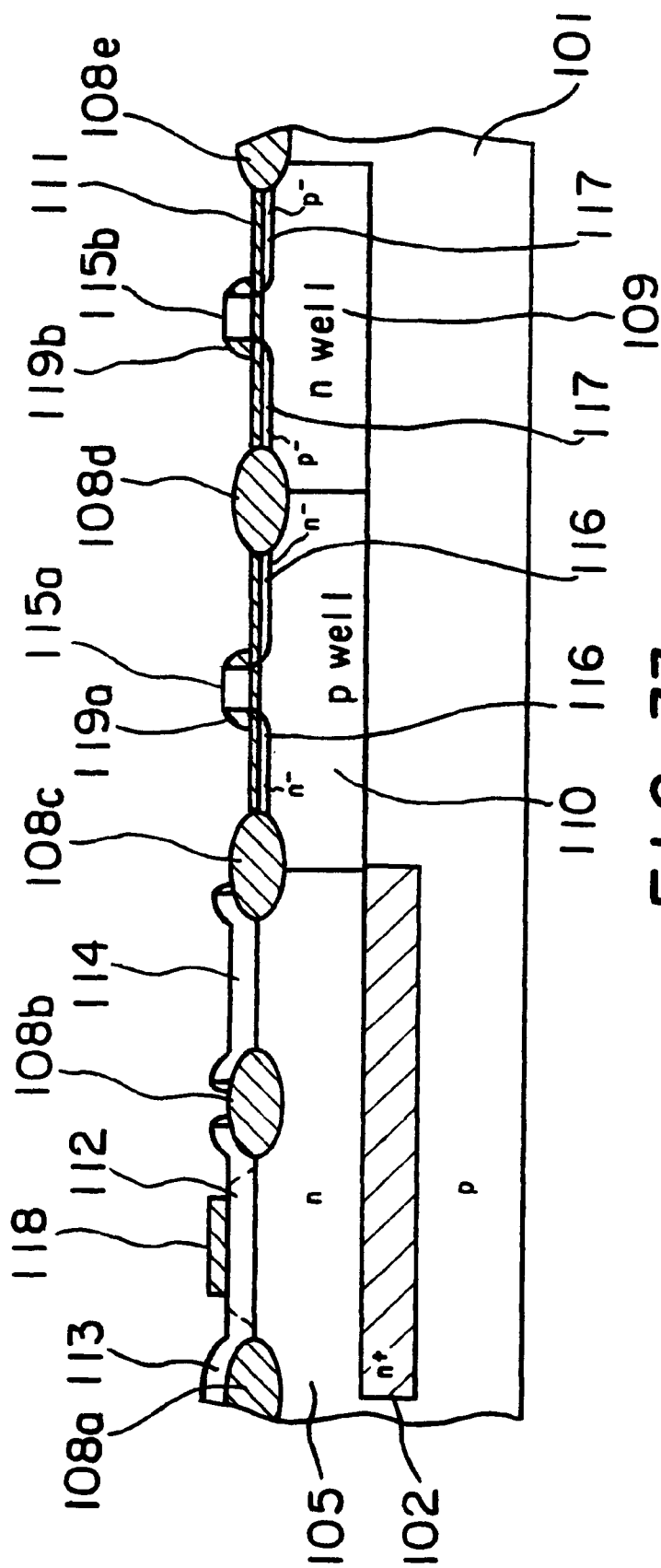
FIG. 33 is a partial sectional view showing a process step of the third process of the Bi-CMOS LSI according to the present invention.

Next, as illustrated in FIG. 33, an oxide layer is formed on the order of 100 Å by the thermal oxidation on the surface of the silicon substrate 101, and thereafter, by the ion implantation (with a dose of $1.0 \times 10^{11}$ cm$^{-2}$, and an energy of 40 KeV) and the thermal treatment followed by the resist patterning, an impurity diffused region 116 for the nMOS and an impurity diffused region 117 for the pMOS are respectively provided as low-concentration diffused regions for the LDD. Thereafter, an insulating layer having a predetermined thickness is deposited, and the etching stopper layer 118 for preventing an etching damage to the active base region 112 when forming the emitter opening is formed by the RIE and the resist patterning based on the lithography. Simultaneously side wall spacers 119a, 119b for the gate electrode of the MOS type field effect transistor are provided.

Figure 34:
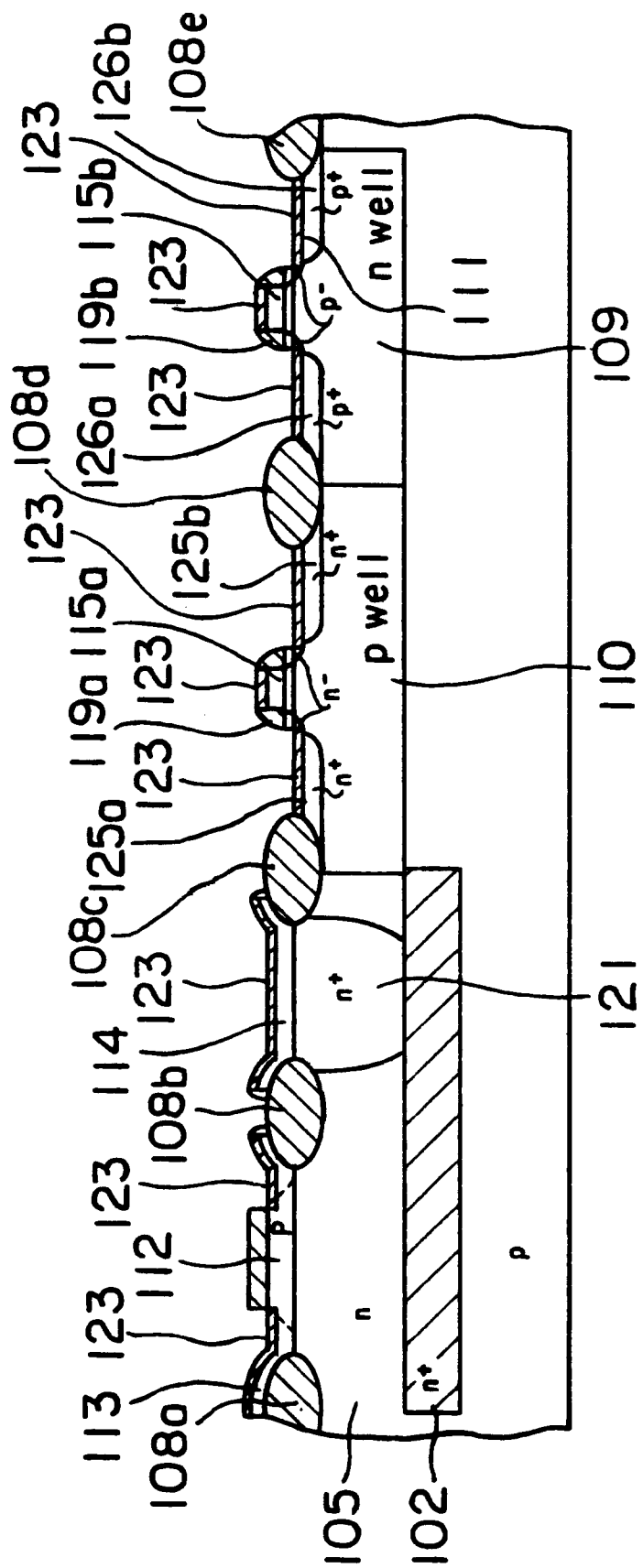
FIG. 34 is a partial sectional view showing a process step of the third process of the Bi-CMOS LSI according to the third embodiment of the semiconductor device of the present invention.

Subsequently, as shown in FIG. 34, after the resist has been subjected to the patterning in a predetermined shape, the p-type impurities are simultaneously are ion-implanted with a dose of $3.0 \times 10^{15}$ cm and an energy on the order of 35 KeV into the active base region 112 not covered with the etching stopper layer 118 and into the region not covered with the side wall spacer 119b and the gate electrode 115b of the n-well 109, whereby pMOS high-concentration diffused layers 126a, 126b are formed by the thermal treatment.

Further, after executing the predetermined patterning on the resist, the ions are implanted downward of the collector lead-out electrode 114 of the collector electrode 105 and into the region not covered with the side wall spacer 119a and the gate electrode 115a of the p-well 110, simultaneously. An n$^+$ diffused layer 121 is thus formed, and nMOS high-concentration impurity diffused layers 125a, 125b are formed by the thermal treatment.

Subsequently, after removing thin oxide layers on the respective surfaces of the active base region 112 not covered with the etching stopper layer 118, the base lead-out electrode 113, the collector lead-out electrode 114 and the source, the drain and the gate of the MOS type field effect transistor, the refractory metal such as Ti, Co, Ni etc is deposited by a sputtering method, and the thermal process is effected thereon, thereby providing the metal silicide 123 on the surfaces of the active base region 112 not covered with the etching stopper layer 118, the base polysilicon electrode 113, the collector lead-out electrode 14, the sources and drains 125a, 125b, 126a, 126b of the MOS type field effect transistor and the gate electrodes 115a, 115b. The refractory metal which does not yet react is removed by a mixed liquid of sulphuric acid/hydrogen peroxide.

Figure 35:
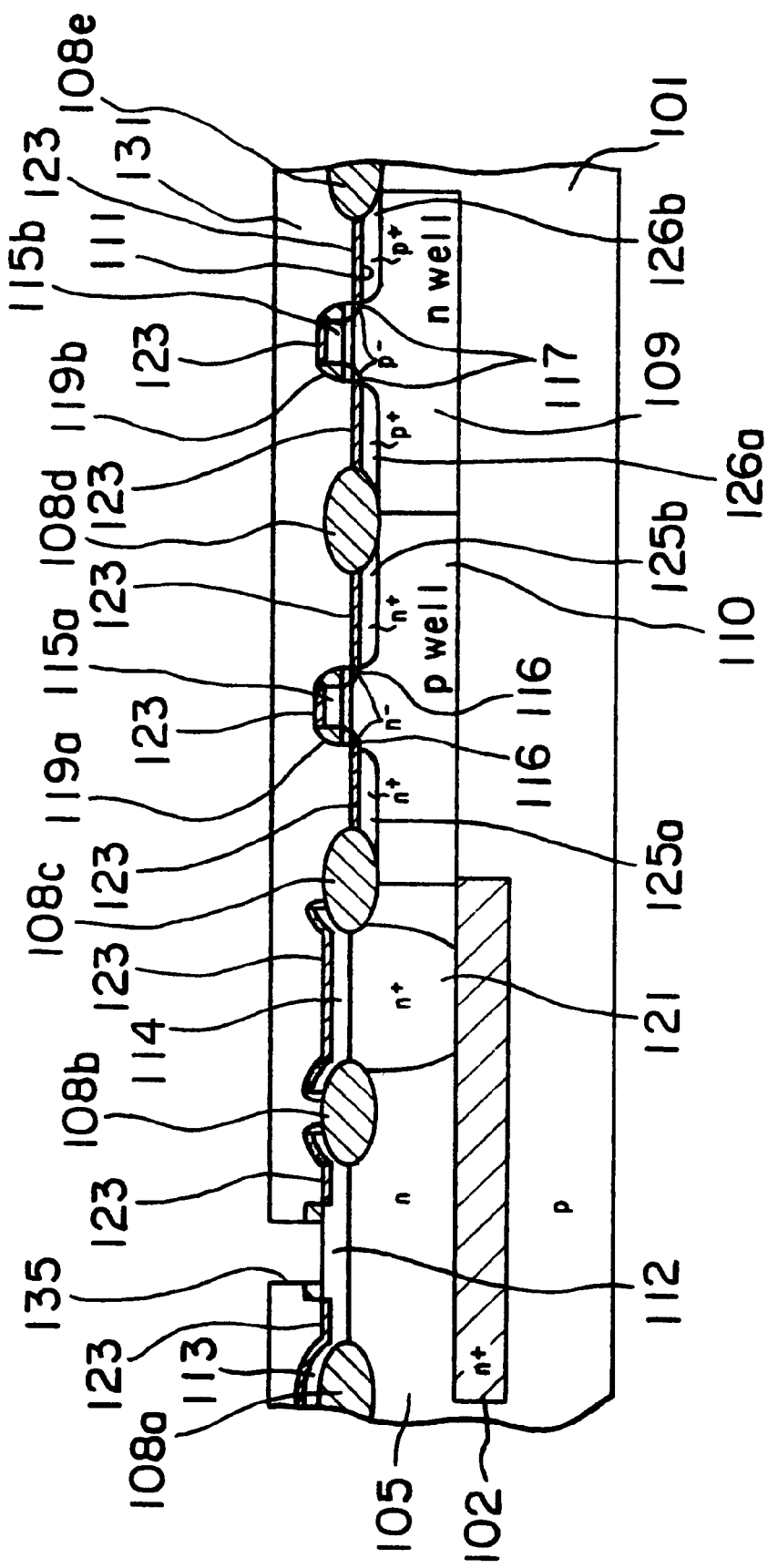
FIG. 35 is a partial sectional view showing a process step of the third process of the Bi-CMOS LSI according to the present invention.

Next, as shown in FIG. 35, an insulating layer 131 is deposited to have a predetermined thickness by the CVD method, and the predetermined lithography process is executed, thereby forming an emitter opening 135 enough to reach the active base region 112 in an area within the insulating layer 131 but in an area positioned above the etching stopper layer 118. When forming this emitter opening 135, it is desirable to take a method to which the active base region 112 serving as a base layer is not damaged, such as the wet-series etching and so on.

Figure 36:
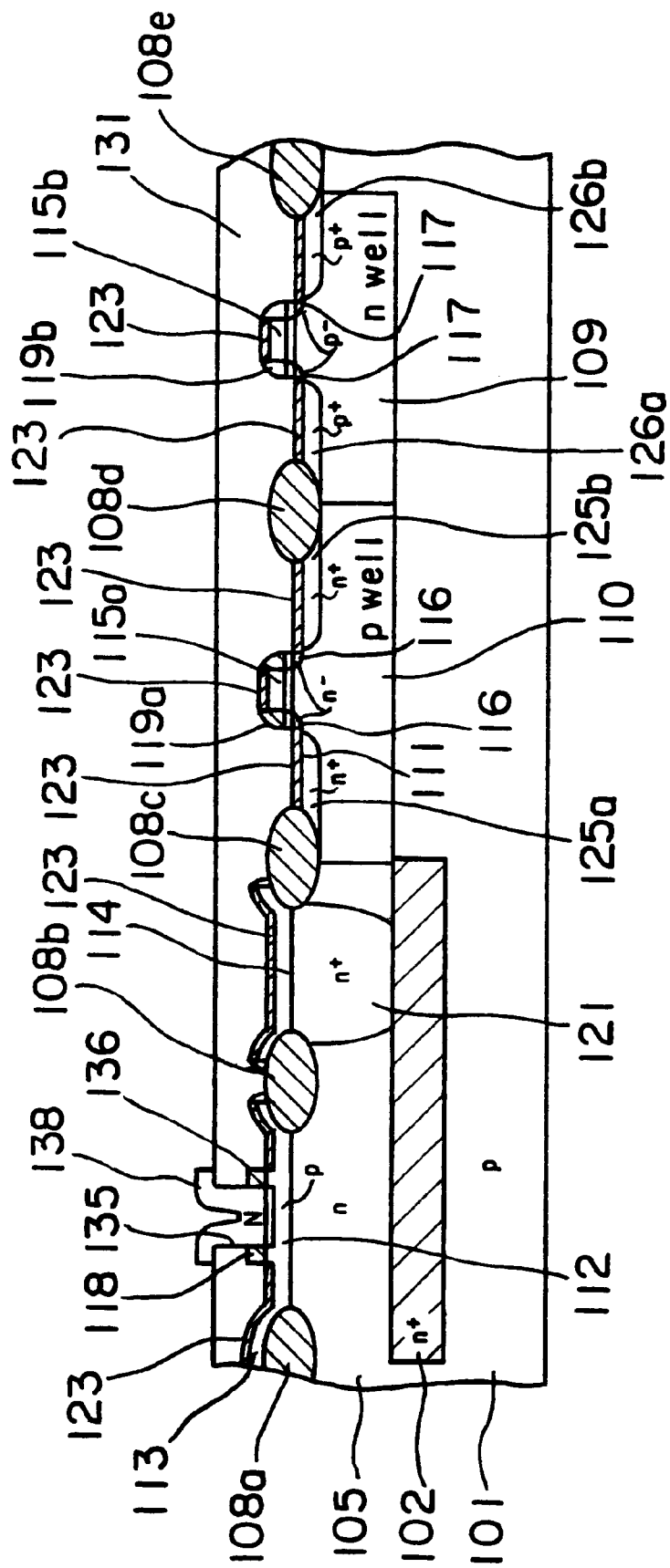
FIG. 36 is a partial sectional view showing a process step of the third process of the Bi-CMOS LSI according to the present invention.

Subsequently, as illustrated in FIG. 36, the polysilicon layer is deposited over the entire surface, thus filling the emitter opening 135. Then, after arsenic has been ion-implanted with a dose of $1.0 \times 10^{16}$ cm$^{-2}$ and an energy of 60 KeV, the arsenic is diffused out within the active base region 112 by executing the process of thermal treatment, thus providing an emitter region 136. Note that silicon doped with the arsenic may also be deposited as a polysilicon layer instead of ion-implanting the arsenic. Further, an n-type impurity such as phosphorus etc in place of the arsenic may also be used.

Thereafter, the polysilicon layer is processed in a predetermined configuration and thus serves as an emitter lead-out electrode 138.

Thereafter, as illustrated in FIG. 26, an inter-layer insulating layer 132 under a first-layer Al wiring layer is deposited by the CVD method, and, after the photo resist has been subjected to the predetermined patterning, a contact hole 169 to each of the electrodes of the MOS type field effect transistor and of the bipolar transistor is formed by isotropic etching. Subsequently, a native oxide layer formed on the bottom surface of each contact is removed by Ar reverse sputtering method, and thereafter a barrier metal such as Ti/TiN etc is deposited by the sputtering method. Further, a metal such as Al W etc is so deposited as to fill each contact by the sputtering method. Thereafter, the resist is subjected to the patterning in a predetermined shape, and a wire 75 is formed by selectively removing the wiring metal through the RIE, thus completing the Bi-CMOS LSI.

As discussed in detail, according to the manufacturing method of the semiconductor device in this embodiment, the four processes can be shared in the processes of manufacturing the bipolar transistor and the CMOS electric field effect type transistor.

To be specific, there are shared the process of forming the collector lead-out electrode and the base region of the bipolar transistor and the process of forming the gate electrode of the CMOS type field effect transistor. There are shared the respective ion implanting processes for adding the P-type impurity to the base region and for providing the pMOS high-concentration impurity diffused layer. Shared also the process of providing the emitter opening etching stopper layer and the process of providing the gate electrode side wall insulating layer. Shared further are the process of making he base polysilicon electrode and the collector lead-out electrode composed of silicide and the process of making the respective CMOS type field effect transistor electrodes composed of Silicide. This makes it feasible to remarkably reduce the number of manufacturing processes, and therefore the Bi-CMOS LSI exhibiting a higher performance than by the prior art can be manufactured at a low cost.

Next, fourth embodiment of the method of manufacturing the semiconductor device according to the present invention will be explained with reference to the drawings.

To begin with, as shown in FIGS. 27 to 31, the n+ buried layer 102, the single crystal silicon layer 105, the element isolation insulating layers 108a–108e, the gate oxide layer 111, the p-well 110 and the n-well 109 are provided by using the same method as that in the third embodiment.

Next, as shown in FIG. 32, the oxide layer on the first region formed with the bipolar transistor is removed by the HF series solution and thereafter the single crystal silicon which will become the active base region 112 and the collector lead-out electrode 114 is grown on the silicon substrate 101 by use of the non-selective epitaxial growth technique. The polysilicon which will serve as the base polysilicon electrode 113 is likewise grown on the element isolation oxide layer 108a, and the polysilicon which will become the gate electrodes 115a,115b is likewise grown on the gate oxide layer 111. Thereafter, the polysilicon is selectively removed by the RIE after patterning the photo resist, whereby the active base region 112, the base polysilicon electrode 113 and the collector lead-out electrode 114 are provided. Simultaneously, the gate electrodes 115a, 115b of the CMOS type field effect transistor are provided.

Figure 37:
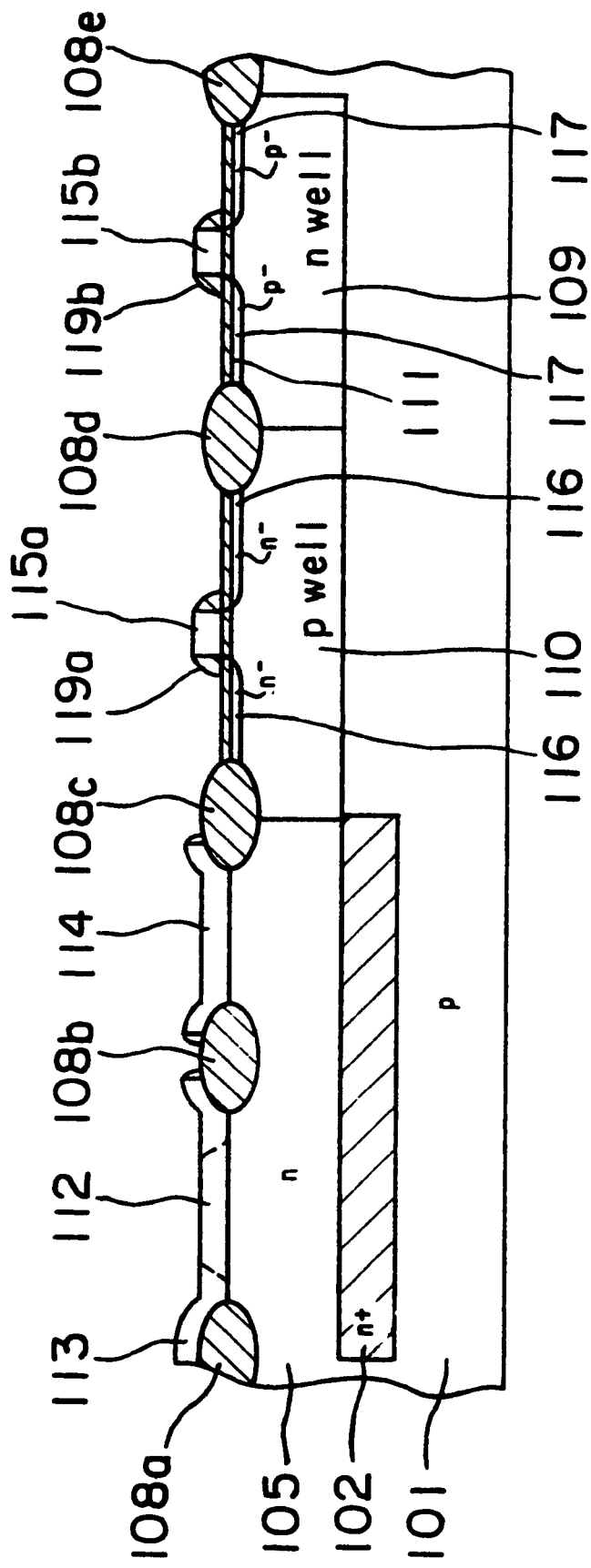
FIG. 37 is a partial sectional view showing a process step of a fourth process of the Bi-CMOS LSI according to the present invention.

Next, as shown in FIG. 37, the oxide layer is formed on the order of 100 Å on the substrate surface by the thermal oxidation. Thereafter, the resist is subjected to the patterning, and the impurity diffused region 116 for the nMOS and the impurity diffused region 117 for the pMOS are respectively formed as low-concentration diffused regions for the LDD by the ion implantation (a dose is $1.0\times10^{14}$ cm$^{-2}$, and an energy is 40 KeV) and by the thermal treatment. Thereafter, the insulating layer is deposited up to a predetermined thickness and side wall spacers 119a, 119b for the gate electrodes 115a, 115b of the MOS type field effect transistor are provided by the RIE and the resists patterning using the lithography.

Figure 38:
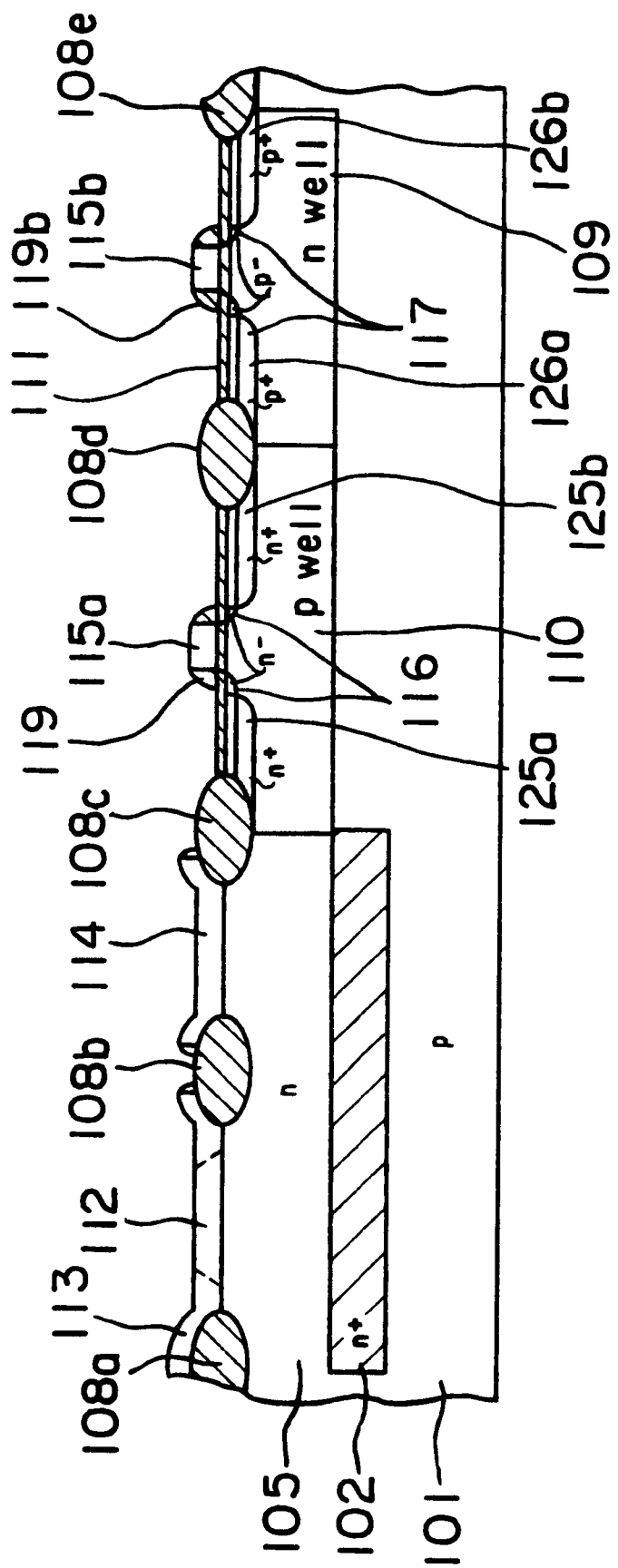
FIG. 38 is a partial sectional view showing a process step of the fourth process of the Bi-CMOS LSI according to the present invention.

Subsequently, as shown in FIG. 38, after effecting the patterning on the resist in a predetermined configuration, the p-type impurity is ion-implanted with a dose of $3.0\times10^{15}$ cm$^{-2}$ and an energy of 35 KeV, and pMOS high-concentration diffused layers 126a, 126b are provided by the subsequent thermal treatment process. Moreover, nMOS high-concentration diffused layers 125a, 125b are formed by implementing the predetermined patterning upon the resist, the ion-implantation and the thermal treatment.

Figure 39:
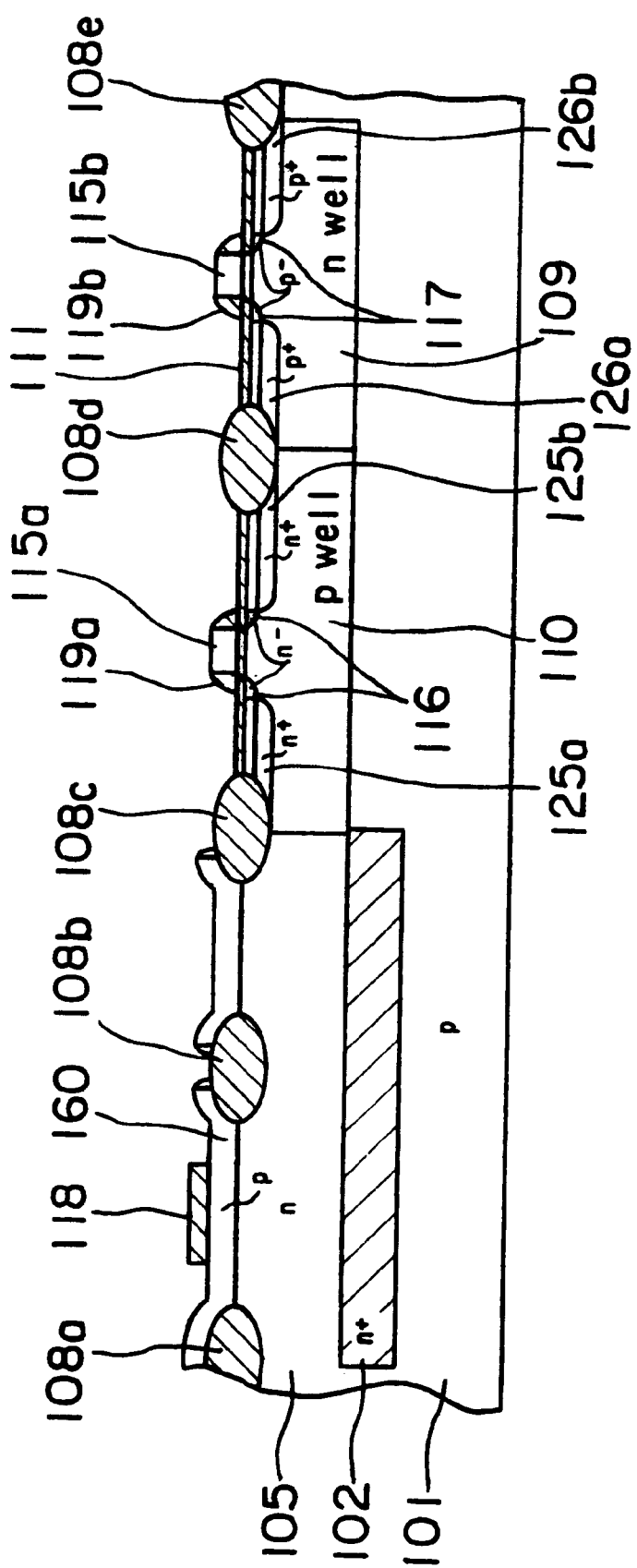
FIG. 39 is a partial sectional view showing a process step of the fourth process of the Bi-CMOS LSI according to the present invention.

Next, as illustrated in FIG. 39, the insulating layer is deposited to a predetermined thickness, and there is formed the etching stopper layer 118 for preventing the etching damage to the active base region 112 when forming the emitter opening by the RIE and the resist patterning based on the lithography.

Figure 40:
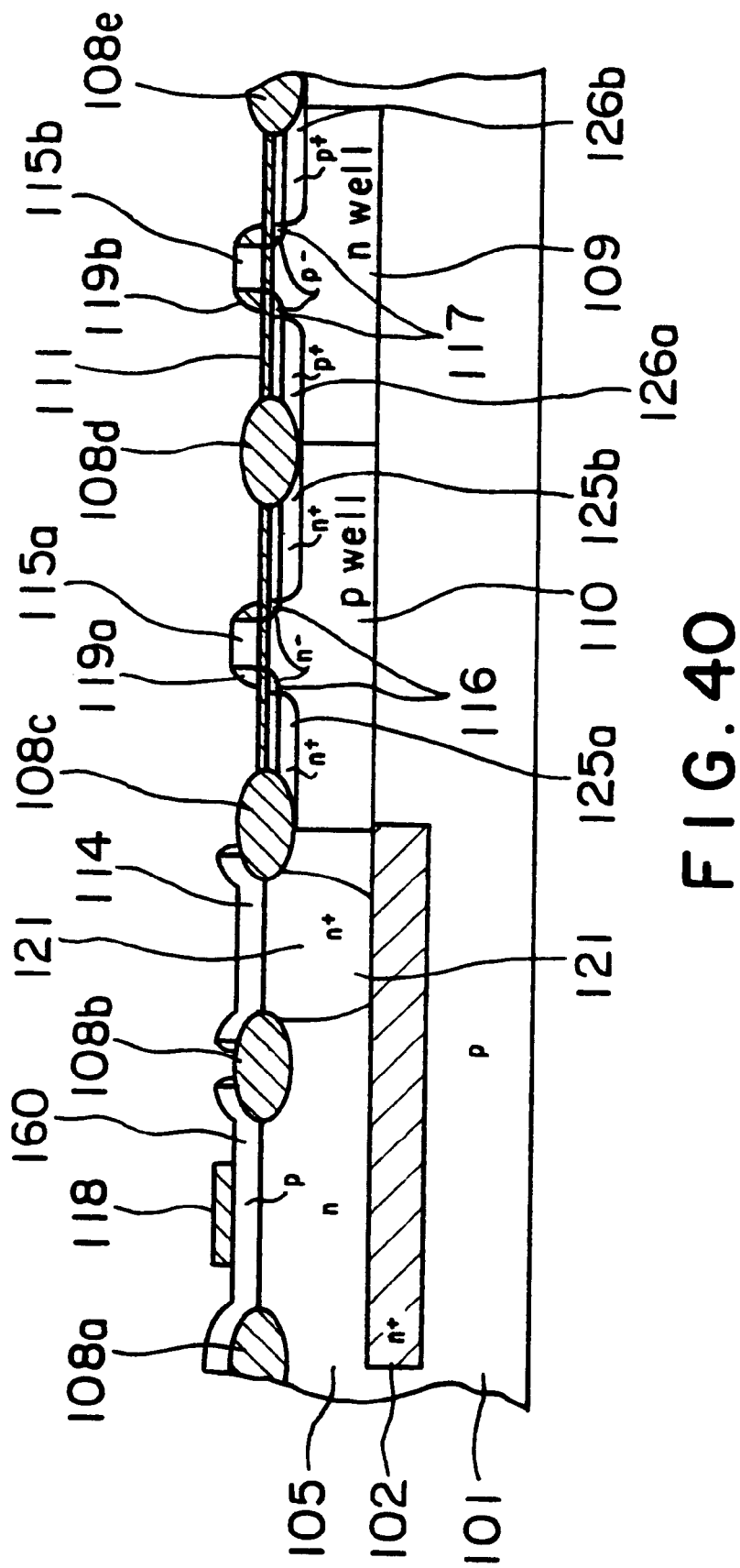
FIG. 40 is a partial sectional view showing a process step of the fourth process of the Bi-CMOS LSI according to the present invention.

Next, as shown in FIG. 40, after the resist has been subjected to the patterning in a predetermined configuration, the p-type impurity is ion-implanted with a dose of $3.0\times10^{15}$ cm$^{-2}$ and an energy of 35 KeV, thus adding the p-type impurity into a base region 160. Further, an n+ diffused layer 121 serving as a collector lead-out region is formed by the ion-implantation ad the predetermined resist patterning.

Thereafter, by use of the same method as that in the first embodiment, the metal silicide 123 (see FIG. 31) is formed over the surfaces of the active base region 112 excluding the region covered with the etching stopper layer 118, the base polysilicon electrode 113, the collector lead-out electrode 114, the sources and drains 125a, 125b, 126a, 126b of the MOS type field effect transistor, and the gate electrodes 115a, 115b, and the insulating layer 131 is deposited over the entire surface thereof. Thereafter, the emitter opening 135 extending to the active base region 112 is formed in the region within the insulating layer 131 but in the area positioned above the etching stopper layer 118 (see FIG. 35), and subsequently the emitter opening is filled with the polysilicon layer deposited thereon. Then, the arsenic is diffused out within the active base region 112 by the ion implantation and the thermal treatment, thereby providing an emitter region 136 (see FIG. 36). Then, the polysilicon layer is processed in a predetermined shape, thus providing an emitter lead-out electrode 138. Thereafter, the inter-layer insulating layer 132 is deposited by the CVD method, and a contact hole 169 to each electrode is formed by the predetermined photo resist patterning and the isotropic etching. After removing the native oxide layer on the bottom surface of each contact by the AR reverse sputtering method, the barrier metal such as Ti/TiN etc is deposited by the sputtering method, and further the metal such as Al, W etc is so deposited as to fill each contact by the sputtering method. Thereafter, the resist is subjected to the patterning in a predetermined shape, and a wire 175 is provided by selectively removing the above wiring metal through the RIE, thus completing the Bi-CMOS LSI (see FIG. 26).

In accordance with this embodiment, although the number of processes is larger than in the first embodiment, there is provided the high performance semiconductor device exhibiting the same effects as those of the Bi-CMOS LSI (see FIG. 26) in the first embodiment discussed above.

Next, a fifth embodiment of the method of manufacturing the semiconductor device according to the present invention will be discussed with reference to the drawings.

A characteristic point of the fifth embodiment is that the process of forming the active base region 12, the base polysilicon electrode 13 and the collector lead-out electrode 14 and the process of forming the gate electrode 15 are not completely shared, but some of these components are solely formed, and the thickness of the gate electrode is increased.

To start with, as shown in FIGS. 27–31, the n+ buried layer 102, the single crystal silicon layer 105, the element isolation insulting layers 108a–108e, the gate oxide layer 111, the p-well 110 and the n-well 109 are provided by using the same method as that in the first embodiment discussed above.

Figure 41:
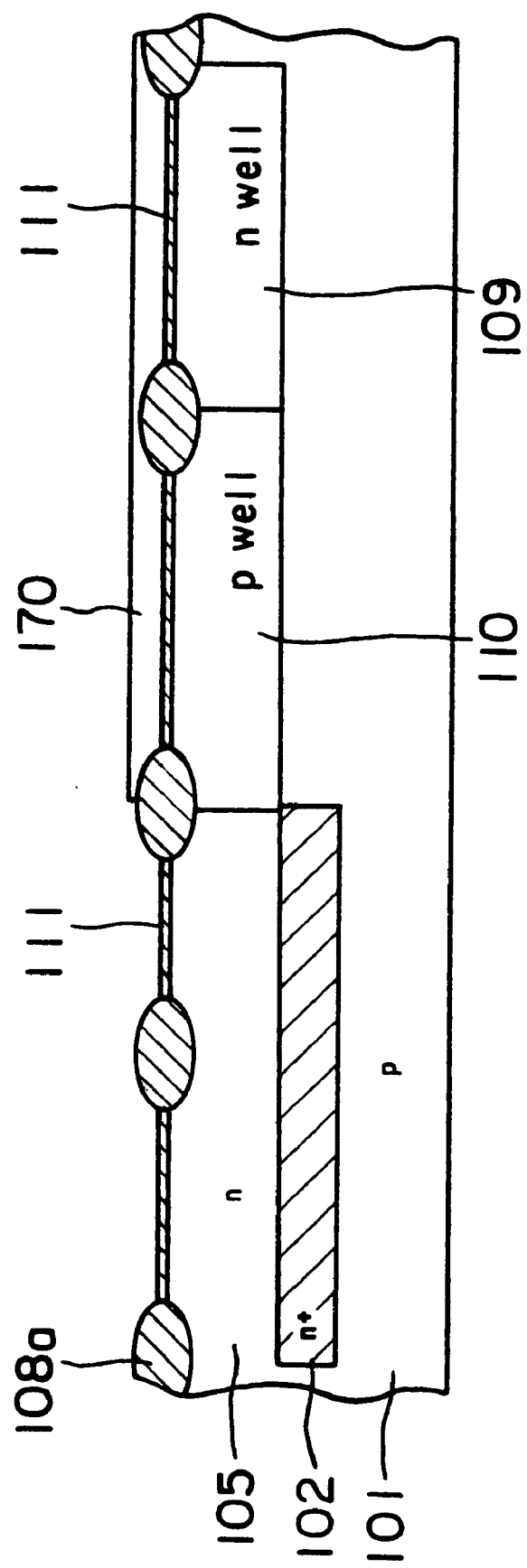
FIG. 41 is a partial sectional view showing a process step of a fifth process of the Bi-CMOS LSI according to the present invention.

Next, as shown in FIG. 41, polysilicon 170 is deposited on the order of 2000 Å on the gate oxide layer 111, and there are executed the resist patterning based on the lithography and the patterning in a predetermined shape using the RIE.

Subsequently, as shown in FIG. 42, after the oxide layer on the first region formed with the bipolar transistor has been removed by the HP series solution, silicon is gown over the entire surface by the non-selective epitaxial growth technique, whereby the single crystal silicon which will become the active base region 112 and the collector lead-out electrode 114 is grown on the single crystal silicon layer 105. Then, the polysilicon which still become the base polysilicon electrode 113 is likewise grown on the element isolation oxide layer 108a, and simultaneously the polysilicon is further grown on the polysilicon 170 in MOS type field effect transistor forming regions defined as second and third regions.

Thereafter, the photo resist is subjected to the patterning in a predetermined shape, and the polysilicon is processed by etching such as the RIE, thereby providing the active base region 112, the base polysilicon electrode 113 and the collector lead-out electrode 114 as well as providing gate electrodes 115a', 115b' at the same time.

Thereafter, the nMOS and pMOS low-concentration impurity diffused regions 116, 117 are formed by the same method as that in the first or second embodiment. Subsequently, there are etching such as the RIE, thereby providing the active base region 112, the base polysilicon electrode 113 and the collector lead-out electrode 114 as well as providing gate electrodes 115a', 115b' at the same time.

Thereafter, the nMOS and pMOS low-concentration impurity diffused regions 116, 117 are formed by the same method as that in the first or second embodiment. Subsequently, there are simultaneously provided the emitter opening etching stopper layer 118 find side wall spacers 119a, 119b for the gate electrodes 115a', 115b' of the MOS type field effect transistor (see FIG. 33). Next, the active base region 112 not covered with the etching stopper layer 118 and the high-concentration diffused layers 126a, 126b, are activated by ion-implantation of the p-type impurity and by the thermal treatment. Then, the nMOS high-concentration diffused layers 125a, 125b and the n+ diffused layer 121 which will become the collector lead-out region are activated by the ion-implantation of the n-type impurity and by the thermal treatment. After through this activation, the metal silicide 123 (see FIG. 34) is formed over the surfaces of the active base region 112 excluding the region covered with the etching stopper layer 118, the base polysilicon electrode 113, the collector lead-out electrode 114, the sources and drains 125a, 125b, 126a and 126b of the MOS type field effect transistor, and the gate electrodes 115a, 115b, and the insulating layer 131 is deposited over the entire surface thereof. Thereafter, the emitter opening 135 is formed to reach the active base region 112 in the region within the insulating layer 131 but in the area positioned above the etching stopper layer 118 (see FIG. 35), and subsequently the emitter opening 135 is filled with the polysilicon layer deposited thereon. Then, the arsenic is diffused out within the active base region 112 by the ion implantation and the thermal treatment, thereby providing the emitter region 136 (see FIG. 36). Then, the polysilicon layer is processed in a predetermined shape, thus providing the emitter lead-out electrode 138. Thereafter, the inter-layer insulating layer 132 is deposited by the CVD method, and the contact hole 169 to each electrode is formed by the predetermined photo resist patterning and the anisotropic etching. the Bi-CMOS LSI.

According to the manufacturing method in this embodiment, the thickness of the gate electrode polysilicon can be made larger than in the first embodiment. With this contrivance, it is possible to reduce the gate resistance and form the metal silicide with a stability on the electrode.

As discussed above in detail, the Bi-CMOS LSI according to the present invention exhibits the following effects.

Namely, since the base polysilicon lead-out electrode which has hitherto been used becomes unnecessary, the emitter opening can be shallowed. Further, the side wall spacer is not provided, and hence the thickness of the etching stopper layer can be reduced so much for that, with the result that the emitter opening can be further shallowed. The emitter aspect ration can be thereby remarkably decreased, and it is therefore feasible to reduce the emitter resistance value and to restrain the emitter plug effect. Moreover, there is no side wall spacer, and the base/collector capacity value with respect to the emitter areal size can be reduced so much for that.

Further, a part of the base region of the bipolar transistor, and the source and the drain of the second MIS transistor are composed of substantially, the same impurity with the same diffusion concentration. Moreover the gates of the first and second MIS transistors are composed of substantially the same material in the same layer thickness as those of the base region of the bipolar transistor. Furthermore, the side surface thereof is provided with the side wall composed of the same material as that of the etching stopper layer, and the manufacturing costs can be thereby decreased.

As a result of what has been described so far, it is possible to provide the Bi-CMOS LSI at the low cost which includes the bipolar transistor exhibiting, the enhanced high frequency characteristics such as fmax, Ga etc and also the enhanced noise characteristic such as Nf etc.

Further, according to the manufacturing method of the semiconductor device of the present invention, there are shared the process of forming the collector lead-out electrode and the base region of the bipolar transistor and the process of forming the gate electrode of the CMOS type field effect transistor. There are shared the respective ion implanting processes for adding the P-type impurity to the base region and for providing the pMOS high-concentration impurity diffused layer. Shared also the process of providing the emitter opening etching stopper layer and the process of providing the gate electrode side wall insulating layer. Shared further are the process of making the base polysilicon electrode and the collector lead-out electrode composed of silicide and the process of making the respective CMOS type field effect transistor electrodes composed of Silicide. This makes it feasible to manufacture the Bi-CMOS LSI including the bipolar transistor exhibiting the above effects.

Moreover, the metal silicide can be formed with the stability with respect to not only the collector lead-out electrode and the base polysilicon electrode of the bipolar transistor but also the electrodes of the CMOS type field effect transistor, and consequently the manufacturing yield can be improved.

Note that the present invention is not limited to the embodiments discussed above and can be modified in a variety of forms without deviating from the gist and the scope of the invention. The embodiments discussed above have dealt with the npn-type bipolar transistor using the base epitaxial technique. For others, the present invention can be, however, applied to the bipolar transistor in which the base is formed by the technique such at the ion implantation and the impurity diffusion. Further, the present invention can be similarly, as a matter of course, applied to a pnp-type bipolar transistor. Moreover, the conditions such as the materials and thickness of the respective components can be properly changed corresponding to the specifications.

Figure 44:
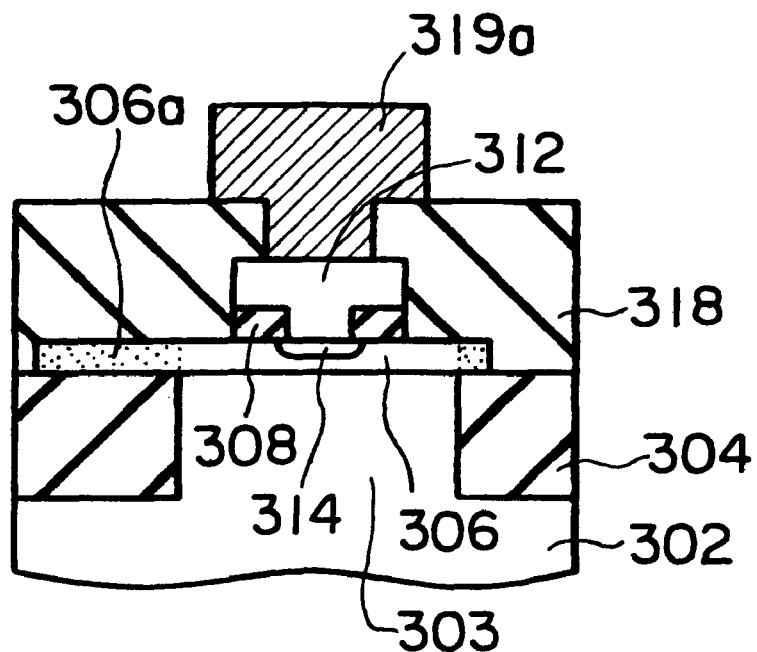
FIG. 44 is a sectional view showing a structure of a semiconductor device according to the fourth embodiment of the present invention.

FIG. 44 shows a construction of a fourth embodiment of the semiconductor device according to the present invention. The semiconductor device in the fourth embodiment is a bipolar transistor, wherein a silicon substrate (of e.g., n-type) 302 is provided with a device region 303 which is device isolated by a trench element isolation insulating layer 304. Provided on this device region 303 is a base layer 306 composed first conductivity can be properly changed corresponding to the specifications.

FIG. 44 shows a construction of a fourth embodiment of the semiconductor device according to the present invention. The semiconductor device in the fourth embodiment is a bipolar transistor, wherein a silicon substrate (of e.g., n-type) 302 is provided with a device region 303 which is device isolated by a trench element isolation insulating layer 304. Provided on this device region 303 is a base layer 306 composed first conductivity type (e.g., p-type) single crystal silicon and on the element isolation insulating layer 304 is the base layer 306 composed of first conductivity type polysilicon 306a.

A second conductivity type (e.g., n-type) emitter region 314 is provided on the surface area of the region, composed of the single crystal silicon, of this base layer 306. Then, on this emitter region 314, an insulating layer 308 composed of a single layer having in emitter opening is a single crystal silicon region of the base layer 306. Further, an emitter electrode 312 formed of the polysilicon doped with the second conductivity type impurity, which is electrically connected to the emitter region 314, is so provided as to fill the emitter opening described above. Note that an external edge of the insulating layer 308 is, it is structured, matched with an external edge of the emitter electrode 312.

The emitter electrode 312 and the base layer 306 are covered with the inter-layer insulating layer 318. Then, this inter-layer insulating layer 318 is formed with openings as contact holes for coming into contact with the emitter electrode 312 and the base layer 306, and a metal electrode 319a composed of a metal is so provided as to fill these contact holes. Note that FIG. 44 does not show the contact hole with the base layer 306 and the metal electrode. Further, referring again to FIG. 44, though not illustrated, in an area excluding the base forming region shown in FIG. 44 as in the case of the prior art bipolar transistor, an external collector lead-out region is defined, and a collector epitaxial layer and a collector lead-out metal electrode are provided.

Figure 13:
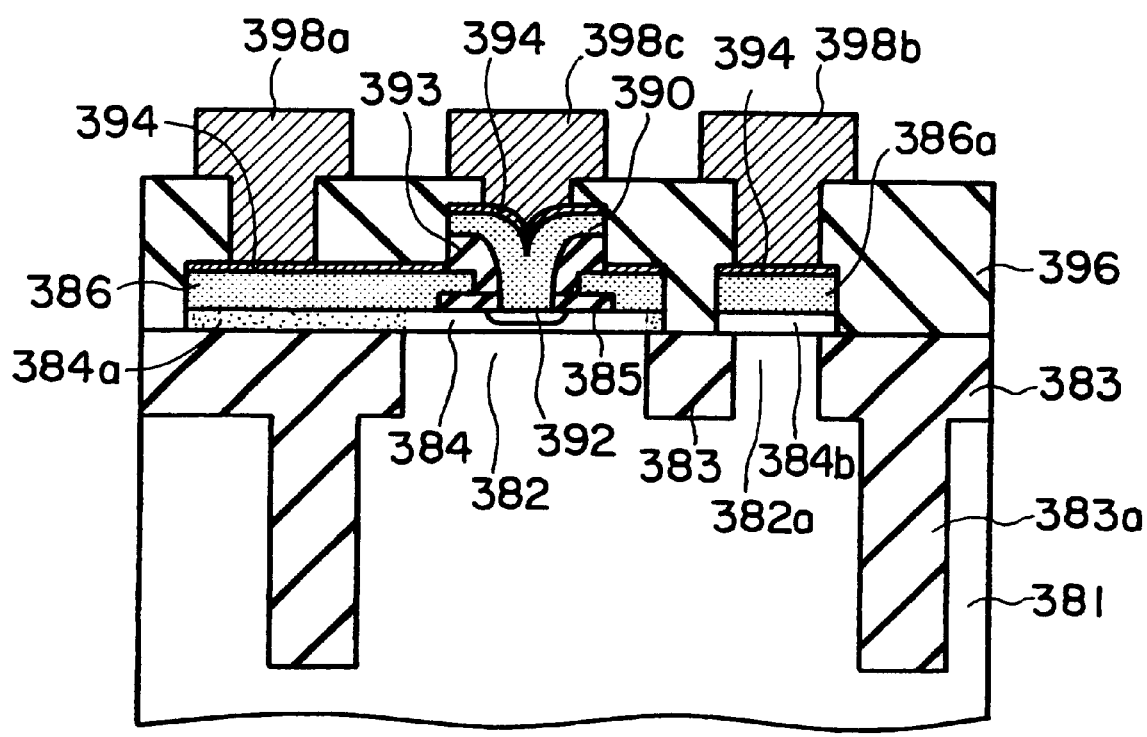
FIG. 13 is a sectional view showing a device structure of a bipolar transistor according to the prior art.
Figure 14A:
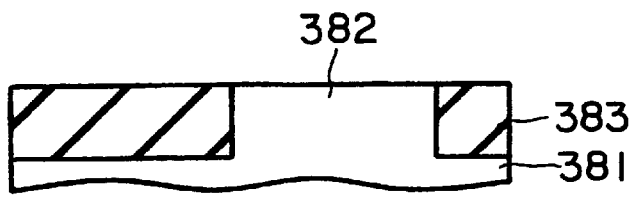
FIGS. 14A–14I are sectional views each showing process steps of manufacturing a bipolar transistor according to the prior art.
Figure 14B:
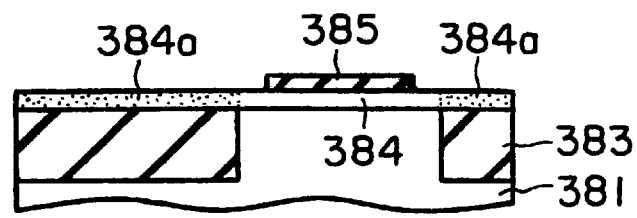
Figure 14C:
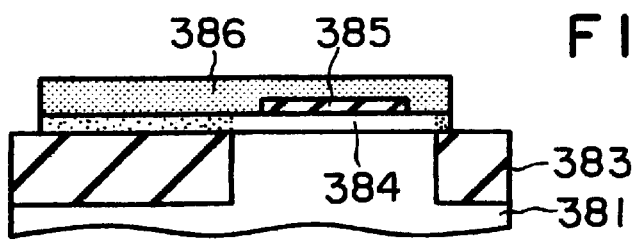
Figure 14D:
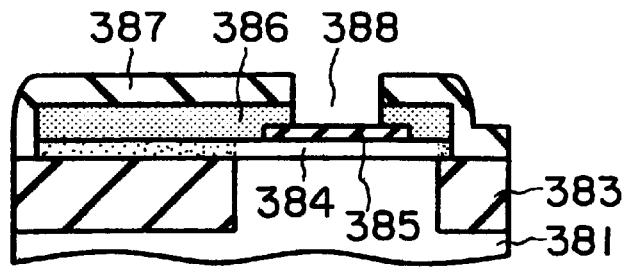
Figure 14E:
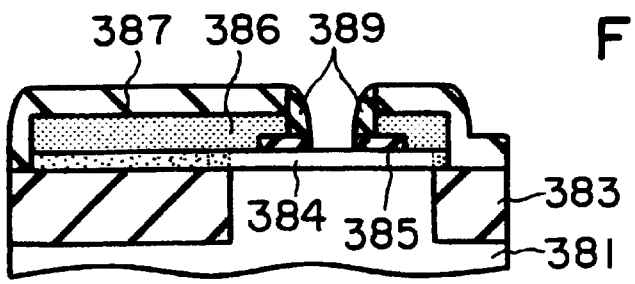
Figure 14F:
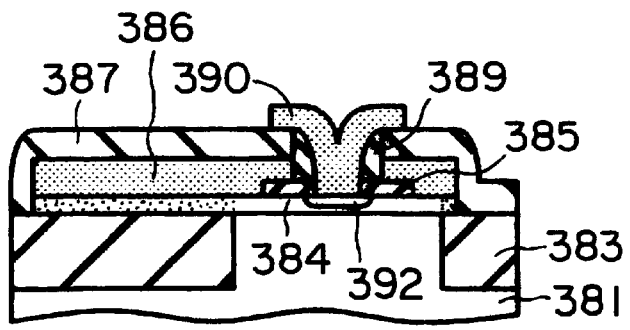
Figure 14G:
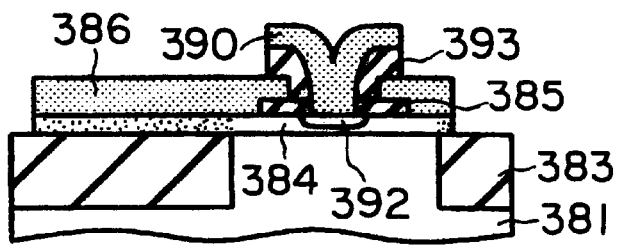
Figure 14H:
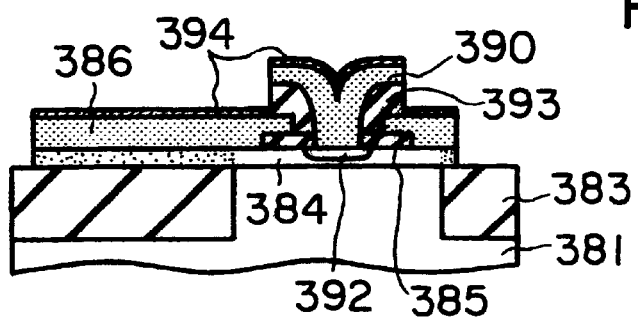
Figure 14I:
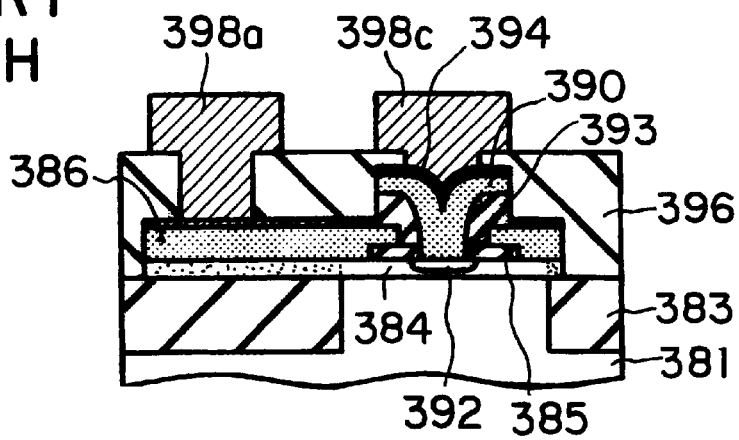
Figure 15:
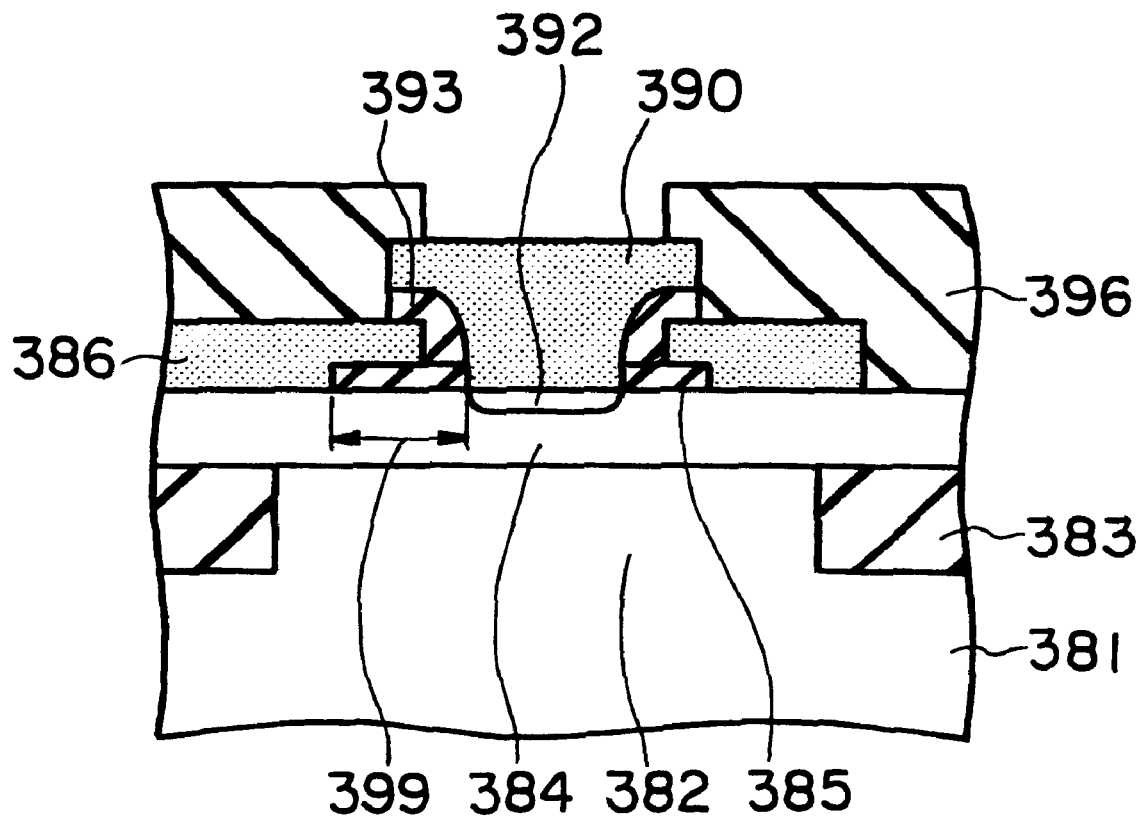
FIG. 15 is an explanatory diagram showing problems of the prior art bipolar transistors.

Incidentally, in the fourth embodiment, for reducing a resistance of the base layer 306, an impurity concentration of the Namely, there become unnecessary the etching stopper layer 385 (see FIG. 13), the oxide layer 385 (see FIGS. 14A–14I) and the spacer layer 393 (see FIG. 13) within the emitter opening which have hither been required in the bipolar transistor, and the high-resistance region of the base layer 306 under the insulating layer 308 can be made smaller than in the case of the prior art. The base resistance can be thereby decreased, and hence it is feasible to attain a more speed-up and less consumption of the electric power than in the prior art as well as to enhance a noise characteristic.

Further, as described above, because of providing neither the etching stopper layer 385 nor the oxide layer 387, even in the case of the bipolar transistor being constructed into the hyperfine structure, the aspect ratio of the opening on the emitter region can be made smaller than in the prior art. This makes it possible to prevent the current gain from changing due to a variation in the emitter width as much as possible.

Figure 45:
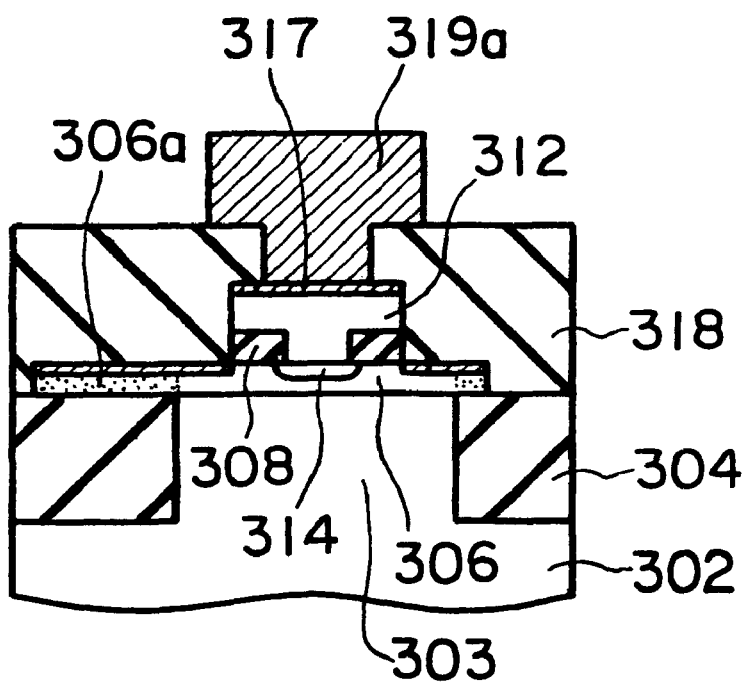
FIG. 45 is a sectional view showing a structure of a semiconductor device according to the fifth embodiment of the present invention.

Next, a construction of a fifth embodiment of the semiconductor device of the present invention is shown in FIG. 45. The semiconductor device in the fifth embodiment is a bipolar transistor constructed such that a refractory metal silicide layer 317 is provided on the surface of the emitter electrode 312 as well as on the surface, in an area exclusive of the region under the emitter electrode 312, of the base layer 306 in the bipolar transistor in accordance with the fourth embodiment shown in FIG. 44.

Therefore, in the bipolar transistor in the fifth embodiment, it is feasible to attain the smaller base resistance and emitter resistance, the more speed-up and the less consumption of the electric power and more enhanced noise characteristic than in the bipolar transistor in the fourth embodiment. It is to be noted that the current gain can be prevented from changing due to the variation in the emitter width as much as possible.

Figure 46:
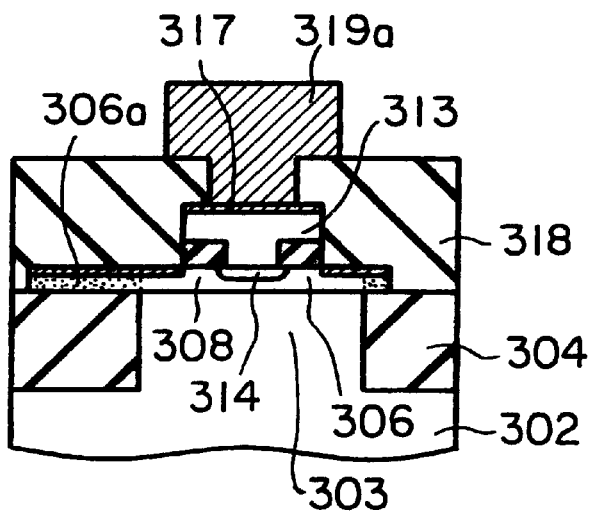
FIG. 46 is a sectional view showing a structure of a semiconductor device according to the sixth embodiment of the present invention.

Next, FIG. 46 shows a construction of a sixth embodiment of the semiconductor device according to the present invention. The semiconductor device in the sixth embodiment is a bipolar transistor constructed such that the emitter electrode 312 composed of the polysilicon is replaced with an emitter electrode 313 composed of single crystal silicon in the bipolar transistor in the fifth embodiment shown in FIG. 45. The single crystal silicon is smaller in its resistance value than the polysilicon, and hence in the third embodiment it is possible to attain the smaller emitter resistance, the more speed-up and the less consumption of the electric power and the more enhancement of the noise characteristic than in the second embodiment. Note that it is also feasible to prevent the current gain from changing due to the variation in the emitter width to the greatest possible degree.

Figure 47A:
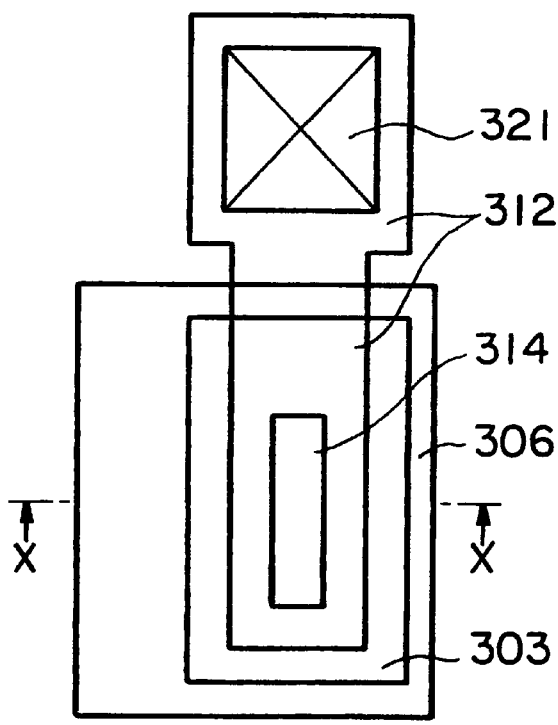
FIG. 47A is a plan view showing a structure of a semiconductor device according to the seventh embodiment of the present invention.
Figure 47B:
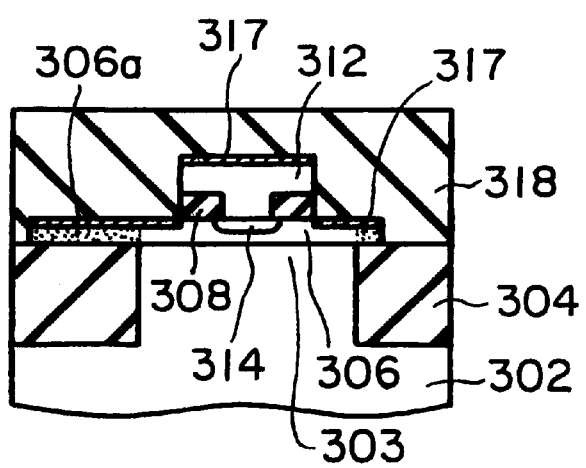
FIG. 47B is a sectional view showing a structure of a semiconductor device according to the seventh embodiment of the present invention.

Next, a seventh embodiment of the semiconductor device according to the present invention is discussed with reference to FIGS. 47A and 47B.

The semiconductor device in the seventh embodiment is a bipolar transistor. FIG. 47A is a top view thereof. FIG. 47B is a sectional view thereof taken along the cut line X—X. The bipolar transistor in the seventh embodiment is constructed such that contacts 321 with the emitter electrode 312 and a metal wire 319a are formed outwardly of the base layer 306 in the bipolar transistor in the second embodiment shown in FIG. 45. Therefore, the width dimension of the emitter electrode 312 can be made smaller than in the second embodiment, and the structure thereof is suitable for its scaling.

Note that the seventh embodiment exhibits the same effects as those in the fifth embodiment.

A sixth manufacturing method of the semiconductor device of the present invention is explained with reference to FIGS. 48A–48G. This method is a manufacturing method of manufacturing the bipolar transistor in the fifth embodiment shown in FIG. 45. FIGS. 48A–48G each showing a step of the manufacturing method.

Figure 48A:
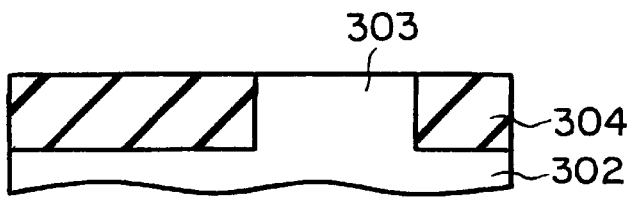
FIGS. 48A–48G are sectional views showing the sixth process of the semiconductor device according to the present invention.
Figure 48B:
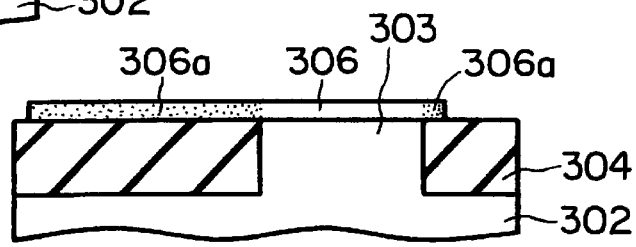

To begin with, as illustrated in FIG. 48A, a trench is formed in the silicon substrate 302 and is embedded with the insulating layer 304 in order to effect an elementisolation, thus providing the device region 303. Next, the base layer 306 is provided by performing the epitaxial growth while implanting the first conductivity type (e.g., the n-type) impurity (see FIG. 48B). At this time, the single crystal silicon is grown on the device region 303, and the polysilicon is grown on the element isolation region 304. Accordingly, the base layer 306 is composed of the single crystal silicon layer on the device region 303 and composed of the polysilicon layer 306a on the element isolation region 304 (see FIG. 48B). Thereafter, the base layer 306 is subjected to the patterning by executing the anisotropic etching, thereby obtaining a proper size (see FIG. 48B).

Figure 48C:
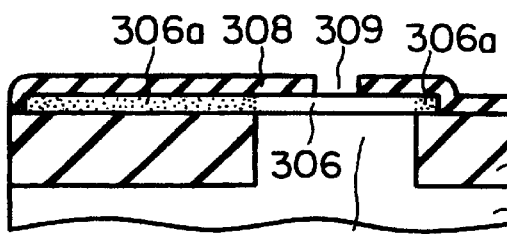
Figure 48D:
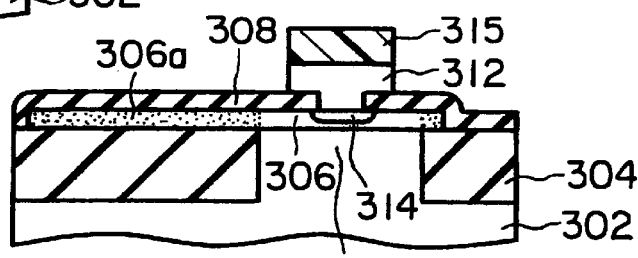

Next, an insulating layer 308 formed of, e.g., $SiO_2$ is deposited over the whole surface of the substrate, after which the emitter opening 309 is formed on an emitter formation predetermined region by use of the photo lithography technique and the anisotropic etching (see FIG. 48C).

Next, the polysilicon layer is so deposited over the entire surface of the substrate as to fill the opening 309, and thereafter the second conductivity type (e.g., n-type) is ion-implanted into the polysilicon layer. Subsequently, the impurity is diffused out within the base layer 306 from the polysilicon layer by conducting the thermal treatment (see FIG. 48D). Thereafter, the photo resist is coated over the polysilicon layer, and a resist pattern 315 is formed by executing exposure and developing processes. Then, with this resist pattern 315 serving as a mask, the polysilicon layer is subjected to the patterning by effecting the isotropic etching thereby providing the emitter electrode 312 (see FIG. 48D).

Figure 48E:
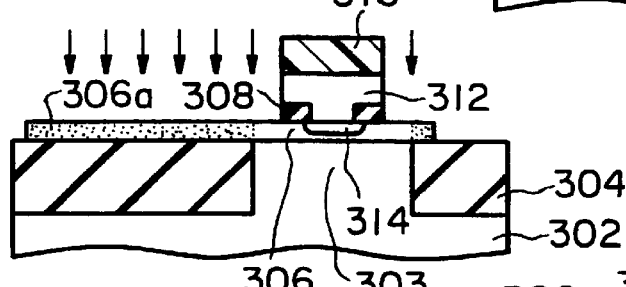

Next, the surface of the base layer 306 is exposed, which involves removing the insulating layer 308 by conducting the anisotropic etching with the resist pattern 315 serving as the mask (see FIG. 48E). Subsequently, with the resist patter 315 used as the mask, the first conductivity type impurity is ion-implanted into the base layer 306, thus reducing a resistance of the base layer 306 (see FIG. 48E).

Next, after removing the resist pattern 315, a layer composed of the refractory metal (e.g., Ti) is provided over the entire surface of the substrate by the sputtering method, and, with the thermal treatment executed, the refractory metal layer on the surfaces of the base layer 306 and of the emitter electrode 312 is changed into a refractory metal silicide layer. Then, a refractory metal silicide layer 317 is provided on only the surfaces of the base layer 306 and of the emitter electrode 312 by removing the non-reacted refractory metal (see FIG. 48F).

Figure 48F:
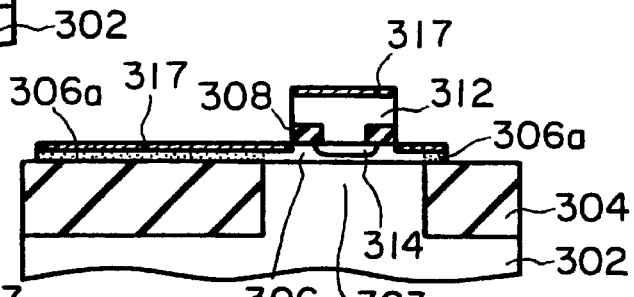
Figure 48G:
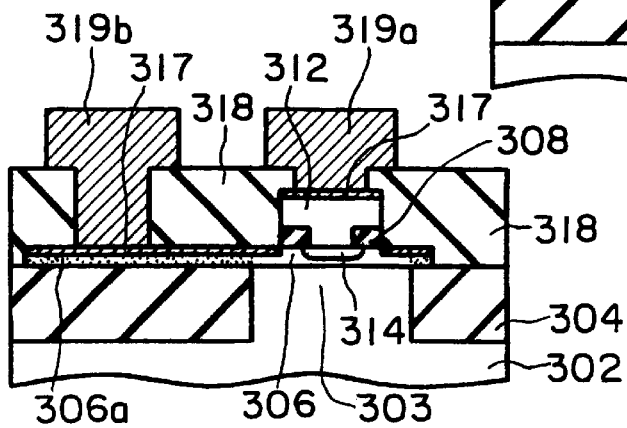

Next, the inter-layer insulating layer 318 is deposited over the whole surface of the substrate, and the inter-layer insulating layer 318 is formed with the openings as contact holes for coming into contact with the base layer 306 and the emitter electrode 312 by use of the lithography technique (see FIG. 48G). Then, the metal layer is deposited to fill the contact holes and is then subjected to the patterning to thereby provide metal electrodes 319a, 319b, thus completing the bipolar transistor (see FIG. 48G).

The bipolar transistor manufactured by the manufacturing method in the sixth embodiment has the same configuration as that of the bipolar transistor in the fifth embodiment, and therefore exhibits the same effects as those in the fifth embodiment.

Further, the sixth manufacturing method does not require the step of providing the etching stopper layer 385, the step of depositing the oxide layer 387, the step of providing the spacer layer 393 and the step of providing the base lead-out electrode 386 which are all needed in the conventional manufacturing method shown in FIGS. 14A–14I, and hence it is feasible to remarkably reduce the number of steps as compared with the prior art manufacturing method.

Moreover, according to the sixth manufacturing method, if the step of providing the refractory metal silicide layer is omitted, the bipolar transistor in the fourth embodiment shown in FIG. 44 can be obtained.

Next, a seventh manufacturing method of the semiconductor device according to the present invention is explained referring to FIGS. 49A–49G. The seventh embodiment deals with the method of manufacturing the bipolar transistor. FIGS. 49A–49G are sectional views showing the manufacturing steps thereof. According, to the seventh manufacturing method, the steps till the insulating layer 308 is formed with the emitter opening 309 are the same as those of the sixth manufacturing method shown in FIGS. 48A–48C (see FIGS. 49A–49C).

Next, the polysilicon is selectively grown from the emitter opening 309 while implanting the impurity of the conductivity (the second conductivity tape) different from that of the base layer 306, thus providing the emitter electrode 312 (see FIG. 49D). A widthwise dimension of the emitter electrode 312 can be easily controlled by adjusting a layer thickness of the polysilicon.

Subsequently, the impurity is diffused from the emitter electrode into the surface region of the base layer 306 by effecting the thermal treatment, thereby providing the emitter region 314 (see FIG. 49D).

Next, with the emitter electrode 312 serving as the mask, the insulating layer 308 is removed by the anisotropic etching, thus making the surface of the base layer 306 exposed (see FIG. 49E). Subsequently, the first conductivity type impurity is implanted into the base layer, thus reducing the resistance thereof (see FIG. 49E).

Thereafter, the bipolar transistor is completed by executing the same steps as those of the sixth manufacturing method shown in FIGS. 48F and 48G (see FIGS. 49F, 49G).

The bipolar transistor manufacture by the seventh manufacturing method has the same configuration as that of the bipolar transistor in the fifth embodiment shown in FIG. 45, and therefore exhibits the same effects as those of the bipolar transistor.

The seventh manufacturing method does not require forming the resist pattern 315 for patterning the emitter electrode 312 and is therefore capable of further decreasing the number of steps as compared with the sixth manufacturing method.

Next, an eighth manufacturing method of the present invention is described referring to FIGS. 50A–50G. The eighth method is a method of manufacturing the bipolar transistor. FIGS. 50A–50G are sectional views showing the steps of this manufacturing method.

Figure 50A:
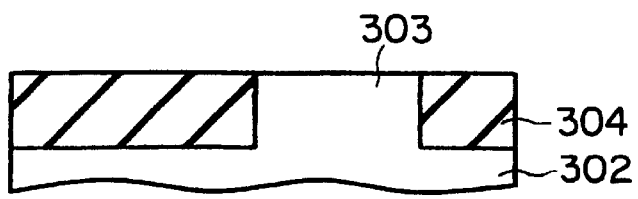
FIGS. 50A–50G are sectional views showing the eighth process of the semiconductor device according to the present invention.

To start with, as shown in FIG. 50A, a trench is formed in the silicon substrate 302 and is embedded with the insulating layer 304 to thereby effect the element isolation, thus providing the device region 303.

Figure 50B:
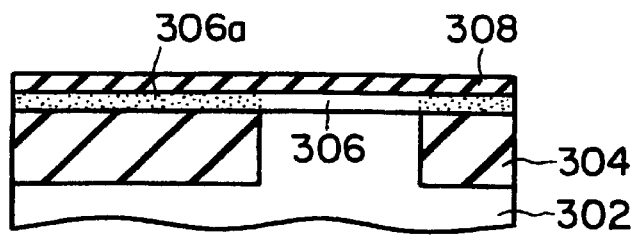

Next, the base layer 306 is provided by conducting the epitaxial growth while implanting the first conductivity type (e.g., p-type) impurity (see FIG. 50B). At this time, the single crystal silicon is grown on the device region 303, while the polysilicon 306a is grown on the element isolation region 304. Subsequently, the insulating layer 308 composed of, e.g., $SiO_2$ is deposited over the entire surface of the substrate (see FIG. 50B).

Figure 50C:
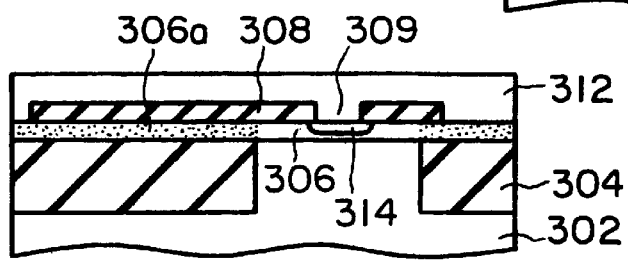

Next, the insulating layer 308 is subjected to the patterning by performing the photo lithography technique and the anisotropic etching, whereby the insulating layer 308 existing outwardly of the base layer 306 is removed and the emitter opening 309 is formed on the emitter forming region (see FIG. 50C). Then, after the polysilicon layer 312 has been deposited over the entire surface of the substrate, the second conductivity type (e.g., n-type) impurity is ion-implanted, and the thermal treatment is done, thereby providing the emitter region 314 on the surface region of the base layer 306 (see FIG. 50C).

Figure 50D:
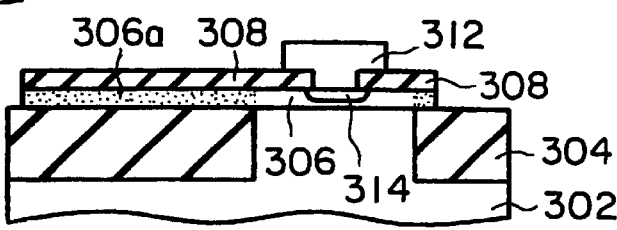

The polysilicon areas of the polysilicon layer 312 and of the base layer 306 are subjected to the patterning by carrying out the anisotropic etching which uses the photolithography technique, thereby providing the emitter electrode 312 (see FIG. 50D).

Figure 50E:
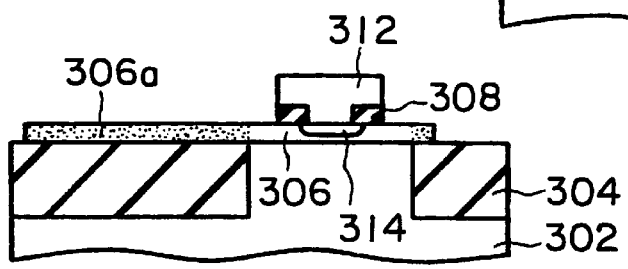

Next, with the emitter electrode 312 used as the mask, the anisotropic etching is effected on the insulating layer 308, thereby making the surface of the base layer 306 exposed (see FIG. 50E). Subsequently, the first conductivity tape impurity is ion-implanted into the base layer 306, thereby decreasing the resistance thereof.

Figure 50F:
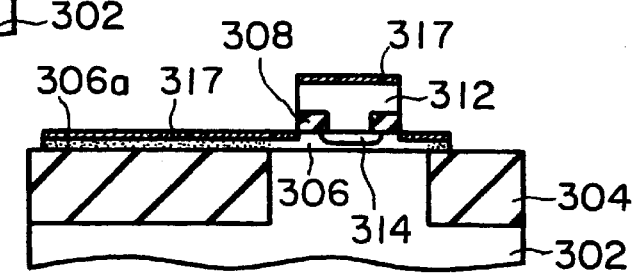
Figure 50G:
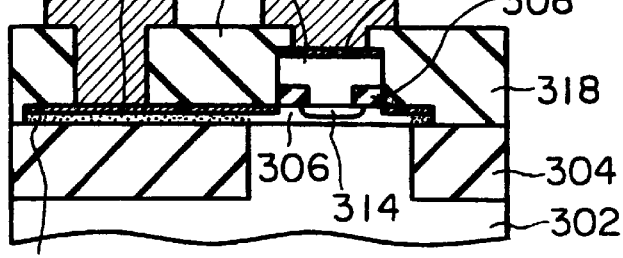

After this processing onwards, the bipolar transistor is completed by executing, the same steps as those, shown in FIGS. 48F and 48G, of the sixth manufacturing method (see FIGS. 50F and 50G).

The bipolar transistor manufactured by the eighth manufacturing method has the same configuration as that of the bipolar transistor in the fifth embodiment, and therefore exhibits the same effects as those of the bipolar transistor in the fifth embodiment.

Further, according to the eighth manufacturing method, the

After this processing onwards, the bipolar transistor is completed by executing the same steps as those, shown in FIGS. 48F and 48G, of the sixth manufacturing method (see FIGS. 50F and 50G).

The bipolar transistor manufactured by the eighth manufacturing method has the same configuration as that of the bipolar transistor in the fifth embodiment, and therefore exhibits the same effects as those of the bipolar transistor in the fifth embodiment.

Further, according to the eighth manufacturing method, the pattern area on the base layer 306 and the opening area of the emitter opening 309 can be determined by the same lithography step, and hence the number of steps can be decreased by one as compared with the sixth manufacturing method.

Next, a ninth manufacturing method is explained with reference to FIGS. 51A–51I. The ninth method is a method of manufacturing the bipolar transistor in the sixth embodiment shown in FIG. 46. FIGS. 51A–51I are sectional views showing the steps thereof.

Figure 51A:
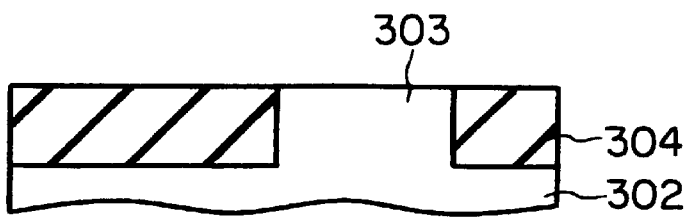
Figure 51B:
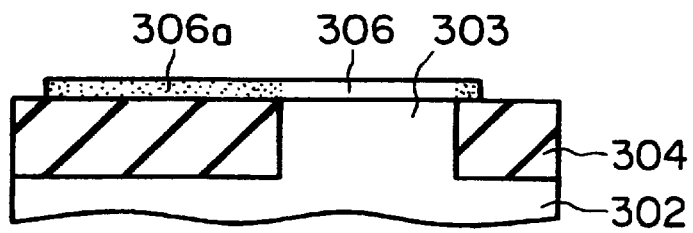

To begin with, as shown in FIG. 51A, a trench is formed in the silicon substrate 302 and is embedded with the insulating layer 304 to thereby effect the element isolation, thus providing the device region 303.

Next, the base layer 306 is provided by conducting the epitaxial growth while implanting the first conductivity type (e.g., p-type) impurity. At this time, the single crystal silicon is grown on the device region 303, while the polysilicon 306a is grown on the element isolation region 304. Thereafter, the base layer 306 is subjected to the patterning by performing the photo lithography technique and the anisotropic etching (see FIG. 51B).

Figure 51C:
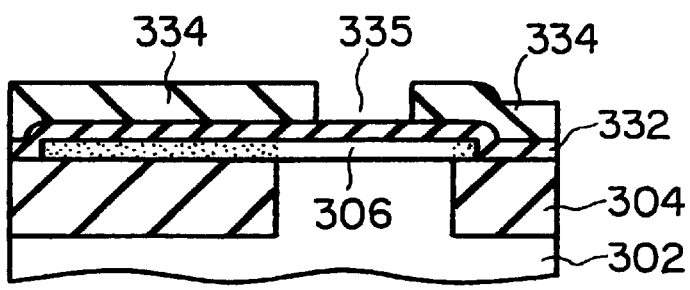
Figure 51D:
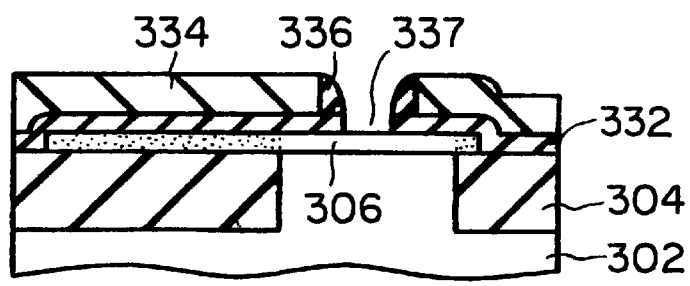
Figure 51E:
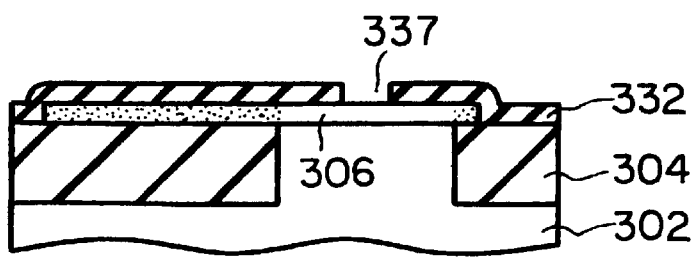
Figure 5I:
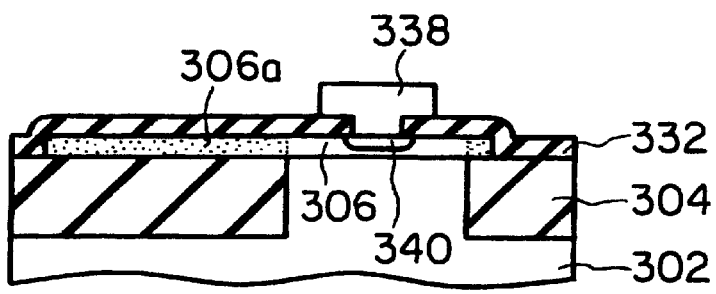
Figure 5I:
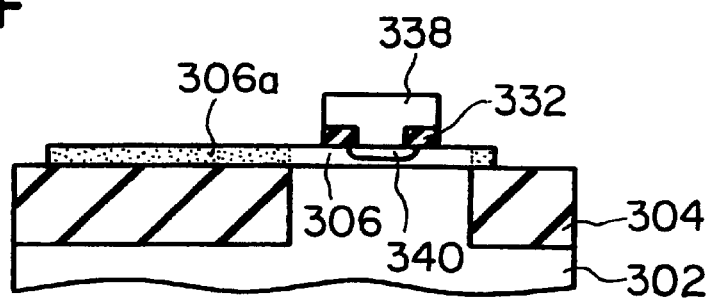
Figure 5I:
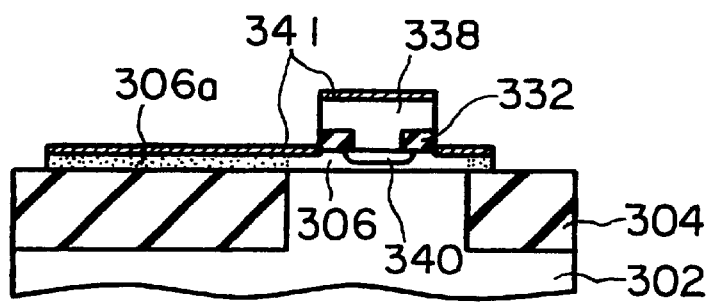
Figure 5I:
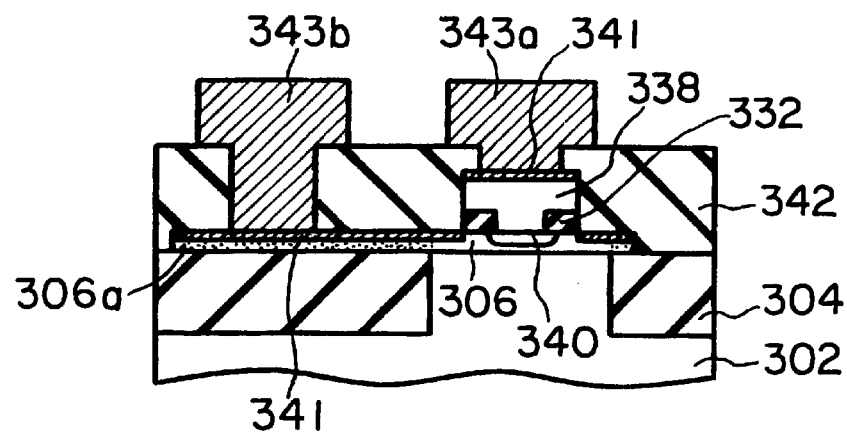

Next, a nitride layer 332 and an oxide layer 334 are sequentially deposited on the entire surface of the substrate, and thereafter an opening 335 is formed in the oxide layer 334 above the device region 303 by effecting the lithography technique and the anisotropic etching (see FIG. 51C). Subsequently, after the oxide layer has been deposited over the whole surface of the substrate, a side wall layer 336 composed of the oxide layer is emitter electrode 338 (see FIG. 51F). Subsequently, with the thermal treatment executed, an emitter region 340 is provided on the surface region of the base layer 306 (see FIG. 51F). Incidentally, herein, the emitter electrode 338 composed of the single crystal silicon is provided, and therefore the emitter region 340 is not in particular required to be provided on the surface region of the base layer 306 and may also be omitted.

Next, the anisotropic etching is effected upon the nitride layer 332 on the base layer 306 with the emitter electrode 338 used as the mask, thereby making the surface of the base layer 306 exposed (see FIG. 51G). Subsequently, the first conductivity type impurity is ion-implanted into the base layer 306, wherein the emitter electrode 338 serves as the mask. Then, the resistance of the base layer 306 is reduced.

Next, the refractory metal (e.g., Ti) layer is deposited on the entire surface of the substrate and, with the thermal treatment carried out, the refractory metal layer on the base layer 306 and on the emitter electrode 338 is changed into a silicide layer. Thereafter, the non-reacted refractory metal is removed, thus providing a refractory metal silicide layer 341 on the base layer 306 and on the emitter electrode 338 (see FIG. 51H).

Next, an inter-layer insulating layer 342 is deposited and thereafter formed with contact holes with the base layer 306 and the emitter electrode 338. Then, the metal is so deposited as to fill these contact holes, after which metal electrodes 343a, 343b are provided by performing the patterning, thus completing the bipolar transistor (see FIG. 51I).

The bipolar transistor manufactured by the ninth manufacturing method has the same configuration as that of the bipolar transistor in the sixth embodiment, and therefore exhibits the same effects as those of the bipolar transistor in the sixth embodiment.

Further, the ninth manufacturing method does not require the step of providing the etching stopper layer 385 and the step of providing the base lead-out electrode which are needed in the conventional manufacturing method shown in FIGS. 14A–14I, and hence it is feasible to reduce the number of steps as compared with the prior art manufacturing steps.

Next, a tenth manufacturing method is explained with reference to FIGS. 52A–52H. The tenth method is a method of manufacturing the bipolar transistor in the sixth embodiment shown in FIG. 46. FIGS. 52A–52H are sectional views showing the steps thereof.

To start with, as shown in FIG. 52A, a trench is formed in the silicon substrate 302 and is embedded with the insulating layer 304 to thereby effect the element isolation, thus providing the device region 303.

Next, the base layer 306 is provided by conducting the epitaxial growth while implanting the first conductivity type (e.g., p-type) impurity (see FIG. 52B). At this time, the single crystal silicon is grown the device region 303, while the polysilicon 306a is grown on the element isolation region 304. Subsequently, an oxide layer 351 and a nitride layer 352 are subsequentially deposited over the entire surface of the substrate (see FIG. 52B).

Next, the nitride layer 352 is subjected to the patterning by effecting the lithography technique and the anisotropic etching, thereby providing an opening 353 (see FIG. 52C). At this time, the nitride layer 352 existing on the region outside the base layer 306 is also removed.

Next, the nitride layer is deposited over the entire surface of the substrate and is subjected to the anisotropic etching, thereby providing a side wall layer 354 along a side surface of the opening 353 and a side surface of the nitride layer 352 (see FIG. 52D). Subsequently, the anisotropic etching is effected on the oxide layer 351 with the side wall layer 354 serving as the mask, whereby an emitter opening 355 is formed in the oxide layer 351.

Figure 52E:
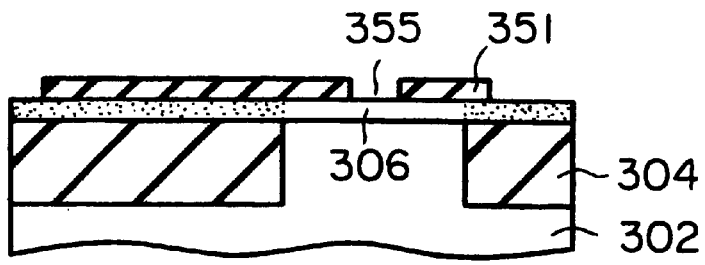
Figure 52F:
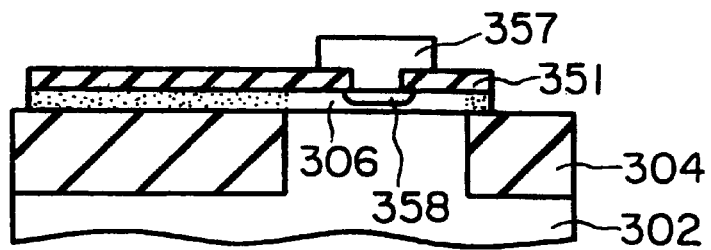

Next, the nitride layer 352 and the side wall layer 354 are removed by effecting wet etching (see FIG. 52E). Subsequently, the polysilicon is selectively deposited to fill the emitter opening 355, and the second conductivity tape (e.g., n-type) impurity is ion-implanted into the thus deposited polysilicon layer. Thereafter, with the thermal treatment executed, the above impurity is diffused into the base layer 306 from the polysilicon layer, thus providing an emitter region 358 (see FIG. 52F). Subsequently, the anisotropic etching is performed upon the polysilicon layer by the photolithography technique, thus providing can emitter electrode 357 (see FIG. 52F). At this time, the base layer is also simultaneously subjected to the patterning.

Figure 52G:
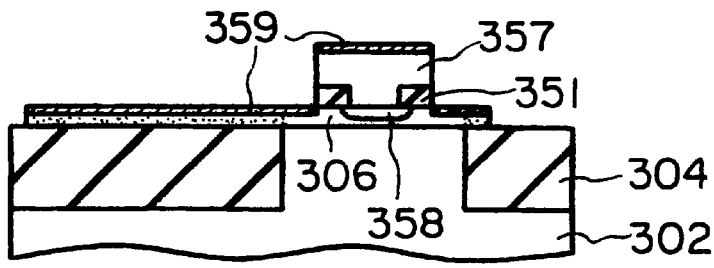
Figure 52H:
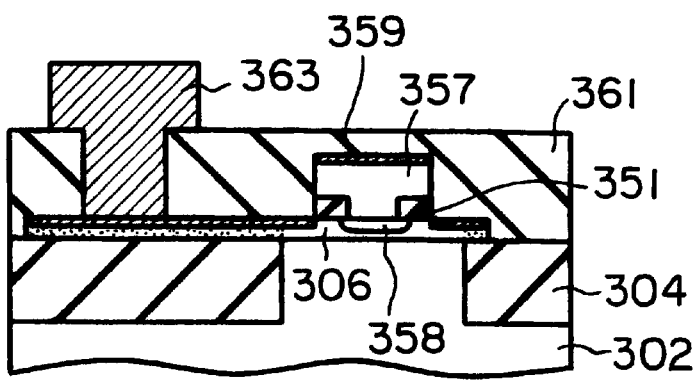

Next, the oxide layer 351 existing on the base layer 306 is removed by effecting the anisotropic etching with the emitter electrode 357 used as the mask, after which the first conductivity type impurity is ion-implanted into the base layer 306, thus reducing the resistance thereof (see FIG. 52G). Subsequently, a refractory metal (e.g., Ti) layer is deposited over the entire surface of the substrate and, with the thermal treatment carried out, the refractory metal layer on the base layer 306 and on the emitter electrode 357 is changed into a silicide layer. Thereafter, the non-reacted refractory metal is removed thus providing a refractory metal silicide layer 359 on the base layer 306 and on the emitter electrode 357 (see FIG. 52G).

Next, an inter-layer insulating layer 361, and the contact holes are opened. These contact holes are embedded with the metal layer, and a metal electrode 363 is provided by patterning this metal layer, thus completing the bipolar transistor (see FIG. 52H).

Note that, in the bipolar transistor manufactured by the tenth manufacturing method, the emitter electrode 357 is provided extending to the outside of the base layer 306, and the contact hole with the emitter electrode 357 and the metal electrode provided in this contact hole are provided outwardly of the base layer 306.

The bipolar transistor manufactured by the tenth manufacturing method has no necessity for providing the base lead-out electrode 386 structured to cover the base layer 306 (see FIG. 13) unlike the bipolar transistor. Therefore, the etching stopper layer 385, the oxide layer 387 and the spacer layer 393 (see FIGS. 13 and 14A–14I), which are needed in the prior art bipolar transistor, are not required, and it is feasible to decrease the high-resistance area on the base layer 306 under the insulating layer 351 down to a smaller resistance than in the prior art. The base resistance can be thereby reduced, and hence it is possible to attain a more speed-up and a less consumption of the electric power than in the prior art.

Further, as discussed above, because of providing no etching stopper layer 385 and no oxide layer 387, even if the bipolar transistor be made hyperfine, the aspect ratio of the opening on the emitter region can be made smaller than in the prior art. With this aspect ratio reduced, the current gain can be prevented from changing due to the variation in the emitter width.

Further, according to the tenth manufacturing method, the patterning is effected simultaneously on the base layer 306 and on the emitter electrode 357, and therefore one of the photolithography steps can be omitted in comparison with the prior art.

Next, an eleventh manufacturing method of the semiconductor device according to present invention is explained with reference to FIGS. 53A–53I. This embodiment deals with a manufacturing method of the semiconductor device in which the bipolar transistor and a MOS transistor are provided on the same substrate. FIGS. 53A–53I are sectional views showing the manufacturing steps.

Figure 53A:
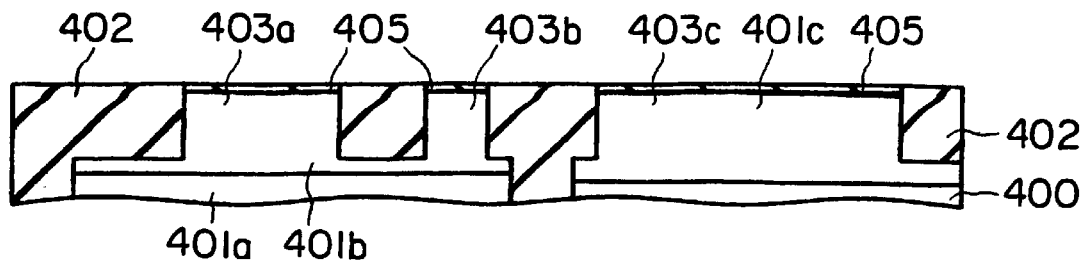
FIGS. 53A–53I are sectional views showing the eleventh process of the semiconductor device according to the present invention.
Figure 53B:
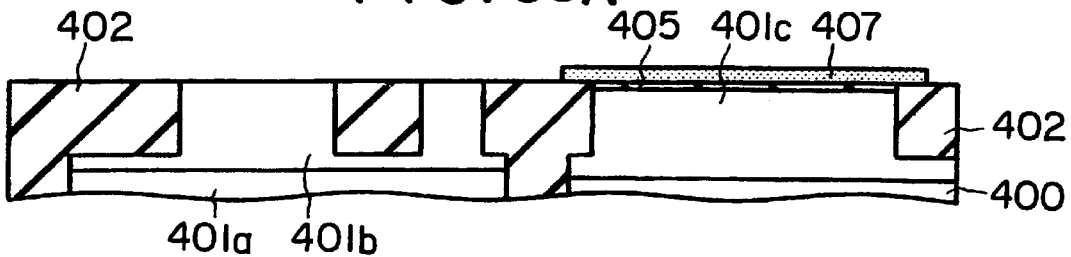

To begin with, as illustrated in FIG. 53A, an $n^+$ type embedded region 401a is provided on a bipolar transistor forming region of a p-type silicon substrate 400, and thereafter an $n^-$ layer 401b is provided on the surface of a silicon substrate 400 through the epitaxial growth. Subsequently, a p-well 401c is formed in an n-channel MOS transistor forming region of the silicon substrate 400. Thereafter, a shallow trench and a deep trench are formed in the silicon substrate 400 and embedded with an insulating layer 402 to thereby make the element isolation, thus providing device regions 403a, 403b, 403c (see FIG. 53A). The regions 403a, 403b serve as device regions for the bipolar transistor, while the region 403c serves as the device region for the MOS transistor. Subsequently, a silicon oxide layer 405 is provided on these device regions 403a, 403b, 403c.

Next, polysilicon layer 407 is deposited over the entire surface of the substrate. Then, a photo resist pattern (not shown) structured to cover the device region 403c is provided on the polysilicon layer 407, after which the polysilicon layer 407 and the silicon oxide layer 405 on the bipolar transistor forming region are removed with the photo resist pattern used as a mask (see FIG. 53B). At this time, the silicon oxide layer 405 and the polysilicon layer 407 are left on only the MOS transistor forming region.

Figure 53C:
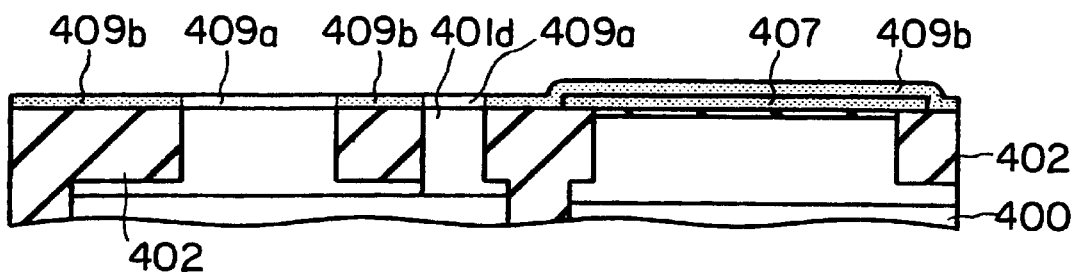

Next, after removing the photo resist pattern, as shown in FIG. 53C, a single crystal silicon layer 409a is provided on the device regions 403a, 403b by effecting the epitaxial growth while implanting a p-type impurity (e.g., boron), and a polysilicon layer 409b is provided on the element isolation insulating layer 402 and on the polysilicon layer 407. Thereafter, an n-type impurity is implanted into the device region 403b, thereby providing an n+type region 401d (see FIG. 53C).

Figure 53D:
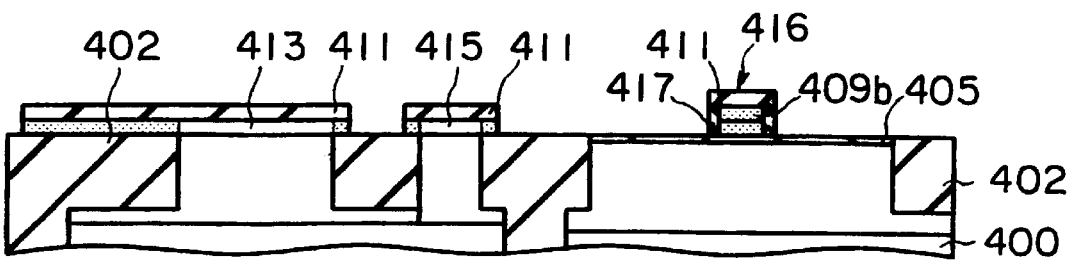

Next, as shown in FIG. 53D, an insulating layer 411 is deposited over the whole surface of the substrate. Subsequently, a photo resist pattern (not shown) is provided on the insulating layer 411, and the insulating layer 411, the polysilicon layer 409b and the polysilicon layer 407 are subjected to the patterning by effecting the anisotropic etching with the photo resist pattern serving as the mask, with the result that a base layer 413 is provided on the device region 403a, a collector electrode 415 is provided on the device region 403b and a gate electrode 416 is provided on the device region 403c, respectively (see FIG. 53D). It is to be noted that the base layer 413 at this time extends onto the element isolation insulating layer 402. Thereafter, the photo resist pattern is removed and a thermal oxidation treatment is executed, thereby providing an oxide layer 417 along the side surface of the gate electrode 416 (see FIG. 53D).

Figure 53E:
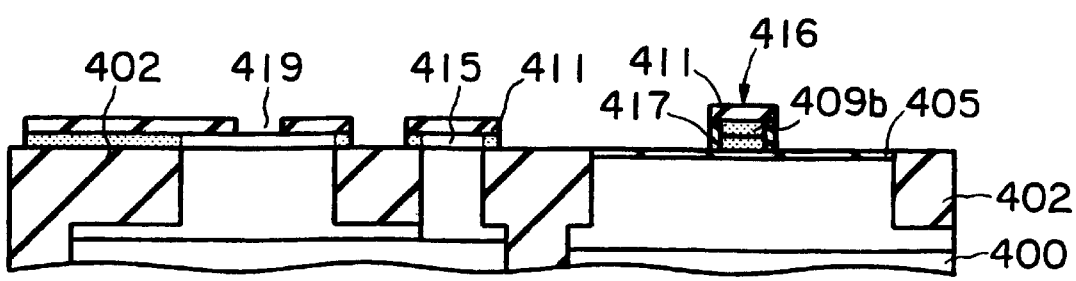

Next, an opening 419 for forming an emitter is provided on the insulating layer 411 on the base layer 413 by effecting the anisotropic etching involving the use of the photolithography technique (see FIG. 53E).

Next, the polysilicon layer is so deposited over the whole surface of the substrate as to fill the opening 419 (see FIG. 53E), and thereafter the photo resist pattern (not shown) is provided on this polysilicon layer. Then, with this photo resist pattern serving as the mask, the polysilicon layer is subjected to the patterning by performing the anisotropic etching, thereby providing an emitter electrode 420 (see FIG. 53F). At this time, a side wall 420a composed of the polysilicon layer is provided alone the side portion of the gate electrode 416. Subsequently, after removing the photo resist pattern, there is provided a photo resist pattern (not shown) structured to cover the bipolar transistor forming region. Then, an n-type impurity (e.g., As) is ion-implanted at a predetermined acceleration voltage with a predetermined dose, thereby providing a source/drain region 422 exhibiting a high concentration on the MOS transistor forming region (see FIG. 53F).

Figure 53F:
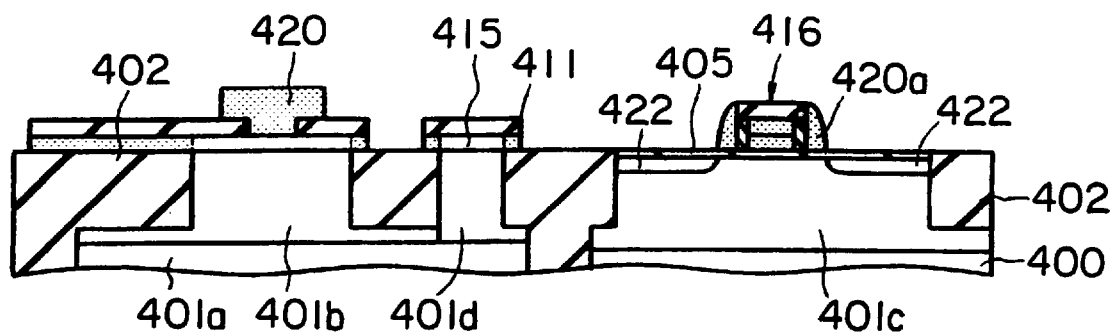
Figure 53G:
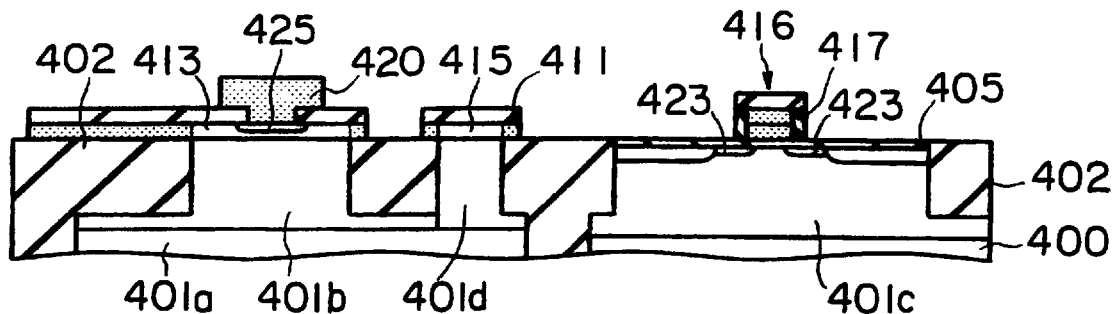
Figure 53H:
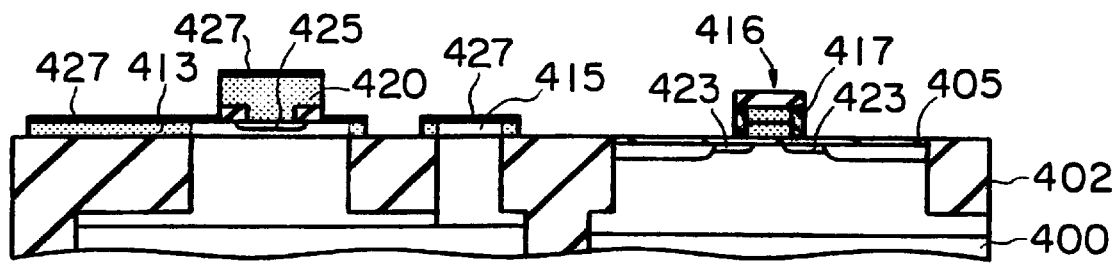

Next, as shown in FIG. 53F, a side wall 420a composed of the polysilicon along the side portion of the gate electrode 416 is removed by isotropic etching, and thereafter the n-type impurity (e.g., As) is ion-implanted, thereby providing a source/drain region 423 having a low concentration on the MOS transistor forming region. Subsequently, after removing the above photo resist pattern, a photo resist pattern (not shown) structured to cover the MOS transistor forming region is formed, and the n-type impurity (e.g., As) is ion-implanted with this photo resist pattern serving as a mask, thus adding the n-type impurity to the emitter electrode 420. Thereafter, the above photo resist pattern is removed, after which the n-type impurity is diffused into the surface region of a base layer (referred also to as a base electrode 413) by conducting the thermal treatment, whereby an emitter region 425 is provided (see FIG. 53G).

Next, a photo resist pattern (not shown) structured to cover the MOS transistor forming region is formed, and thereafter the insulating layer 411 on the collector electrode 415 as well as on the base electrode 413 is removed by effecting the anisotropic etching. Subsequently, the refractory metal such as, e.g., Ti is deposited by use of the sputtering method, and the thermal treatment is performed. Then, refractory metal silicide layers is provided individually on the base electrode 413, the collector electrode 415 and the emitter electrode 420 by removing the non-reacted refractory metal (see FIG. 53H). Incidentally, on the occasion of removing the non-reacted refractory metal silicide, the photo resist pattern is also removed.

Figure 53I:
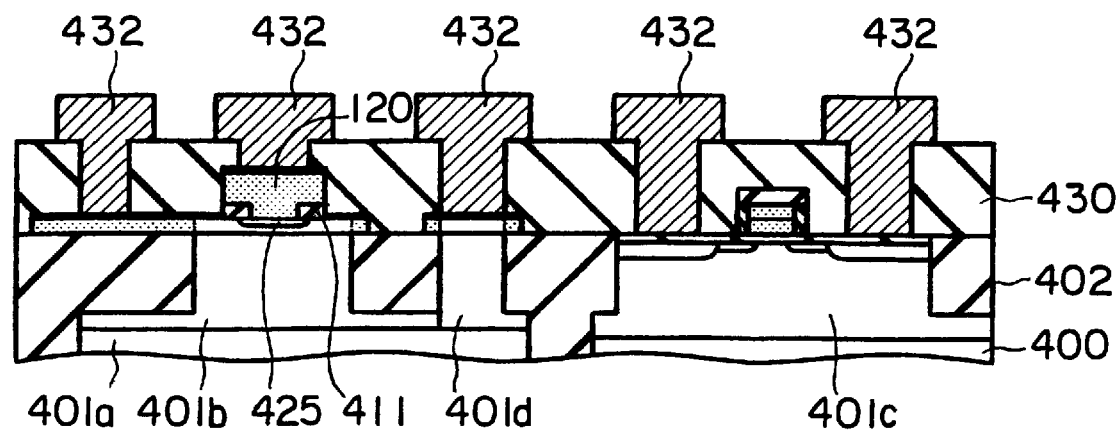

Next, as illustrated in FIG. 53I, after an inter-layer insulating layer 430 has been deposited over the entire surface of the substrate, there are formed openings as contact holes for coming into contact with the base electrode 413, the collector electrode 415, the emitter electrode 420 and the source/drain region 422. Then, the metal layer is so deposited as to fill these contact holes and is subjected to the patterning, and a metal electrode 432 is thereby provided, thus completing the semiconductor device (see FIG. 53I).

As discussed so far, according to the eleventh manufacturing method, unlike the prior art bipolar transistor, there is no necessity for providing the base lead-out electrode 386 (see FIG. 13) structured to cover the base layer (the base electrode 413). Hence, the etching stopper layer 385 (see FIG. 13), the oxide layer 387 (see FIGS. 14A–14I and the spacer layer 393 (see FIGS. 13), which are needed in the prior art bipolar transistor, are not required, and it is feasible to decrease the high-resistance area on the base layer 413 under the insulating layer 411 down to a smaller resistance than in the prior art. The base resistance can be thereby reduced, and hence it is possible to attain a more speed-up, a less consumption of the electric power and a more enhanced noise characteristic than in the prior art.

Further, as discussed above, because of providing no etching stopper layer 385 and no oxide layer 387, even if the bipolar transistor be made hyperfine, the aspect ratio of the opening (the emitter opening) 119 on the emitter region can be made smaller than in the prior art. With this aspect ratio reduced, the current gain can be prevented from changing due to the variation in the emitter width.

Moreover, according to the method of manufacturing the conventional semiconductor device in which the bipolar transistor and the MOS transistor are provided on the same substrate, the bipolar transistor and the MOS transistor are each manufactured in different steps, which leads to a problem of increasing the number of steps. As in the present embodiment, however, the base layer 413 and the layer 409b constituting the gate electrode 416 are simultaneously provided through the non-selective epitaxial growth, and besides the patterning of the base layer 413 and of the gate electrode is conducted in the same step, which makes it possible to reduce the number of steps as compared with the prior art.

Next, a twelfth manufacturing method of the semiconductor device according to the present invention is discussed referring to FIGS. 54A–54I. This manufacturing method is a method of manufacturing the semiconductor device in which the bipolar transistor and the MOS transistor are provided on the same substrate. FIGS. 54A–54I are sectional views showing the steps thereof.

Figure 54A:
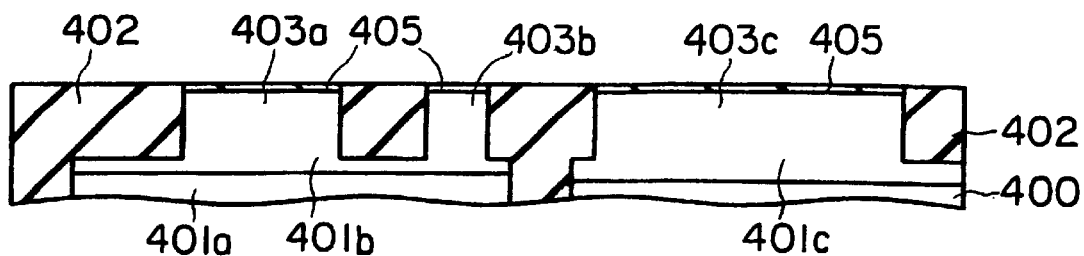
FIG. 54A–54I are sectional views showing the twelfth process of the semiconductor device according to the present invention.

To start with, as shown in FIG. 54A, an n⁻ type embedded region 401a is provided on the bipolar transistor forming region of the p-type silicon substrate 400, and thereafter an n⁻ layer 401b is provided on the surface of the silicon substrate 400 through the epitaxial growth. Subsequently, the p-well 401c is formed in the n-channel MOS transistor forming region of the silicon substrate 400. Thereafter, a shallows trench and a deep trench are formed in the silicon substrate 400 and embedded with the insulating layer 402 to thereby make the element isolation, thus providing the device regions 403a, 403b, 403c (see FIG. 54A). The regions 403a, 403b serve as device regions for the bipolar transistor, while the region 403c serves as the device region for the MOS transistor. Subsequently, the silicon oxide layer 405 is provided on these device regions 403a, 403b, 403c (see FIG. 54A).

Next, the silicon oxide layer 405 on the bipolar transistor forming region is removed. Subsequently, the epitaxial growth is carried out while simultaneously implanting the p-type impurity (e.g., boron), thereby providing a single crystal silicon layer 409a on the device regions 403a, 403b and a polysilicon layer 409b on other the device regions (see FIG. 54B). Thereafter, the n-type impurity is implanted into the device region 403b, thereby providing an n+type region 401d (see FIG. 54B).

Figure 54B:
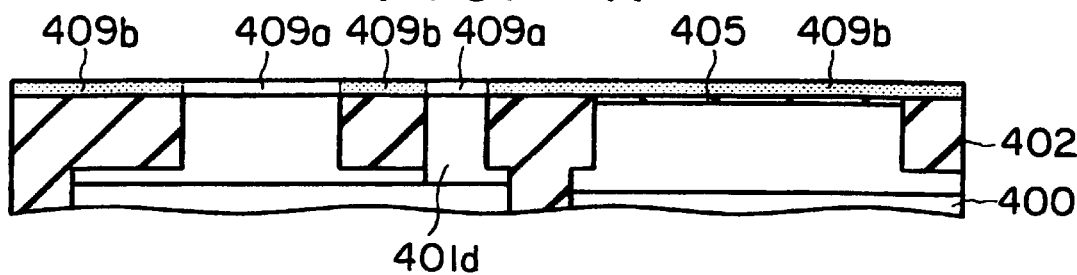
Figure 54C:
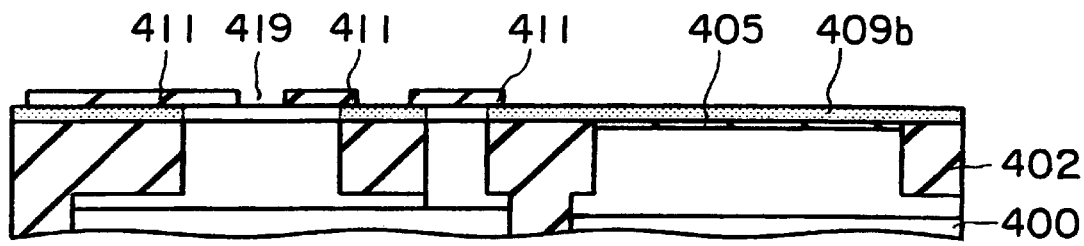

Next, as shown in FIG. 54C, an insulating layer 411 is deposited over the entire surface of the substrate, and is subjected to the patterning, whereby the insulating layer 411 is left on only a base layer forming region and a collector electrode forming region. At this time, the insulating layer 411 on the base layer forming region is formed with an emitter opening 419 (see FIG. 54C).

Figure 54D:
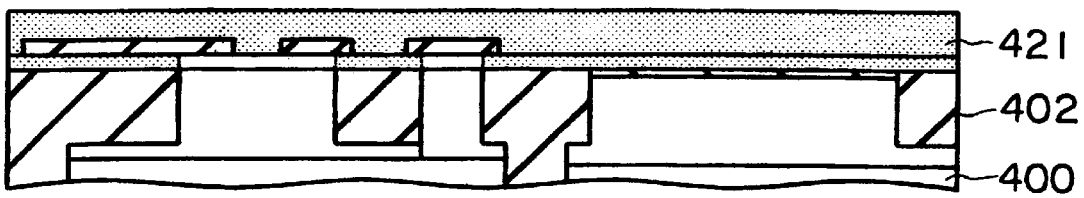
Figure 54E:
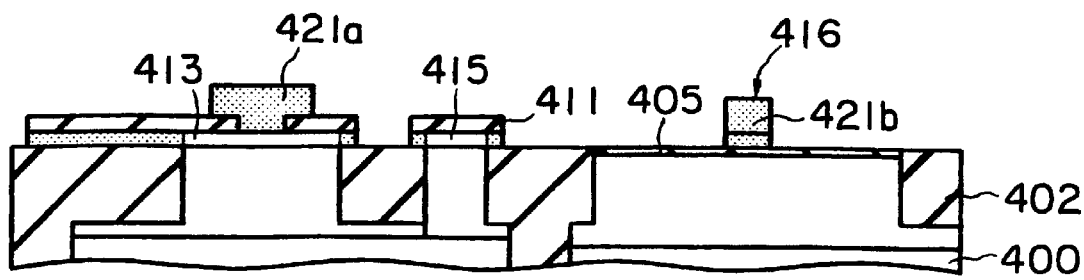
Figure 54F:
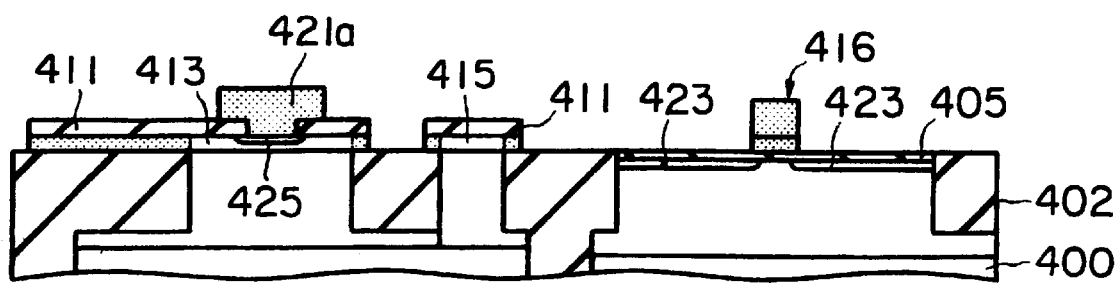

Next, a polysilicon layer 421 is deposited over the whole surface of the substrate so that the emitter opening 419 is embedded with this layer 421 (see FIG. 54D). Subsequently, a photo resist pattern (not shown) is formed on the polysilicon layer 421, and the polysilicon layer 421 and the polysilicon layer 409b are subjected to the patterning by executing the anisotropic etching with that photo resist pattern serving as the mask, thereby simultaneously providing an emitter electrode 421a and a gate electrode 416 (see FIG. 54E). At this time, the polysilicon layer 409b on the bipolar transistor forming region also undergoes the patterning, wherein the insulating layer 411 on the collector electrode forming region as well as on the base layer forming region is used as the mask. Then, the base layer 413 and the collector electrode 415 are provided at the same time (see FIG. 54E).

Next, after the MOS transistor forming region has been masked with a photo resist (not shown), the n-type impurity (e.g., As) is ion-implanted into the emitter electrode 421a under a predetermined ion implantation condition. Then, after removing the photo resist, the n-type impurity is diffused into the surface region of the base layer 413 from the emitter electrode 421a by effecting, the thermal treatment, thereby providing an emitter region 425 (see FIG. 54F). Thereafter, the n-type impurity (e.g., As) is ion-implanted under a predetermined condition, thereby providing a low-concentration source/drain region 423 on the MOS transistor forming region (see FIG. 54F).

Figure 54G:
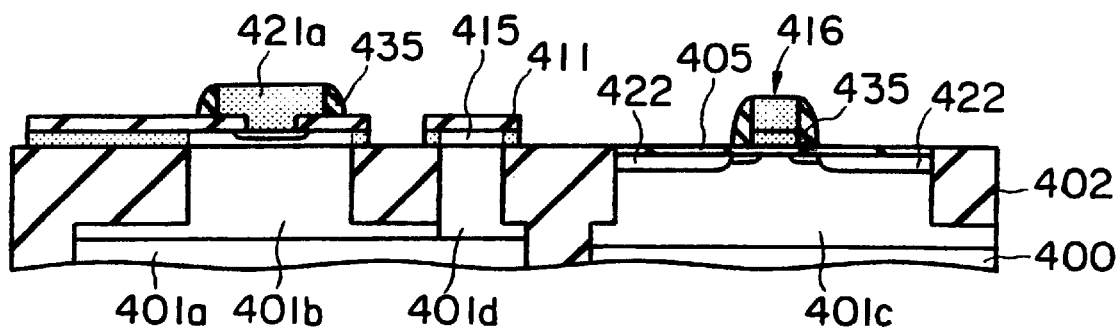

Next, a nitride layer is deposited over the entire surface of the substrate, after which a side wall 435 composed o the nitride layer is provided along the side portion of the gate electrode 416 by conducting the anisotropic etching (see FIG. 54G). At this time, a side wall 435 formed of the nitride layer is also provided along the side portion of the emitter electrode 421a (see FIG. 54G). Subsequently, after the bipolar transistor forming region has been masked with the photo resist, the n-type impurity (e.g., As) is ion-implanted under a predetermined ion implantation condition, thereby providing a high-concentration source/drain region 422 on the MOS transistor forming region (see FIG. 54G).

Figure 54H:
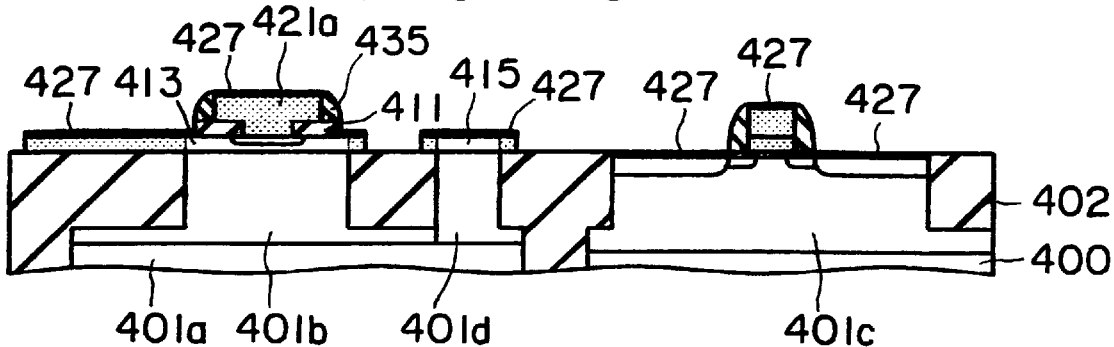

Next, after removing the photo resist, as shown in FIG. 54H, the insulating layer 411 on the base layer 413 and on the collector electrode 415 is removed by effecting the anisotropic etching, and the silicon oxide layer 405 on the source/drain region 422 is also removed. Subsequently, the refractory metal such as, e.g., Ti is deposited over the entire surface of the substrate by use of the sputtering method, and thereafter the refractory metal is reacted to the polysilicon or the single crystal silicon by performing the thermal treatment. Then, the non-reacted refractory metal is removed, thereby providing a refractory metal silicide layer 427 on each of the base layer (called also the base electrode) 413, the collector electrode 415, the emitter electrode 421a, the gate electrode 416 and the source/drain region 422 (see FIG. 54H).

Figure 54I:
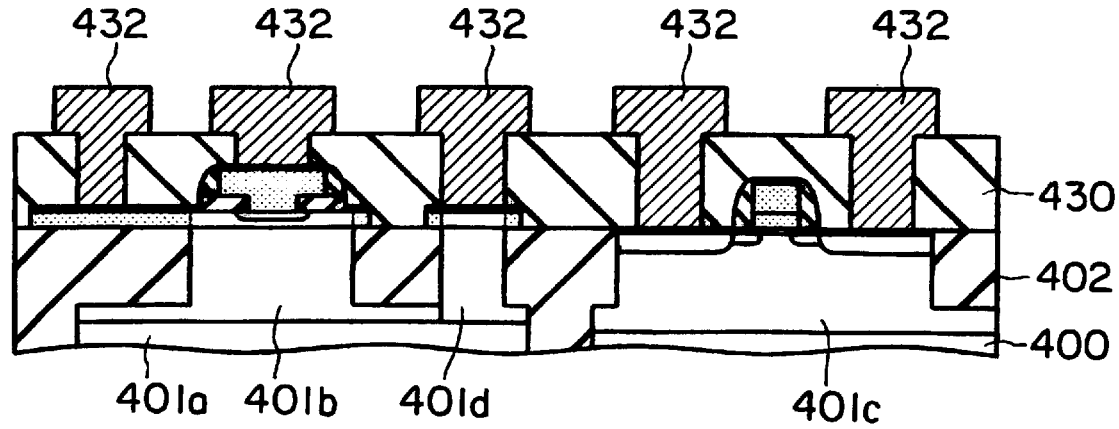

Next, as shown in FIG. 54I, after an inter-layer insulating layer 430 has been deposited over the whole surface of the substrate, there are formed openings as contact holes for coming into contact with the base electrode 413, the collector electrode 415, the emitter electrode 421a and the source/drain region 422. Then, the metal layer is so deposited as to fill these contact holes and is subjected to the patterning to thereby provide an metal electrode 431, thus completing the semiconductor device (see FIG. 54I).

As discussed above, according to the twelfth manufacturing method, unlike the conventional bipolar transistor, there is no necessity for providing the base lead-out electrode 386 (see FIG. 13) structured to cover the base layer (the base electrode 413). Hence, there becomes unnecessary the etching stopper layer 385 (see FIG. 13) the oxide layer 387 (see FIGS. 14A–14I) and the spacer layer 393 (see FIG. 13) which are needed in the conventional bipolar transistor, and, even if the bipolar transistor is made hyperfine, the aspect ratio of the opening (the emitter opening) 419 above the emitter region can be made smaller than in the prior art. The current gain can be thereby prevented from changing due to the variation in the emitter width as much as possible.

Furthermore, according to the present method, the layer 409b constituting the gate electrode 416, the base electrode 413 and the collector electrode 415 are simultaneously provided, and the layer 421b constituting the gate electrode 416 and the emitter electrode 421a are provided at the same time. Moreover, the patterning for providing the gate electrode 416 and the emitter electrode 421a is conducted in the same step, and hence the number of steps can be decreased in comparison with the prior art manufacturing method.

Next, a thirteenth manufacturing method is explained referring to FIGS. 55A–55J. This manufacturing method is a method of manufacturing the semiconductor device in which the bipolar transistor and the MOS transistor are provided on the same substrate. FIGS. 55A–55J are sectional views showing the steps thereof.

Figure 55A:
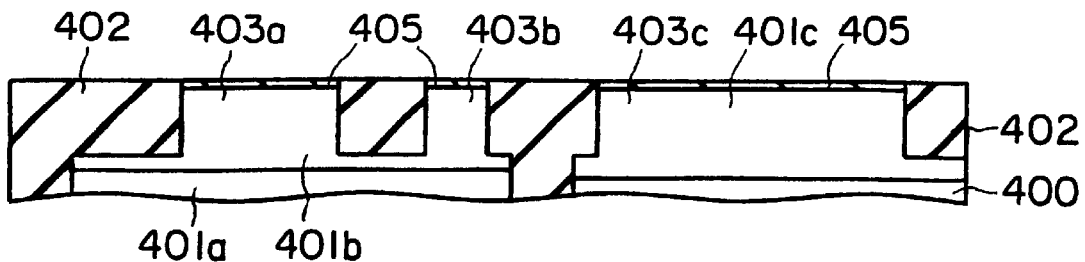
FIGS. 55A–55J are sectional views showing the thirteenth process of the semiconductor device according to the present invention.

To start with, as shown in FIG. 55A, an $n^+$ type embedded region 401a is provided on the bipolar transistor forming region of the p-type silicon substrate 400, and thereafter an $n^-$ layer 401b is provided on the surface of the silicon substrate 400 through the epitaxial growth. Subsequently, the p-well 401c is formed in the n-channel MOS transistor forming region of the silicon substrate 400. Thereafter, a shallow trench and a deep trench are formed in the silicon substrate 400 and embedded with the insulating layer 402 to thereby make the element isolation, thus providing the device regions 403a, 403b, 403c (see FIG. 55A). The regions 403a, 403b serve as device regions for the bipolar transistor, while the region 403c serves as the device region for the MOS transistor. Subsequently, the silicon oxide layer 405 is provided on these device regions 403a, 403b, 403c (see FIG. 55A).

Next, the silicon oxide layer 407 is deposited over the entire surface of the substrate. Then, the photo resist pattern (not shown) structured to cover the device region 403c is formed on the polysilicon layer 407, after which the polysilicon layer 407 and the silicon oxide layer 405 on the bipolar transistor forming region are removed with this photo resist pattern serving as the mask (see FIG. 55B). At this time, the silicon oxide layer 405 and the polysilicon layer 407 are left on only the MOS transistor forming region.

Figure 55B:
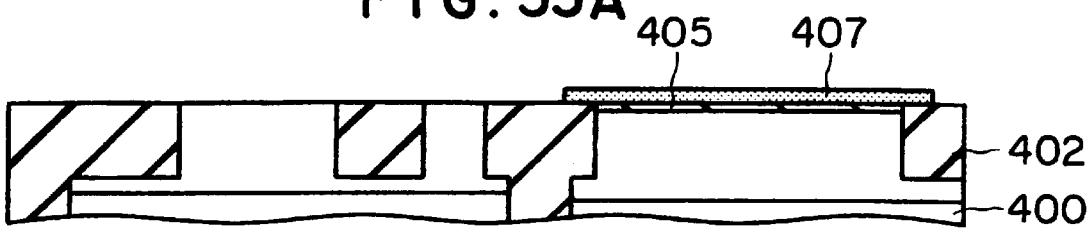
Figure 55C:
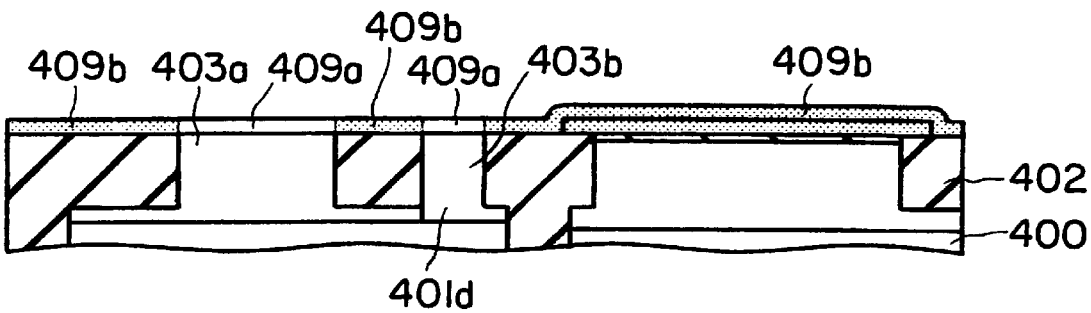

Next, after removing the photo resist patterns as illustrated in FIG. 55C, the epitaxial grown takes place while implanting the p-type impurity (e.g., boron), thereby providing the single crystal silicon layer 409a on the device regions 403a, 403b and providing the polysilicon layer 109b on the element isolation insulating layer 402 and on the polysilicon layer 107. Thereafter, the n-type impurity is implanted into the device region 403b, thereby providing an $n^-$ region (see FIG. 55C).

Figure 55D:
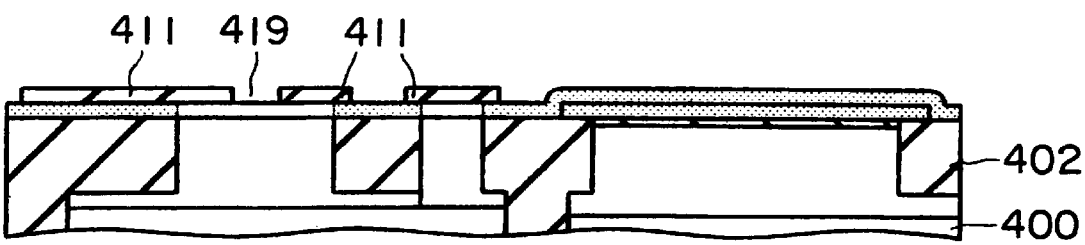

Next, after depositing the insulating layer 411 over the whole surface of the substrate as illustrated in FIG. 55D, the insulating layer 411 is subjected to the patterning by use of the photolithography technique, whereby the insulating layer 411 is left on only the base layer forming region and the collector electrode forming region. At this time, an emitter opening 419 is formed in the insulating layer 411 on the base layer forming region (see FIG. 55D).

Figure 55E:
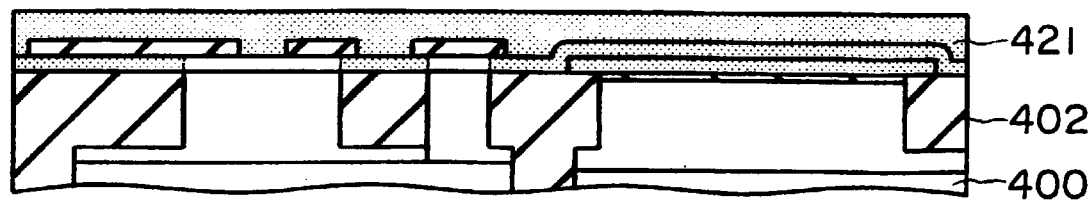
Figure 55F:
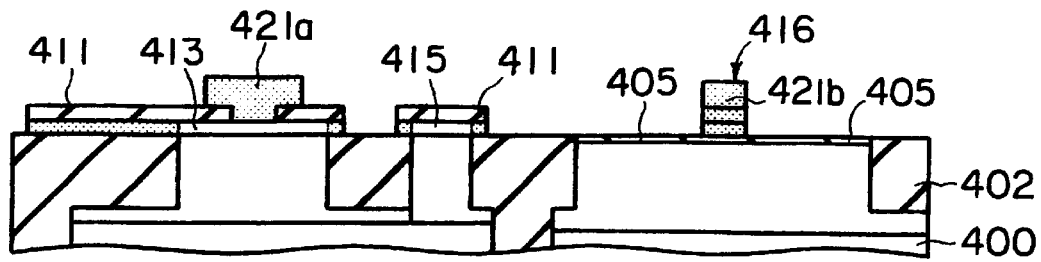
Figure 55G:
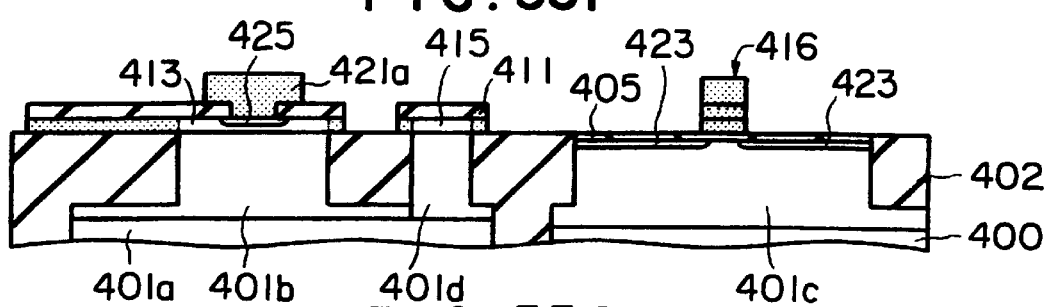

Next, as shown in FIG. 55E, the polysilicon layer 421 is so deposited over the entire surface of the substrate as to fill the emitter opening 419. Subsequently, the patterning is effected on the polysilicon layers 421, 409b, 407 by the anisotropic etching which involves the use of the photolithography technique, whereby the emitter electrode 421a and the gate electrode 416 are provided see FIG. 55F). At this time, the polysilicon layer 409b on the bipolar transistor forming region is also subjected to the patterning, wherein the insulating layer 411 existing on the base layer forming region and on the collector electrode forming region serves as the mask. Then, the base layer 413 and the collector electrode 415 are also provided simultaneously (see FIG. 55F). Note that the gate electrode 416 takes a triple-layered structure consisting of the polysilicon layers 407, 409b, 421b.

Next, after the MOS transistor forming region has been masked with a photo resist (not shown), the n-type impurity (e.g., As) is ion-implanted into the emitter electrode 421a under a predetermined ion implantation condition. Then, after removing the photo resist, the n⁻type impurity is diffused into the surface region of the base layer 413 from the emitter electrode 421a by effecting the thermal treatment, thereby providing an emitter region 425 (see FIG. 55G). Thereafter, the n-type impurity (e.g., As) is ion-implanted under a predetermined condition, thereby providing the low-concentration source/drain region 423 on the MOS transistor forming region (see FIG. 55G).

Figure 55H:
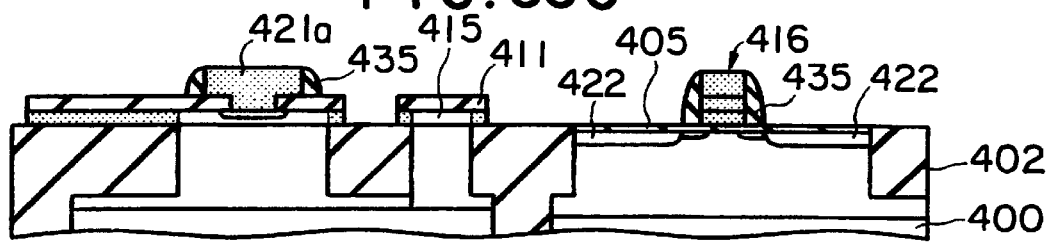

Next, a nitride layer is deposited over the entire surface of the substrate, after which the side wall 435 composed of the nitride layer is provided alone the side portion of the gate electrode 416 by conducting the anisotropic etching (see FIG. 55H). At this time, the side wall 435 formed of the nitride layer is also provided along the side portion of the emitter electrode 421a (see FIG. 55H). Subsequently, after the bipolar transistor forming region has been masked with the photo resist, the n-type impurity (e.g., As) is ion-implanted under a predetermined ion implantation condition, thereby providing the high-concentration source/drain region 422 on the MOS transistor forming region (see FIG. 55H).

Figure 55I:
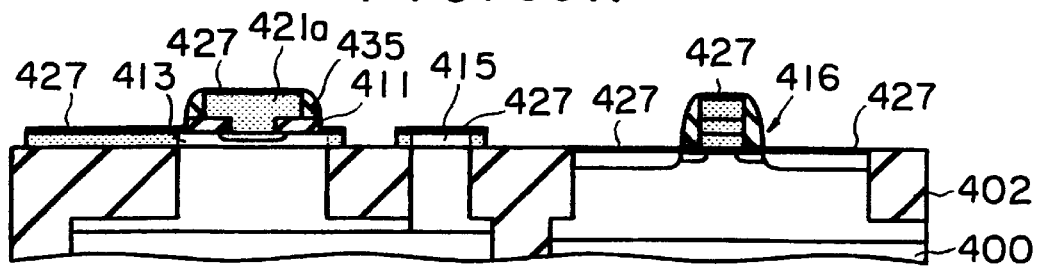

Next, after removing the photo resist, as shown in FIG. 55I, the insulating layer 411 on the base layer 413 and on the collector electrode 415 is removed by effecting the anisotropic etching, and the silicon oxide layer 405 on the source/drain region 422 is also removed. Subsequently, the refractory metal such as, e.g., Ti is deposited over the entire surface of the substrate by use of the sputtering method, and thereafter the refractory metal is reacted to the polysilicon or the single crystal silicon by performing the thermal treatment. Then, the non-reacted refractory metal is removed, thereby providing the refractory metal silicide layer 427 on each of the base layer (called also the base electrode) 413, the collector electrode 415, the emitter electrode 421a, the gate electrode 416 and the source/drain region 422 (see FIG. 55I).

Figure 55J:
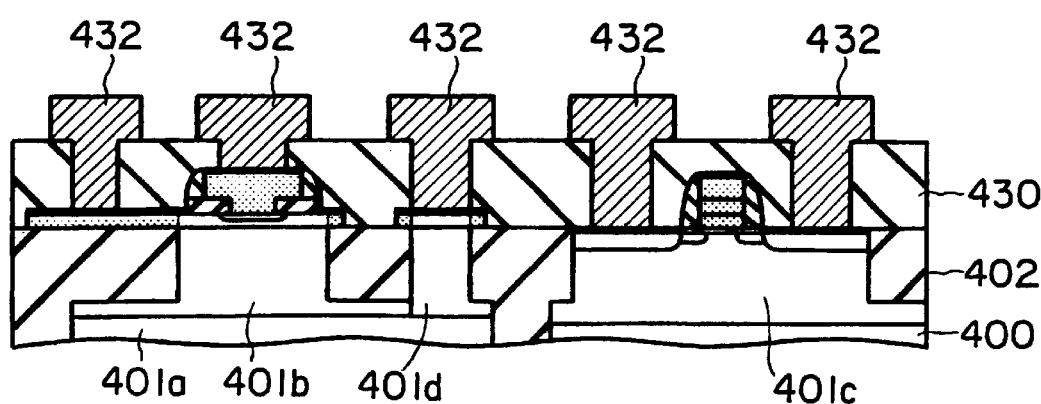

Next, as shown in FIG. 55J, after the inter-layer insulating layer 430 has been deposited over the whole surface of the substrate, there are formed openings as contact holes for coming into contact with the base electrode 413, the collector electrode 415, the emitter electrode 421a and the source/drain region 422. Then, the metal layer is so deposited as to fill these contact holes and is subjected to the patterning to thereby provide an metal electrode 432, thus completing the semiconductor device (see FIG. 55J).

As discussed above, according to the thirteenth manufacturing method, unlike the conventional bipolar transistor, there is no necessity for providing the base lead-out electrode 386 (see FIG. 13) structured to cover the base layer (the base electrode 413). Hence, there becomes unnecessary the etching stopper layer 385 (see FIG. 13) the oxide layer 387 (see FIGS. 14A–14I) and the spacer layer 393 (see FIG. 13) which are needed in the conventional bipolar transistor, and, even if the bipolar transistor is made hyperfine, the aspect ratio of the opening (the emitter opening) 419 above the emitter region can be made smaller than in the prior art. The current gain can be thereby prevented from changing due to the variation in the emitter width as much as possible.

Furthermore, according to the present method, the layer 409b constituting the gate electrode 416, the base electrode 413 and the collector electrode 415 are simultaneously provided, and the layer 421b constituting the gate electrode 416 and the emitter electrode 421a are provided at the same time. Moreover, the patterning for providing the gate electrode 416 and the emitter electrode 421a is conducted in the same step, and hence the number of steps can be decreased in comparison with the prior art manufacturing method.

Next, a fourteenth manufacturing method of the semiconductor device is explained referring to FIGS. 56A–56J. This manufacturing method is a method of manufacturing the semiconductor device in which the bipolar transistor and the MOS transistor are provided on the same substrate. FIGS. 56A–56J are sectional views showing the steps thereof.

Figure 56A:
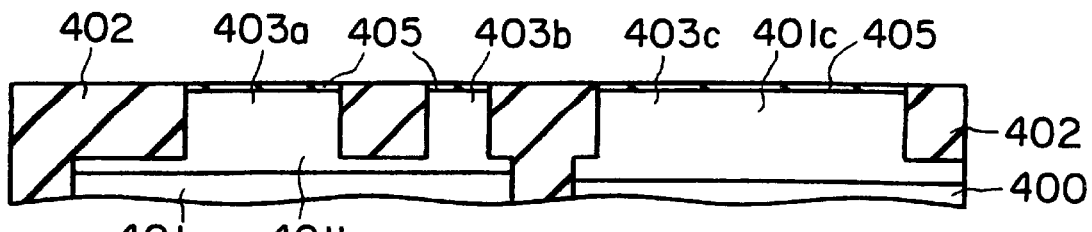
FIGS. 56A–56J are sectional views showing the fourteenth process of the semiconductor device according to the present invention.
Figure 56B:
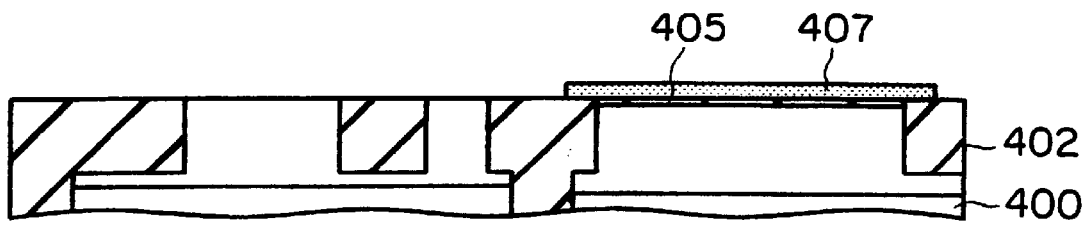
Figure 56C:
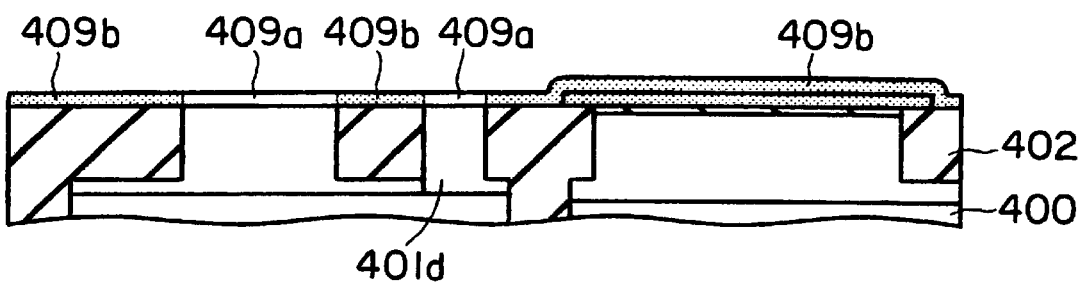

To start with, the same steps shown in FIGS. 55A–55C are executed (see FIGS. 56A–56C).

Figure 56D:
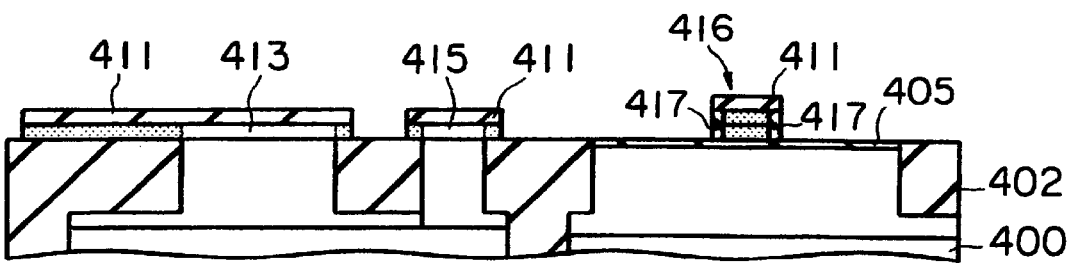

Next, as shown in FIG. 56D, the insulating layer 411 is deposited over the entire surface of the substrate and the insulating layer 411 and two layers of polysilicon 409b, 407 are subjected to the patterning by the anisotropic etching using the photolithography technique, thereby providing the base layer 413, the collector electrode 415 and the gate electrode 416. At this time, the insulating layer 411 is left on the base layer 413, the collector electrode 415 and the gate electrode 416. Subsequently, with the thermal treatment effected, the silicon oxide layer 417 is provided along the side portion of the gate electrode 416 (see FIG. 56D).

Figure 56E:
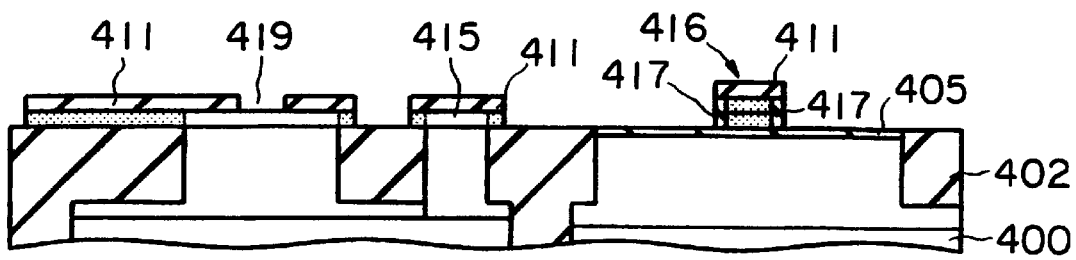

Next, as shown in FIG. 56E, the emitter opening 419 is formed in the insulating layer 411 on the base layer 413 by anisotropic etching using the photolithography technique.

Figure 56F:
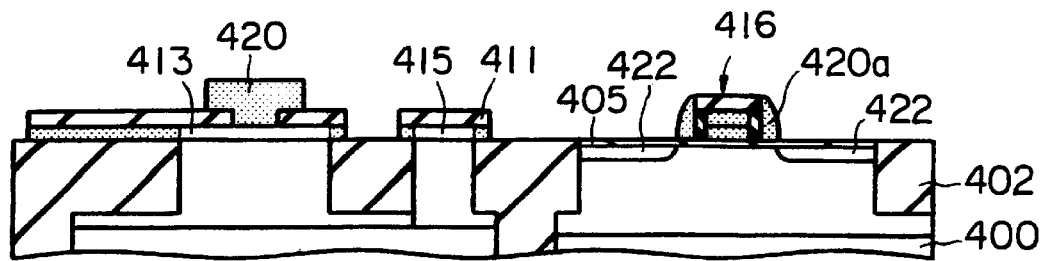

Next, after depositing the polysilicon layer over the entire surface of the substrate, an emitter electrode 420 is provided by performing the anisotropic etching involving the use of the photolithography technique (see FIG. 56F). At this time, a side wall 420a composed of the polysilicon is provided along the side portion of the gate electrode 416 (see FIG. 56F). Formed subsequently is the photo resist mask for covering the bipolar transistor forming region, and the n-type impurity (e.g., As) is ion-implanted under a predetermined condition, thereby providing a high-concentration source/drain region 422 on the MOS transistor forming region (see FIG. 56F).

Figure 56G:
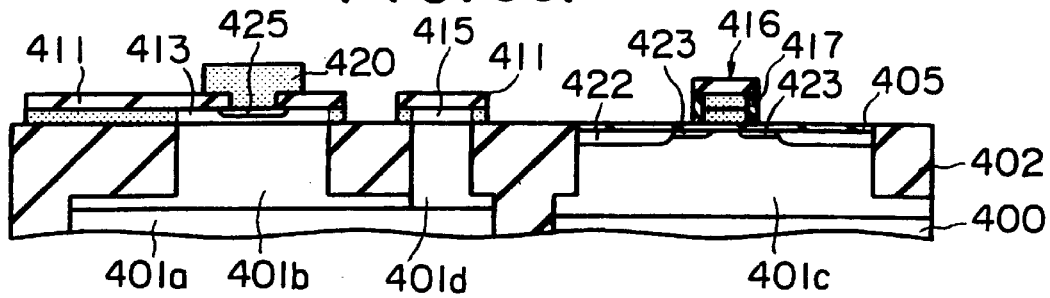

Next, the side shall 420a of the gate electrode 416 is removed by carrying out the isotropic etching (see FIG. 56G). Subsequently, the n-type impurity (e.g., As) is ion-implanted under a predetermined condition, thereby providing a low-concentration source/drain region 423 on the MOS transistor forming region (see FIG. 56G). Then, after removing the photo resist mask, a photo resist mask for covering the MOS transistor forming region is formed, and the n-type impurity (e.g., As) is ion-implanted into the emitter electrode 420 under a predetermined condition. Subsequently, the n-type impurity is diffused into the surface region of the base layer 413 by executing the thermal treatment, thus providing an emitter region 425 (see FIG. 56G).

Figure 56H:
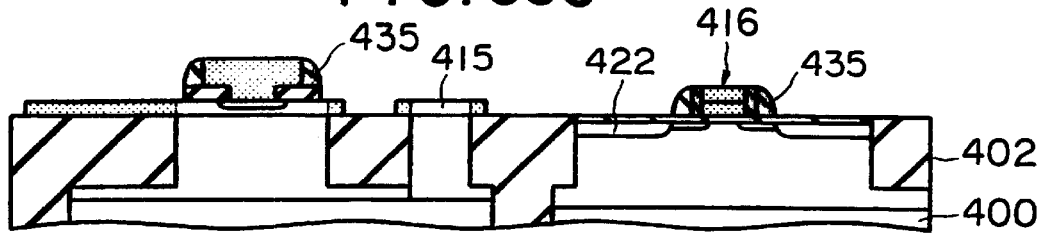
Figure 56I:
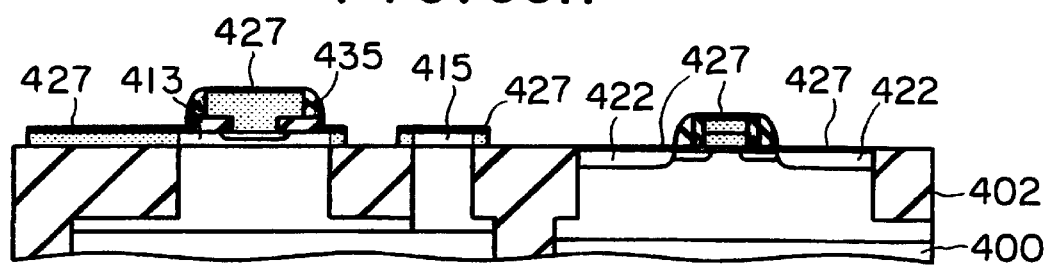

Next, the insulating layer is deposited over the whole surface of the substrate, and etching-back is effected based on the anisotropic etching, thereby providing a side wall layer 435 along the gate electrode 416 and also removing the silicon oxide layer 405 on the source/drain region 422 as well as removing the insulating layer 411 on the base layer 413, the collector electrode 415 and the gate electrode 416 (see FIG. 56H). At this time, the side wall layer 435 is formed also along the side portion of the emitter electrode 421a (see FIG. 56H).

Next, the refractory metal si deposited over the entire surface of the substrate by use of the sputtering method, and, with the thermal treatment effected, the refractory metal is reacted to the polysilicon or the single crystal silicon. Then, the non-reacted refractory metal is removed, thereby providing the refractory metal silicide layer 427 on each of the base layer (called also the base electrode) 413, the collector electrode 415, the emitter electrode 420, the gate electrode 416 and the source/drain region 422 (see FIG 56I).

Figure 56J:
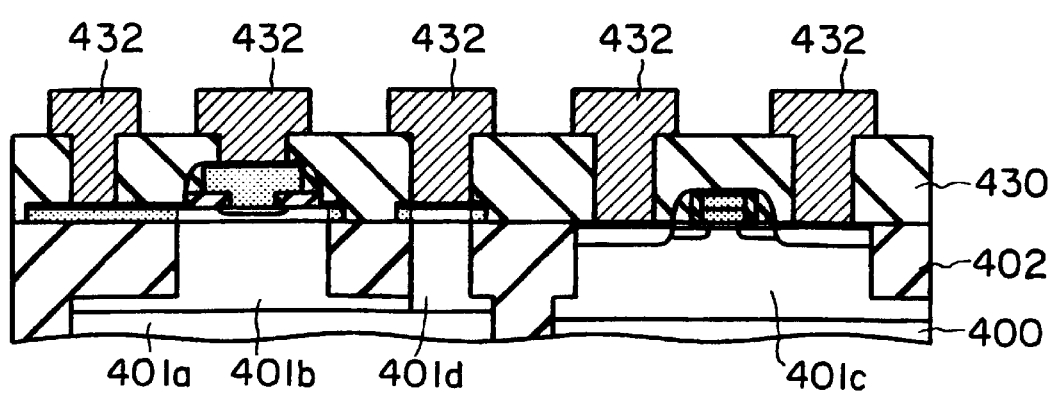

Next, as shown in FIG. 56J, after the inter-layer insulating layer 430 has been deposited over the whole surface of the substrate, this inter-layer insulating layer 430 is formed with an opening as a contact hole. Then, this contact hole is embedded with the metal layer, and the patterning is conducted thereon, thereby providing a metal electrode 432 (see FIG. 56J).

As discussed above, the fourteenth manufacturing method also exhibits the same effect as that of the thirteenth manufacturing method.

Next, a fifteenth manufacturing method is described referring to FIGS. 57A–57I. The fifteenth embodiment deals with the manufacturing method of semiconductor device in which the bipolar transistor and the MOS transistor are provided on the same substrate. FIGS. 57A–57I are sectional views showing manufacturing steps thereof.

Figure 57A:
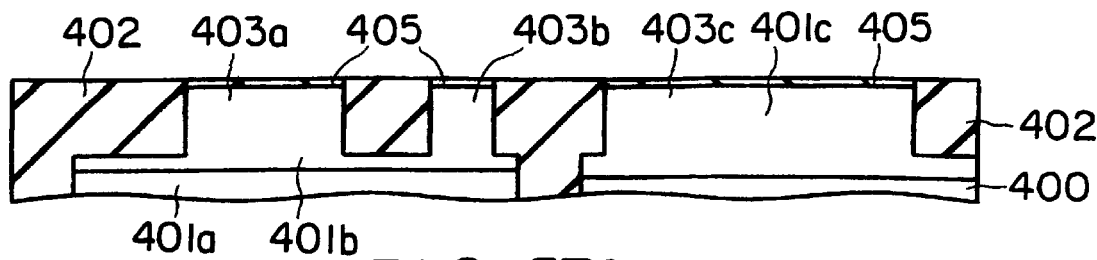
FIGS. 57A–57I are sectional views showing the fifteenth process of the semiconductor device according to the present invention.
Figure 57B:
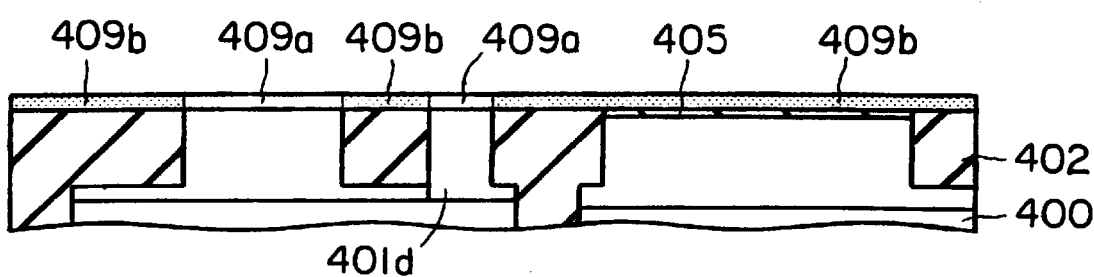

To begin with, the same steps as those, shown in FIGS. 54A and 54B, of the twelfth manufacturing method are executed (see FIGS. 57A and 57B).

Figure 57C:
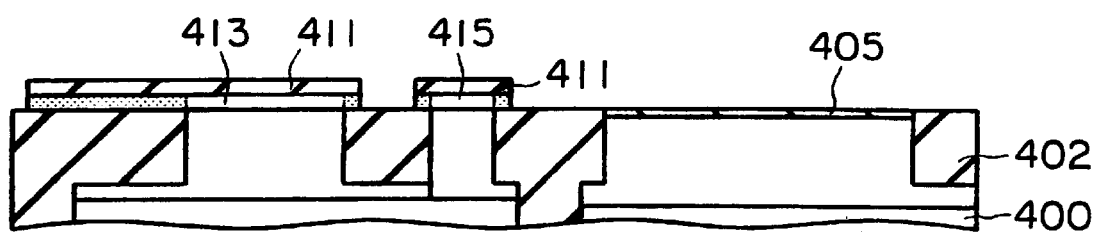

Next, the insulating layer 411 is deposited over the entire surface of the substrate, and the insulating layer 411 and the polysilicon layer 409b are subjected to the anisotropic etching by use of the photolithography technique, thereby providing the base layer 413 and the collector electrode 415 (see FIG. 57C).

Figure 57D:
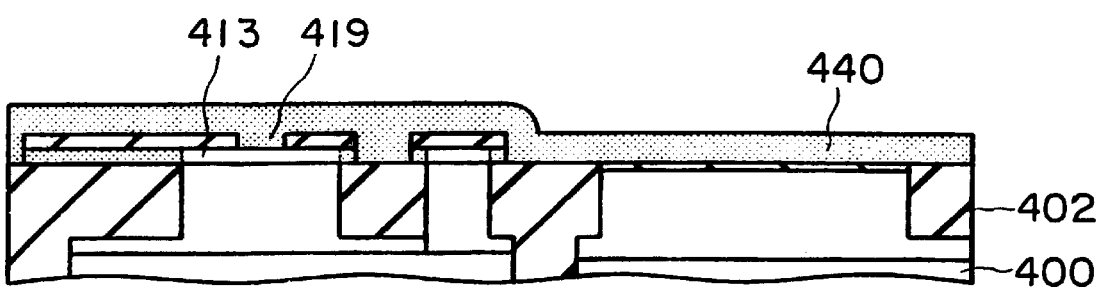

Next, as shown in FIG. 57D, the emitter opening 419 is formed in the insulating layer 411 on the base layer 413 by effecting the anisotropic etching involving the use of the photolithography technique, after which a polysilicon layer 440 is deposited over the whole surface of the substrate.

Figure 57E:
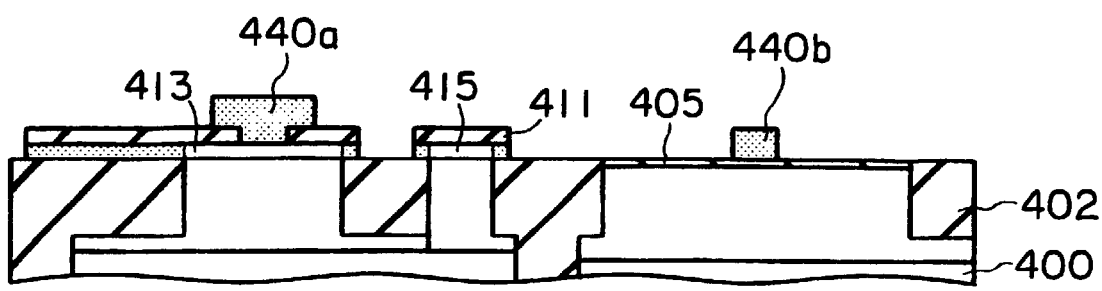

Next, as illustrated in FIG. 57E the patterning is effected upon the polysilicon layer 440 by performing the anisotropic etching which uses the photolithography technique, thereby simultaneously providing an emitter electrode 440a and a gate electrode 440b.

Figure 57F:
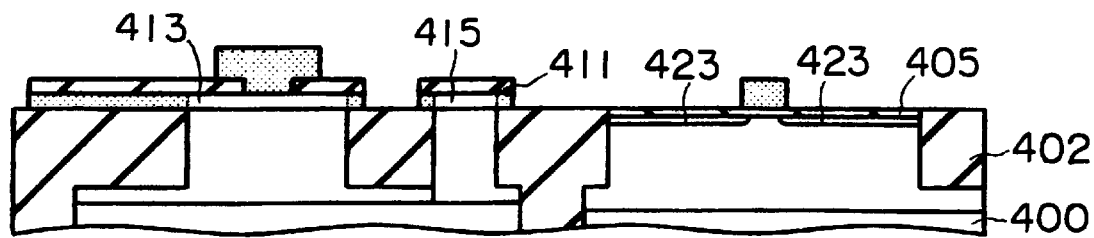

Next, the bipolar transistor forming region is masked with the photo resist, and thereafter the n-type impurity (e.g., As) is ion-implanted unplanted under a predetermined condition, whereby the low-concentration source/drain region 423 is provided (see FIG. 57F).

Figure 57G:
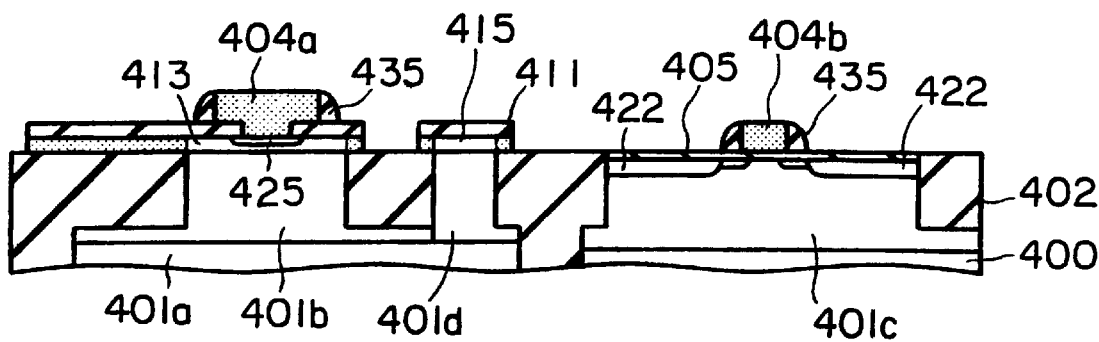

Next, after the insulating layer (e.g., the nitride layer) has been deposited over the entire surface of the substrate, the side wall 435 composed of the nitride layer is provided along the side portion of the gate electrode 404b performing the anisotropic etching (see FIG. 57G). At this time, the side wall 435 formed of the nitride layer is also provided along the side portion of the emitter electrode 404a (see FIG. 57G). Subsequently, the n-type impurity (e.g., As) is ion-implanted into the emitter electrode 404a and into the MOS transistor forming region under a predetermined condition, and thereafter, with the thermal treatment carried out, the emitter region 425 is provided on the base layer 413 as well as providing the high-concentration source/drain region 422 on the MOS transistor forming region (see FIG. 57G).

Figure 57H:
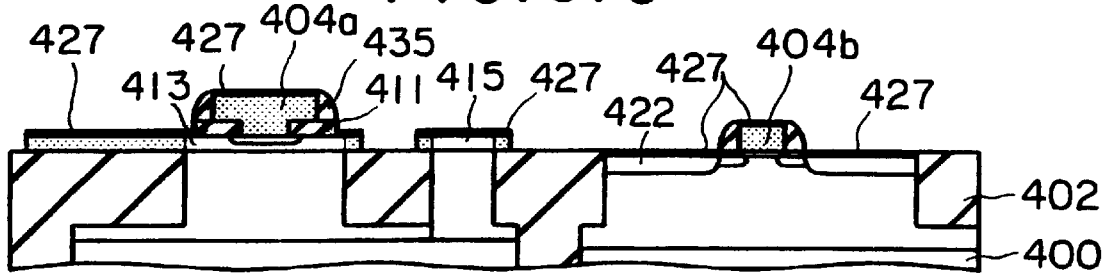

Next, the insulating layer 411 on the base layer (the base electrode 413 and on the collector electrode 415 and the silicon oxide layer 403 on the source/drain region 422 are removed by effecting the anisotropic etching (see FIG. 57H). Subsequently, the refractory metal is deposited over the whole surface of the substrate and, after executing the thermal treatment, the non-reacted refractory metal is removed, thereby providing the refractory metal silicide layer 427 on each of the base layer 413, the collector electrode 415, the emitter electrode 404a, the gate electrode 404b and the source/drain region 422 (see FIG. 57H).

Figure 57I:
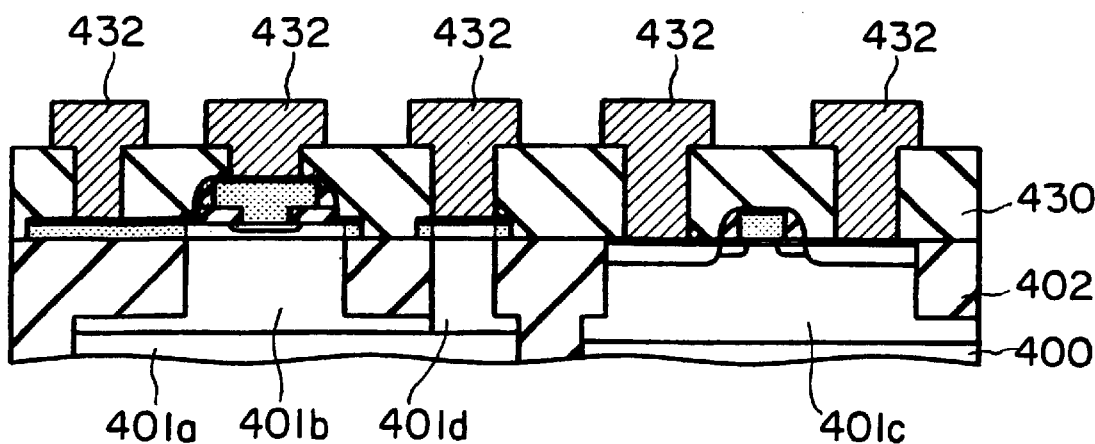

Next, as shown in FIG. 57I, after the inter-layer insulating layer 430 has been deposited over the whole surface of the substrate, this inter-layer insulating layer 430 is formed with an opening as a contact hole. Then, the metal layer is deposited over the entire surface of the substrate so that this contact hole is embedded with the metal layer, and the metal electrode 432 is provided by patterning the metal layer, thus completing the semiconductor device.

As discussed above, according to the fifteenth manufacturing method, unlike the prior art bipolar transistor, there is not necessity for providing the base lead-out electrode 386 (see FIG. 13) structured to cover the base layer (the base electrode 413). Hence, there becomes unnecessary the etching stopper layer 385 (see FIG. 13) the oxide layer 387 (see FIGS. 14A–14I) and the spacer layer 393 (see FIG. 13) which are needed in the conventional bipolar transistor, and, even if the bipolar transistor is made hyperfine, the aspect ratio of the opening (the emitter opening) 419 above the emitter region can be made smaller than in the prior art. The current gain can be thereby prevented from changing due to the variation in the emitter width as much as possible.

Furthermore, according to the present method, the layer 440b constituting the gate electrode and the emitter electrode 440a are simultaneously provided, and the patterning is conducted in the same step. Hence, the number of steps can be decreased in comparison with the prior art manufacturing method.

It is to be noted that the eleventh to fifteenth manufacturing methods have been discussed so far as the methods of manufacturing the semiconductor device including the npn transistor and the nMOS transistor. If the conductivity type of the impurity to be implanted is reversed in those embodiments, however, the semiconductor device including the pnp transistor and the PMOS transistor can be manufactured. Further, the present invention is applicable to a Bi CMOS type semiconductor device including the nMOS transistor and the pMOS transistor as the MOS transistors, and may be carried out by way of a variety of modifications.

Note that the oxide layer is used as the gate oxide layer in the base of the MOS type transistor in the above CMOS semiconductor device, but a MOS transistor using other insulating layer such as a nitride layer and a high dielectric layer can be also used as a substitute therefor.

Moreover it is feasible to apply, to the first and second embodiments of the present invention, such a construction that the base layer extends onto the element isolation film and is composed of the single crystal silicon on the collector region and composed of the polysilicon on the element isolation film. In this case, it is preferable that the emitter electrode be composed of the polysilicon on the single crystal silicon.

What is claimed is:

1. A semiconductor device comprising:
a collector region provided on an active area of a surface of a semiconductor substrate, said active area being defined by an element isolation film;
a base layer provided on the collector region, said base layer extending on said element isolation film, an upper surface of said base layer being flat;
an insulating film formed on a predetermined portion on the base layer, said insulating film having an opening portion formed so as to reach the upper surface of said base layer;

an emitter layer formed on a surface of said base layer in the opening portion;

a metal suicide layer formed on an upper surface of the base layer and at least above the element isolation film; and a base contact formed on said element isolation film.

2. The semiconductor device according to claim 1, wherein said base layer is formed by an epitaxial growth.

3. The semiconductor device according to claim 1, wherein an end of said metal silicide layer, which faces said opening portion and an end of said insulating film at the opposite side of the opening portion are in self-aligned state.

4. The semiconductor device according to claim 1, further comprising a silicon nitride layer formed on said insulating film and said metal silicide layer in a region other than said base contact.

5. A semiconductor device comprising:

a semiconductor substrate of a first conductivity type;

a collector layer of a second conductivity type provided on an active area of said semiconductor substrate, said active area being defined by a first insulating film;

a base layer of the first conductivity type provided on the collector layer, said base layer extending on said first insulation film, an upper surface of said base layer being flat;

a second insulating film having an opening to reach said base layer in a predetermined region, said second insulating film serving as an etching stopper layer provided on said base layer so that at least a part of peripheral edge of said base layer on said collector layer is exposed;

an emitter layer of a second conductivity type provided on a surface of said base layer in the opening;

a metal silicide layer formed on an upper surface of the base layer and at least above the first insulating film, an end of said metal silicide layer facing said opening and an end of said insulating film at the opposite side of the opening being in a self-aligned state; and a base contact formed above said element isolation film.

6. The semiconductor device according to claim 5, wherein said second semiconductor region is provided by an epitaxial growth.

7. The semiconductor device according to claim 5, wherein a third insulating film is provided on said first insulating film and said metal silicide layer in a region other than said base contact.

8. The semiconductor device according to claim 7, wherein said third insulating layer has a side wall portion, an end of the side wall portion being flush with a wall of said opening.

9. A semiconductor device comprising:

a bipolar transistor disposed on a first conductivity type epitaxial layer provided on a first region on a semiconductor substrate, and a CMOS type field effect transistor including a first MIS transistor disposed on a surface area of a second conductivity type first well region provided on a second region on said semiconductor substrate, and a second MIS transistor disposed on a surface area of a first conductivity type second well region provided on a third region on said semiconductor substrate, wherein said bipolar transistor includes:

a collector layer of the first conductivity type provided on an active area of said epitaxial layer, said active area being defined by a first insulating film;

a base layer of the second conductivity type provided on the collector layer, said base layer extending on said first insulation film, an upper surface of said base layer being flat;

a second insulating film having an opening to reach a predetermined region in said base layer, said second insulating film serving as an etching stopper layer provided on said base layer so that at least a part of peripheral edge of said base layer on said collector layer is exposed;

an emitter layer of a first conductivity type provided on a surface of said base layer in the opening; and a metal silicide layer formed on an upper surface of the base layer and at least above an element isolation film, an end of said metal silicide layer facing said opening and an end of said second insulating film at the opposite side of the opening being in a self-aligned state; and wherein said second MIS transistor includes a source and a drain which are composed of the same impurity and with substantially the same diffusion concentration as those of a part of said base region of said bipolar transistor.

10. The semiconductor device according to claim 9, wherein said first and second MIS transistors include gates composed of substantially the same material and with substantially the same layer thickness as those of said base region.

11. The semiconductor device according to claim 9, wherein said bipolar transistor includes an etching stopper layer for forming an emitter region on said base region, and gates of said first and second MIS transistors include side walls along side surfaces, which are composed of the same material as that of said etching stopper layer.

12. A semiconductor device comprising:

a collector region provided on a surface area of a semiconductor substrate and defined by an element isolation film;

a base layer provided by an epitaxial growth on said collector region and on said element isolation film, an upper surface of said base layer being flat;

an insulating layer having an opening on a surface area of said base layer, said opening being located in an active region;

an emitter layer provided on the surface of said base layer in said opening;

an emitter electrode so provided on said insulating layer as to fill said opening; and a metal suicide layer provided on the surface of said base layer, said metal silicide layer being provided at least above the element isolation film;

wherein said insulating layer is interposed as a single layer between said base layer and said emitter electrode at the periphery of said opening.

13. The semiconductor device according to claim 12, wherein said base layer is composed of single crystal silicon on said collector region and of polysilicon on said element isolation film.

14. The semiconductor device according to claim 12, wherein a region of said base layer excluding a region under said emitter electrode exhibits a higher impurity concentration than in a region of said base layer under said emitter electrode.

15. The semiconductor device according to claim 12, wherein said emitter electrode is composed of polysilicon.

16. The semiconductor device according to claim 12, wherein said emitter electrode is composed of single crystal silicon.

17. The semiconductor device according to claim 12, wherein said emitter electrode extends to the outside of said base layer and is brought into contact with a wiring outwardly of said base layer.

18. The semiconductor device according to claim 12, further comprising:
- a metal silicide layer on the surface of said base layer excluding the region under said emitter electrode and on the surface of said emitter electrode.

19. A semiconductor device comprising:
- a collector region provided on a surface area of a semiconductor substrate and defined by an element isolation film;
- a base layer provided through an epitaxial growth provided on the collector surface area and on said element isolation layer, an upper surface of said base layer being flat;
- an insulating layer having an opening above the surface area of said base layer, said opening being provided in an active area;
- an emitter region provided on the surface of said base layer in said opening;
- an emitter electrode so provided on said insulating layer as to fill said opening; and
- a metal suicide layer provided on said base layer at least above said element isolation film, wherein said insulating layer is so patterned that an end thereof facing to said opening is self-aligned with an end of said emitter electrode.

20. The semiconductor device according to claim 19, wherein a region of said base layer excluding a region under said emitter electrode exhibits a higher impurity concentration than in the region of said base layer under said emitter electrode.

21. The semiconductor device according to claim 19, wherein a metal silicide layer is provided on the surface of said emitter electrode and of said base layer provided excluding a region under said emitter electrode.

* * * * *